(12) United States Patent
Kurokawa et al.

(10) Patent No.: US 11,568,224 B2
(45) Date of Patent: Jan. 31, 2023

(54) SEMICONDUCTOR DEVICE HAVING NEURAL NETWORK

(71) Applicant: SEMICONDUCTOR ENERGY LABORATORY CO., LTD., Atsugi (JP)

(72) Inventors: Yoshiyuki Kurokawa, Kanagawa (JP); Shintaro Harada, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 408 days.

(21) Appl. No.: 16/621,305

(22) PCT Filed: Jun. 11, 2018

(86) PCT No.: PCT/IB2018/054188
§ 371 (c)(1),
(2) Date: Dec. 11, 2019

(87) PCT Pub. No.: WO2018/234919
PCT Pub. Date: Dec. 27, 2018

(65) Prior Publication Data
US 2020/0125935 A1 Apr. 23, 2020

(30) Foreign Application Priority Data
Jun. 21, 2017 (JP) .............................. JP2017-121141

(51) Int. Cl.
*G06N 3/063* (2006.01)
*G06F 7/544* (2006.01)
*G06F 9/30* (2018.01)
(52) U.S. Cl.
CPC ........... *G06N 3/063* (2013.01); *G06F 7/5443* (2013.01); *G06F 9/30134* (2013.01)

(58) Field of Classification Search
None
See application file for complete search history.

(56) References Cited

U.S. PATENT DOCUMENTS 7,219,085 B2  5/2007  Buck et al.
7,548,892 B2  6/2009  Buck et al.
(Continued)

FOREIGN PATENT DOCUMENTS

JP  2005-182785 A  7/2005
JP  2008-113295 A  5/2008
(Continued)

OTHER PUBLICATIONS

Shemmel et al.,, A Mixed Mode Analog Neural Network Using Current-Steering Syapses ,2004, Kluwer Academic Publishers, Analog Integrated Circuits and Signal Processing pp. 233-244. (Year: 2004).*
Kwon et al., Recent process in high performance and reliable n-type transition metal oxide-based thin film transistors. 2015, Semiconductor Science and Technology, pp. 1-16. (Year: 2015).*
(Continued)

*Primary Examiner* — Eric Coleman
(74) *Attorney, Agent, or Firm* — Fish & Richardson P.C.

(57) ABSTRACT

A semiconductor device capable of efficiently recognizing images utilizing a neural network is provided. The semiconductor device includes a shift register group, a D/A converter, and a product-sum operation circuit. The product-sum operation circuit includes an analog memory and stores a parameter of a filter. The shift register group captures image data and outputs part of the image data to the D/A converter while shifting the image data. The D/A converter converts the part of the input image data into analog data and outputs the analog data to the product-sum operation circuit.

9 Claims, 22 Drawing Sheets

(56) References Cited

U.S. PATENT DOCUMENTS

| | | |
|---|---|---|
| 8,832,004 B2 | 9/2014 | Kato et al. |
| 9,135,553 B2 | 9/2015 | Kato et al. |
| 10,141,069 B2 | 11/2018 | Ikeda et al. |
| 10,922,605 B2 | 2/2021 | Kurokawa |
| 2010/0241601 A1* | 9/2010 | Carson ............ G06N 3/02 706/27 |
| 2011/0239032 A1 | 9/2011 | Kato et al. |
| 2013/0293754 A1* | 11/2013 | Wakabayashi ...... H04N 5/378 348/302 |
| 2014/0337262 A1 | 11/2014 | Kato et al. |
| 2014/0355381 A1* | 12/2014 | Lal ............ G06N 3/0635 327/356 |
| 2017/0063351 A1 | 3/2017 | Kurokawa |
| 2017/0169327 A1* | 6/2017 | Nestler ............ G06N 3/0635 |
| 2018/0211620 A1 | 7/2018 | Kurokawa et al. |
| 2018/0285715 A1* | 10/2018 | Son ............ G06N 3/08 |
| 2019/0164620 A1 | 5/2019 | Ikeda et al. |
| 2021/0174183 A1 | 6/2021 | Kurokawa |

FOREIGN PATENT DOCUMENTS

| | | |
|---|---|---|
| JP | 2010-134697 A | 6/2010 |
| JP | 2016-099707 A | 5/2016 |
| JP | 2016-219011 A | 12/2016 |
| JP | 2017-054502 A | 3/2017 |
| JP | 2017-102905 A | 6/2017 |
| WO | WO-2010/064728 | 6/2010 |
| WO | WO-2017/037568 | 3/2017 |
| WO | WO-201 7/068491 | 4/2017 |
| WO | WO-2017074440 A1 * | 5/2017 ............ G06N 3/04 |

OTHER PUBLICATIONS

Schlottmann et al., Mixed Mode FPAA SoC for Analog-Enhanced Signal Processing, 2012, IEEE, 4 pages. (Year: 2012).*

Shafiee, A. et al., ISAAC: A Convolutional Neural Network Accelerator with In-Situ Analog Arithmetic in Crossbars, 2016, IEEE, pp. 14-26. (Year: 2016).*

Erkmen et al., A Mixed Mode Neural Network Circurity for Object Recognition Application, 2012, Springer Science and Media, pp. 29-46. (Year: 2012).*

International Search Report (Application No. PCT/IB2018/054188) dated Oct. 2, 2018.

Written Opinion (Application No. PCT/IB2018/054188) dated Oct. 2, 2018.

* cited by examiner

FIG. 1A

| P(1,1) | P(1,2) | P(1,3) | ..... | P(1, m-2) | P(1, m-1) | P(1,m) |
|---|---|---|---|---|---|---|
| P(2,1) | P(2,2) | P(2,3) | | P(2, m-2) | P(2, m-1) | P(2,m) |
| P(3,1) | P(3,2) | P(3,3) | | P(3, m-2) | P(3, m-1) | P(3,m) |
| ⋮ | | | | | | ⋮ |
| P(n-2, 1) | P(n-2, 2) | P(n-2, 3) | | P(n-2, m-2) | P(n-2, m-1) | P(n-2, m) |
| P(n-1, 1) | P(n-1, 2) | P(n-1, 3) | | P(n-1, m-2) | P(n-1, m-1) | P(n-1, m) |
| P(n,1) | P(n,2) | P(n,3) | ..... | P(n, m-2) | P(n, m-1) | P(n,m) |

FIG. 1B

| F(1,1) | F(1,2) | ..... | F(1,t) |
|---|---|---|---|
| F(2,1) | F(2,2) | | F(2,t) |
| ⋮ | | | ⋮ |
| F(s,1) | F(s,2) | ..... | F(s,t) |

FIG. 9A
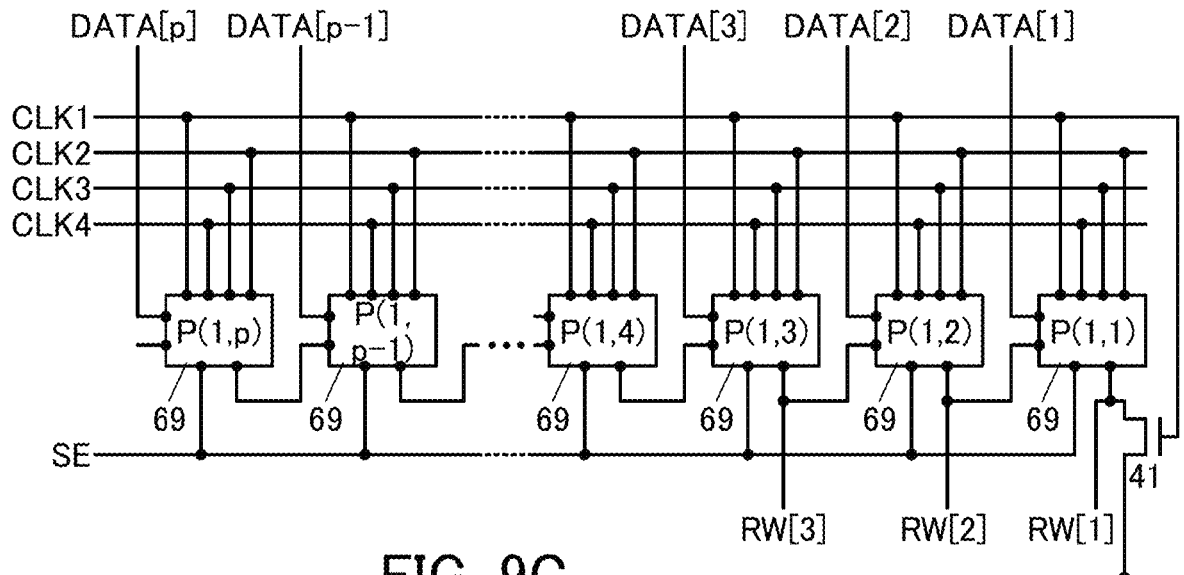
FIG. 9B
FIG. 9C
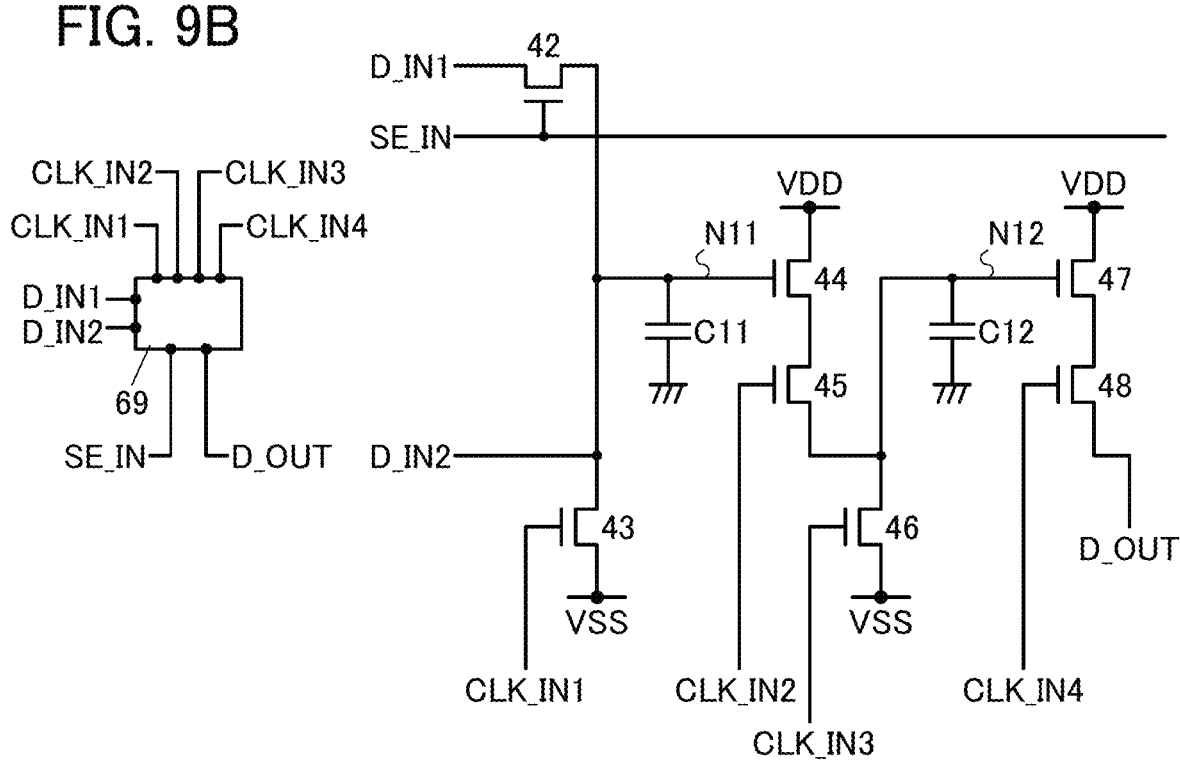

270

271

272

273

274

SEMICONDUCTOR DEVICE HAVING NEURAL NETWORK

CROSS REFERENCE TO RELATED APPLICATIONS

This application is a U.S. National Phase Application under 35 U.S.C. § 371 of International Application PCT/IB2018/054188, filed on Jun. 11, 2018, which is incorporated by reference, and which claims the benefit of a foreign priority application filed in Japan on Jun. 21, 2017, as Application No. 2017-121141.

TECHNICAL FIELD

One embodiment of the present invention relates to a semiconductor device having a neural network. In particular, one embodiment of the present invention relates to a semiconductor device capable of image recognition utilizing a neural network.

Note that in this specification and the like, a semiconductor device generally means a device that can function by utilizing semiconductor characteristics. A display device, a light-emitting device, a memory device, an electro-optical device, a power storage device, a semiconductor circuit, and an electronic device include the semiconductor device in some cases.

Note that one embodiment of the present invention is not limited to the above technical field. The technical field of the invention disclosed in this specification and the like relates to an object, a method, or a manufacturing method. One embodiment of the present invention also relates to a process, a machine, manufacture, or a composition of matter.

BACKGROUND ART

A neural network is an information processing system modeled on a biological neural network. With the use of the neural network, computers with higher performance than conventional von Neumann computers are expected to be achieved, and in recent years, a variety of researches for building neural networks have been carried out.

The neural network has a circuit configuration that resembles a biological neural network composed of neurons and synapses. Two or more pieces of data are input to each of the neurons and multiplied by a "weight coefficient", which represents the strength of connection, and the multiplication results are added. When the product-sum operation result obtained in this manner exceeds a threshold, the neuron outputs a high-level signal; this phenomenon is called "firing".

The neural network is utilized, for example, in the field of image recognition.

In the image recognition field, convolutional operation is performed, i.e., image data is multiplied by parameters of a filter which is shifted, so that a feature of the image data is extracted. The convolutional operation is performed more than once: image edges and the like are extracted in early convolutional operation; and more complicated features such as the shape and pattern of the image are extracted in later convolutional operation.

Also in the image recognition field, pooling operation is performed, i.e., image data is divided into small areas, and for example, the maximum value is extracted from each area. The pooling operation enables an object to be recognized even when its position changes, and allows for changes in position of features and the like extracted by the convolutional operation. The pooling operation is usually performed after the convolutional operation, and for example, a combination of the convolutional operation and the pooling operation is performed more than once.

In the case where the neural network is utilized in the image recognition field, the image data and the parameters of a filter in the image recognition field correspond to two or more pieces of data input to a neuron and a weight coefficient, respectively, in the neural network. That is, the convolutional operation in the image recognition field is a product-sum operation; and operation by a product-sum operation circuit, capturing of image data in the product-sum operation circuit, pooling operation after the product-sum operation, and the like need to be performed quickly and efficiently.

Patent Document 1 discloses an example in which machine learning through a neural network is performed with the use of a processor such as a CPU (Central Processing Unit) or a GPU (Graphics Processing Unit) and handwritten character recognition is performed.

In recent years, transistors using oxide semiconductors or metal oxides in their channel formation regions (Oxide Semiconductor transistors, hereinafter referred to as OS transistors) have attracted attention. The off-state current of an OS transistor is extremely low. Applications that employ OS transistors to utilize their extremely low off-state currents have been proposed. For example, Patent Document 2 discloses an example in which an OS transistor is used for learning in a neural network.

PRIOR ART DOCUMENT

Patent Document

[Patent Document 1] Japanese Published Patent Application No. 2005-182785
[Patent Document 2] Japanese Published Patent Application No. 2016-219011

SUMMARY OF THE INVENTION

Problems to be Solved by the Invention

Operation utilizing a neural network is mainly a product-sum operation, and image recognition utilizing a neural network requires a huge amount of calculation due to the repetition of the product-sum operation. Thus, in the case where a neural network is composed with the use of a digital circuit such as a CPU or a GPU, a huge number of transistors are required, leading to high power consumption and inefficiency.

In the image recognition utilizing a neural network, even when the speed of the product-sum operation increases, the speed of capturing image data, which is to be input data, in a product-sum operation circuit limits the total operation speed in some cases.

An object of one embodiment of the present invention is to provide a semiconductor device capable of efficiently recognizing images. Another object of one embodiment of the present invention is to provide a semiconductor device capable of efficiently performing product-sum operation. Another object of one embodiment of the present invention is to provide a novel semiconductor device.

Note that one embodiment of the present invention does not necessarily achieve all the objects listed above and only needs to achieve at least one of the objects. The description of the above objects does not disturb the existence of other objects. Objects other than these will be apparent from the description of the specification, the claims, the drawings, and the like, and objects other than these can be derived from the description of the specification, the claims, the drawings, and the like.

Means for Solving the Problems

One embodiment of the present invention is a semiconductor device including a shift register group, a D/A converter, and a product-sum operation circuit. The shift register group captures image data and performs operations of shifting the image data and outputting part of the image data to the D/A converter. The D/A converter is characterized by converting the part of the image data into analog data and outputting the analog data to the product-sum operation circuit.

In the above embodiment, the product-sum operation circuit includes an analog memory, and a parameter is stored in the analog memory. The product-sum operation circuit is characterized by outputting the product-sum operation result of part of the image data and the parameter.

In the above embodiment, a transistor constituting the analog memory includes a metal oxide in a channel formation region.

Another embodiment of the present invention is a semiconductor device including a D/A converter, a shift register group, and a product-sum operation circuit. Image data is input to the D/A converter, converted into analog data by the D/A converter, and output as first data to the shift register group. The shift register group performs operations of shifting the first data and outputting part of the first data as second data to the product-sum operation circuit. The product-sum operation circuit includes an analog memory, and a parameter is stored in the analog memory. The product-sum operation circuit is characterized by outputting the product-sum operation result of the second data and the parameter.

In the above embodiment, a transistor constituting the analog memory includes a metal oxide in a channel formation region.

In the above embodiment, a transistor constituting the shift register group includes a metal oxide in a channel formation region.

Another embodiment of the present invention is a semiconductor device including a shift register group, a D/A converter, a product-sum operation circuit, and a pooling circuit. The shift register group captures image data and performs operations of shifting the image data and outputting part of the image data to the D/A converter. The D/A converter performs operations of converting part of the image data into analog data and outputting the analog data as first data to the product-sum operation circuit. A parameter is stored in the product-sum operation circuit, and the product-sum operation circuit is characterized by outputting second data, which is obtained by a product-sum operation of the first data and the parameter, to the pooling circuit.

In the above embodiment, the product-sum operation circuit includes an analog memory, and a parameter is stored in the analog memory.

In the above embodiment, a transistor constituting the analog memory includes a metal oxide in a channel formation region.

Effect of the Invention

According to one embodiment of the present invention, a semiconductor device capable of efficiently recognizing images can be provided. According to another embodiment of the present invention, a semiconductor device capable of efficiently performing product-sum operation can be provided. According to another embodiment of the present invention, a novel semiconductor device can be provided.

Note that the effects of one embodiment of the present invention are not limited to the effects listed above. The effects listed above do not preclude the existence of other effects. The other effects are effects that are not described in this section and will be described in the following description. The effects not described in this section will be apparent from the description of the specification, the drawings, and the like and can be derived from the description by those skilled in the art. Note that one embodiment of the present invention has at least one of the above effects and the other effects. Accordingly, one embodiment of the present invention does not have the above effects in some cases.

BRIEF DESCRIPTION OF THE DRAWINGS

FIG. 1A is a conceptual diagram of image data, and FIG. 1B is a conceptual diagram of parameters of a filter.

FIG. 9A is a block diagram illustrating a configuration example of a shift register, FIG. 9B is a diagram illustrating input and output of a register, and FIG. 9C is a circuit diagram illustrating a configuration example of the register.

MODE FOR CARRYING OUT THE INVENTION

Figure 2A:
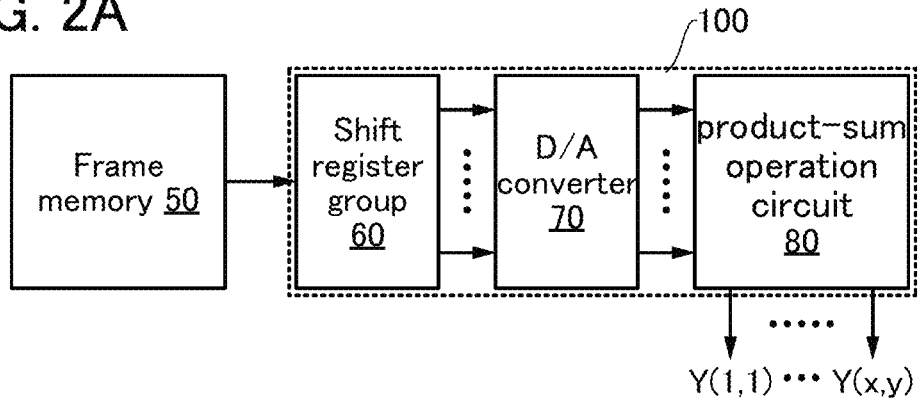
FIG. 2A is a block diagram illustrating a configuration example of a semiconductor device.

Hereinafter, embodiments will be described with reference to drawings. However, the embodiments can be implemented with many different modes, and it will be readily appreciated by those skilled in the art that modes and details thereof can be changed in various ways without departing from the spirit and scope thereof. Thus, the present invention should not be construed as being limited to the description in the embodiments given below.

A plurality of embodiments described below can be combined as appropriate. In addition, in the case where a plurality of structure examples are described in one embodiment, the structure examples can be combined as appropriate.

Note that in the drawings attached to this specification, the block diagram in which components are classified according to their functions and shown as independent blocks is illustrated; however, it is difficult to separate completely actual components according to their functions, and it is possible for one component to relate to a plurality of functions.

In the drawings and the like, the size, the layer thickness, the region, or the like is exaggerated for clarity in some cases. Therefore, the size, the layer thickness, or the region is not limited to the illustrated scale. The drawings schematically show ideal examples, and shapes, values, or the like are not limited to shapes, values, or the like shown in the drawings.

In the drawings and the like, the same elements, elements having similar functions, elements formed of the same material, elements formed at the same time, or the like are sometimes denoted by the same reference numerals, and description thereof is not repeated in some cases.

In this specification and the like, the term "film" and the term "layer" can be interchanged with each other. For example, the term "conductive layer" can be changed into the term "conductive film" in some cases. For another example, the term "insulating film" can be changed into the term "insulating layer" in some cases.

In this specification and the like, the terms for describing arrangement such as "over" and "below" do not necessarily mean "directly over" and "directly below", respectively, in the positional relationship between components. For example, the expression "a gate electrode over a gate insulating layer" does not exclude the case where there is an additional component between the gate insulating layer and the gate electrode.

In this specification and the like, "parallel" indicates a state where two straight lines are placed such that the angle formed therebetween is greater than or equal to −10° and less than or equal to 10°. Accordingly, the case where the angle is greater than or equal to −5° and less than or equal to 5° is also included. In addition, "perpendicular" indicates a state where the angle formed between two straight lines is greater than or equal to 80° and less than or equal to 100°. Accordingly, the case where the angle is greater than or equal to 85° and less than or equal to 95° is also included.

In this specification and the like, ordinal numbers such as "first", "second", and "third" are used in order to avoid confusion among components, and the terms do not limit the components numerically.

In this specification and the like, "electrically connected" includes the case where connection is made through an "object having any electric function". Here, there is no particular limitation on the "object having any electric function" as long as electric signals can be transmitted and received between the connected components. Examples of the "object having any electric function" include a switching element such as a transistor, a resistor, an inductor, a capacitor, and other elements with a variety of functions as well as an electrode and a wiring.

In this specification and the like, "voltage" often refers to a potential difference between a given potential and a reference potential (e.g., a ground potential). Thus, a voltage and a potential difference can be interchanged with each other.

In this specification and the like, a transistor is an element having at least three terminals including a gate, a drain, and a source. A channel region is included between the drain (a drain terminal, a drain region, or a drain electrode) and the source (a source terminal, a source region, or a source electrode), and current can flow between the source and the drain through the channel region. Note that in this specification and the like, a channel region refers to a region through which current mainly flows.

Furthermore, functions of a source and a drain might be switched when a transistor of opposite polarity is employed or a direction of current flow is changed in circuit operation, for example. Thus, the terms of source and drain are interchangeable for use in this specification and the like.

Unless otherwise specified, off-state current in this specification and the like refers to a drain current of a transistor in an off state (also referred to as a non-conducting state or a cutoff state). Unless otherwise specified, the off state of an n-channel transistor refers to a state where a voltage Vgs of a gate with respect to a source is lower than a threshold voltage Vth, and the off state of a p-channel transistor refers to a state where the voltage Vgs of a gate with respect to a source is higher than the threshold voltage Vth. That is, the off-state current of an n-channel transistor sometimes refers to a drain current at the time when the voltage Vgs of a gate with respect to a source is lower than the threshold voltage Vth.

In the above description of the off-state current, the drain may be replaced with the source. That is, the off-state current sometimes refers to a source current when the transistor is in an off state. In addition, leakage current sometimes expresses the same meaning as off-state current. In this specification and the like, the off-state current sometimes refers to a current that flows between a source and a drain when a transistor is in the off state.

In this specification and the like, a metal oxide means an oxide of metal in a broad expression. Metal oxides are classified into an oxide insulator, an oxide conductor (including a transparent oxide conductor), an oxide semiconductor (also simply referred to as an OS), and the like. For example, when a metal oxide is used in an active layer of a transistor, the metal oxide is called an oxide semiconductor in some cases. That is to say, in the case where a metal oxide has at least one of an amplifying function, a rectifying function, and a switching function, the metal oxide can be called a metal oxide semiconductor, or OS for short. An OS transistor or an OS FET can be referred to as a transistor including a metal oxide or an oxide semiconductor.

Embodiment 1

In this embodiment, a semiconductor device capable of efficiently recognizing images with use of a neural network will be described.

<Semiconductor Device>

A semiconductor device 100 includes a product-sum operation circuit 80 and has a function of capturing image data from a frame memory 50 and performing convolutional operation.

Hereinafter, the image data captured in the semiconductor device 100 are denoted as image data P(1,1) to P(n,m) in n rows and m columns (n and m are each an integer of 2 or more), and a filter included in the product-sum operation circuit 80 is denoted as filters F(1,1) to F(s,t) in s rows and t columns (s and t are each an integer of 1 or more, s<n, t<m). F(1,1) to F(s,t) are parameters constituting the filter. FIG. 1(A) illustrates a conceptual diagram of the image data and FIG. 1(B) illustrates a conceptual diagram of the parameters of the filter.

For example, when n=m=3 and s=t=2, the semiconductor device 100 outputs outputs Y(1,1) to Y(2,2).

$$Y(1,1)=P(1,1)\times F(1,1)+P(1,2)\times F(1,2)+P(2,1)\times F(2,1)+P(2,2)\times F(2,2) \quad (a1)$$

$$Y(1,2)=P(1,2)\times F(1,1)+P(1,3)\times F(1,2)+P(2,2)\times F(2,1)+P(2,3)\times F(2,2) \quad (a2)$$

$$Y(2,1)=P(2,1)\times F(1,1)+P(2,2)\times F(1,2)+P(3,1)\times F(2,1)+P(3,2)\times F(2,2) \quad (a3)$$

$$Y(2,2)=P(2,2)\times F(1,1)+P(2,3)\times F(1,2)+P(3,2)\times F(2,1)+P(3,3)\times F(2,2) \quad (a4)$$

Formulae a1 to a4 are represented by the following general formula.

$$Y(y,x)=\Sigma_j(\Sigma_i P(j+y-1,i+x-1)\times F(j,i)) \quad (a5)$$

Note that j is an integer of 1 to s, i is an integer of 1 to t, y is an integer of 1 to n−s+1, and x is an integer of 1 to m−t+1.

The semiconductor device 100 also includes a shift register group 60 and a D/A converter 70 (see FIG. 2(A)).

The shift register group 60 includes shift registers SR_P[1] to SR_P[q], in each of which image data of one row and p columns can be stored (q and p are each an integer of 1 or more, n≥q≥s, m≥p≥t).

Figure 2B:
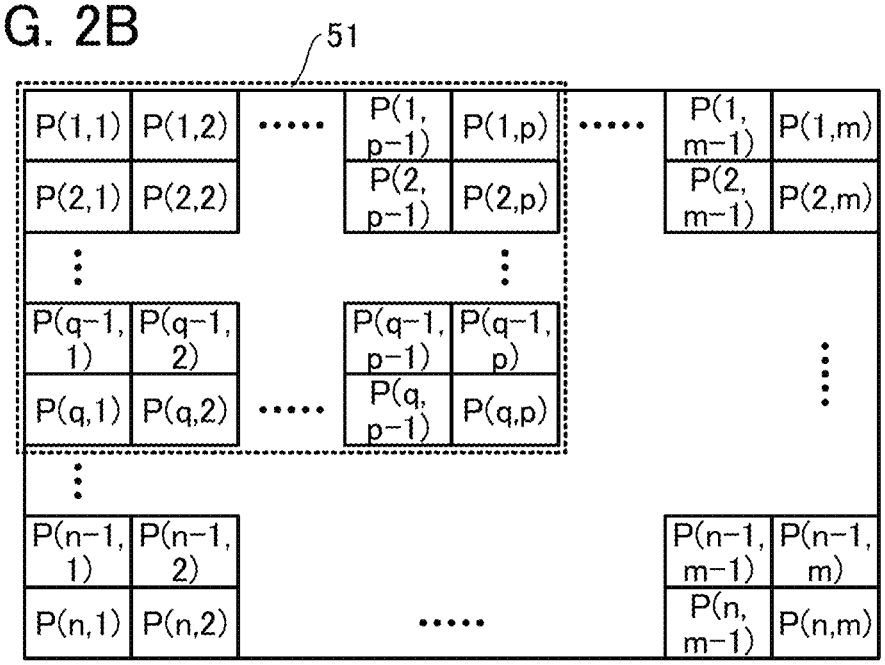
FIG. 2B is a diagram illustrating image data captured in a shift register.
Figure 2C:
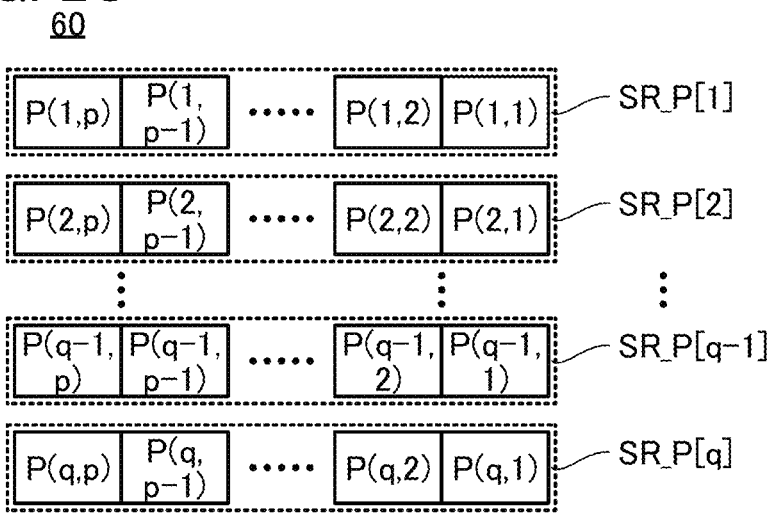
FIG. 2C is a diagram illustrating a state in which image data is captured in the shift register.

The shift register SR_P[1] captures image data P(1,1) to P(1,p); the shift register SR_P[2] captures image data P(2,1) to P(2,p); and in the same manner, the shift register SR_P[q] captures image data P(q,1) to P(q,p). FIG. 2(B) and FIG. 2(C) illustrate this state.

In FIG. 2(B), image data in a region 51 surrounded by a dotted line are captured in the shift registers SR_P[1] to SR_P[q]. FIG. 2(C) illustrates a state in which the image data have been captured in each of the shift registers SR_P[1] to SR_P[q] in the shift register group 60.

Note that the image data P(1,1) to P(n,m) are each image data corresponding to one pixel and are each a digital signal composed of a plurality of bits. Thus, the number of bits that can be stored in the shift register SR_P[1], which captures the image data P(1,1) to P(1,p), is p×one-pixel image data bits.

The image data captured in the shift registers SR_P[1] to SR_P[q] are converted into analog signals by the D/A converter 70, and then input to the product-sum operation circuit 80.

<Shift Register Group and Product-Sum Operation Circuit: 1>

Figure 3:
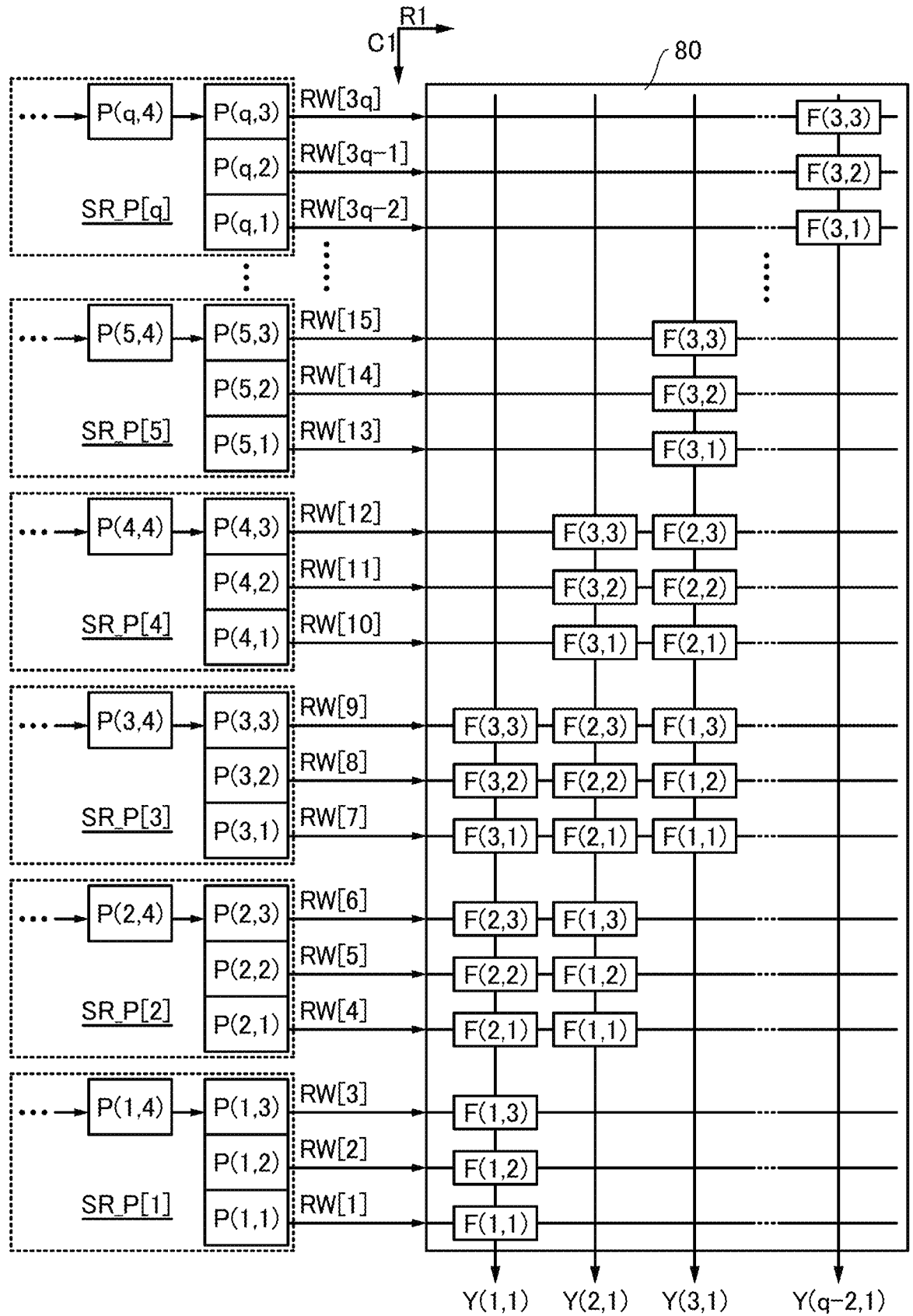
FIG. 3 is a conceptual diagram illustrating part of a shift register group and operation of a product-sum operation circuit.

Next, FIG. 3 illustrates part of the shift register group 60 and the product-sum operation circuit 80. Note that in FIG. 3, the D/A converter 70 is omitted and the product-sum operation circuit 80 includes the filters F(1,1) to F(s,t) (s=t=3).

In FIG. 3, the shift registers SR_P[1] to SR_P[q] included in the shift register group 60 each output s pieces, i.e., 3 pieces of image data. The image data output from the shift registers SR_P[1] to SR_P[q] are input to the product-sum operation circuit 80 as signals RW[1] to RW[3q], and product-sum operation of the signals and the filters F(1,1) to F(3,3) is performed in the product-sum operation circuit 80.

Note that FIG. 3 is a conceptual diagram illustrating a state in which the product-sum operation is performed. The signals RW[1] to RW[3q] input to the product-sum operation circuit 80 are transmitted along a line parallel to a direction indicated by an arrow R1, and the product of each of the signals and the filter is calculated at the intersections with F(1,1) to F(3,3), which denote parameters of the filter. The multiplication results of the signals and the filter are added in a direction indicated by an arrow C1; the addition results are outputs Y(1,1) to Y(q−2,1) of the product-sum operation circuit 80.

In FIG. 3, the shift register SR_P[1] outputs image data P(1,1) to P(1,3) among the image data P(1,1) to P(1,p) captured in the shift register SR_P[1] (signals RW[1] to RW[3] in FIG. 3).

Although not illustrated in FIG. 3, the signals RW[1] to RW[3] are converted into analog signals by the D/A converter 70, and then input to the product-sum operation circuit 80. The signals RW[1] to RW[3] are respectively multiplied by the filters F(1,1) to F(1,3) in the product-sum operation circuit 80. Note that specific configuration examples of the product-sum operation circuit 80 will be described in Embodiment 2.

Similarly, the shift register SR_P[2] outputs image data P(2,1) to P(2,3) (signals RW[4] to RW[6] in FIG. 3), and the shift register SR_P[3] outputs image data P(3,1) to P(3,3) (signals RW[7] to RW[9] in FIG. 3).

The signals RW[4] to RW[6] are respectively multiplied by the filters F(2,1) to F(2,3) in the product-sum operation circuit 80, and the signals RW[7] to RW[9] are respectively multiplied by the filters F(3,1) to F(3,3) in the product-sum operation circuit 80.

The multiplication results of the values of the signals RW[1] to RW[3] and the values of the filters F(1,1) to F(1,3), the multiplication results of the values of the signals RW[4] to RW[6] and the values of the filters F(2,1) to F(2,3), and the multiplication results of the values of the signals RW[7] to RW[9] and the values of the filters F(3,1) to F(3,3) are added; thus, the product-sum operation circuit 80 outputs Y(1,1).

Similarly, the values of the signals RW[4] to RW[6], which are the image data P(2,1) to P(2,3) output from the shift register SR_P[2], are respectively multiplied by the values of the filters F(1,1) to F(1,3); the values of the signals RW[7] to RW[9], which are the image data P(3,1) to P(3,3) output from the shift register SR_P[3], are respectively multiplied by the values of the filters F(2,1) to F(2,3); the values of the signals RW[10] to RW[12], which are the image data P(4,1) to P(4,3) output from the shift register SR_P[4], are respectively multiplied by the values of the filters F(3,1) to F(3,3); and the multiplication results are added; thus, the product-sum operation circuit 80 outputs Y(2,1).

Similarly, the values of the signals RW[7] to RW[9], which are the image data P(3,1) to P(3,3) output from the shift register SR_P[3], are respectively multiplied by the values of the filters F(1,1) to F(1,3); the values of the signals RW[10] to RW[12], which are the image data P(4,1) to P(4,3) output from the shift register SR_P[4], are respectively multiplied by the values of the filters F(2,1) to F(2,3); the values of the signals RW[13] to RW[15], which are the image data P(5,1) to P(5,3) output from the shift register SR_P[5], are respectively multiplied by the values of the filters F(3,1) to F(3,3); and the multiplication results are added; thus, the product-sum operation circuit 80 outputs Y(3,1).

Similarly, the values of the signals RW[3q−8] to RW[3q−6], which are the image data P(q−2,1) to P(q−2,3) output from the shift register SR_P[q−2], are respectively multiplied by the values of the filters F(1,1) to F(1,3); the values of the signals RW[3q−5] to RW[3q−3], which are the image data P(q−1,1) to P(q−1,3) output from the shift register SR_P[q−1], are respectively multiplied by the values of the filters F(2,1) to F(2,3); the values of the signals RW[3q−2] to RW[3q], which are the image data P(q,1) to P(q,3) output from the shift register SR_P[q], are respectively multiplied by the values of the filters F(3,1) to F(3,3); and the multiplication results are added; thus, the product-sum operation circuit 80 outputs Y(q−2,1).

Figure 4:
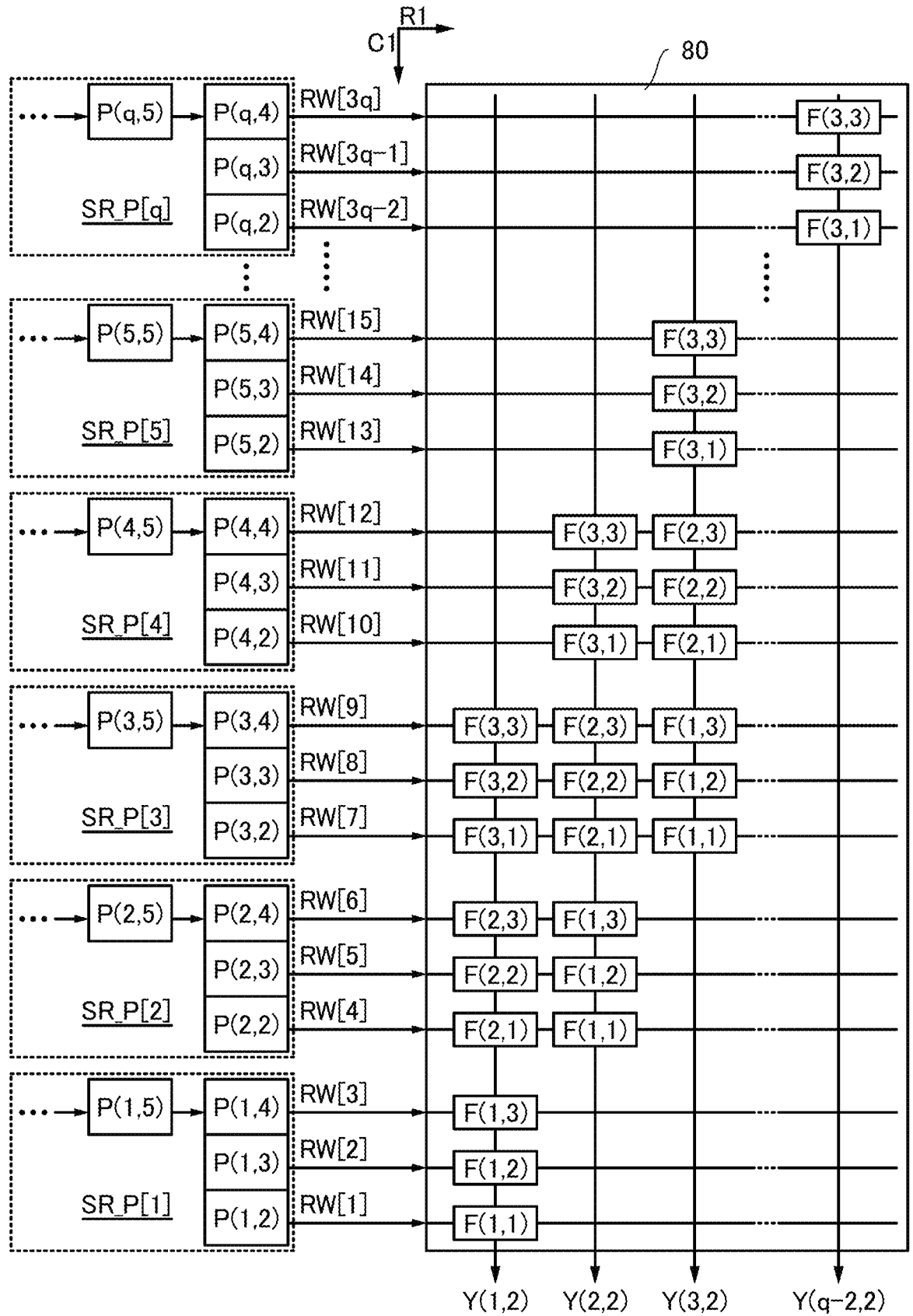
FIG. 4 is a conceptual diagram illustrating part of a shift register group and operation of a product-sum operation circuit.

Next, FIG. 4 illustrates a state in which the image data P(1,1) to P(q,p) captured in the shift registers SR_P[1] to SR_P[q] in FIG. 3 are each shifted by one line.

That is, the shift register SR_P[1] outputs the image data P(1,2) to P(1,4); the shift register SR_P[2] outputs the image data P(2,2) to P(2,4); the shift register SR_P[3] outputs the image data P(3,2) to P(3,4); the shift register SR_P[4] outputs the image data P(4,2) to P(4,4); the shift register SR_P[5] outputs the image data P(5,2) to P(5,4); and the shift register SR_P[q] outputs the image data P(q,2) to P(q,4).

In a manner similar to that in FIG. 3, the values of the signals RW[1] to RW[3], which are the image data P(1,2) to P(1,4) output from the shift register SR_P[1], are respectively multiplied by the values of the filters F(1,1) to F(1,3); the values of the signals RW[4] to RW[6], which are the image data P(2,2) to P(2,4) output from the shift register SR_P[2], are respectively multiplied by the values of the filters F(2,1) to F(2,3); the values of the signals RW[7] to RW[9], which are the image data P(3,2) to P(3,4) output from the shift register SR_P[3], are respectively multiplied by the values of the filters F(3,1) to F(3,3); and the multiplication results are added; thus, the product-sum operation circuit 80 outputs Y(1,2).

The same applies to the other data, and the description on FIG. 3 is referred to for Y(2,2) and Y(3,2).

The values of the signals RW[3q−8] to RW[3q−6], which are the image data P(q−2,2) to P(q−2,4) output from the shift register SR_P[q−2], are respectively multiplied by the values of the filters F(1,1) to F(1,3); the values of the signals RW[3q−5] to RW[3q−3], which are the image data P(q−1,2) to P(q−1,4) output from the shift register SR_P[q−1], are respectively multiplied by the values of the filters F(2,1) to F(2,3); the values of the signals RW[3q−2] to RW[3q], which are the image data P(q,2) to P(q,4) output from the shift register SR_P[q], are respectively multiplied by the values of the filters F(3,1) to F(3,3); and the multiplication results are added; thus, the product-sum operation circuit 80 outputs Y(q−2,2).

Figure 5:
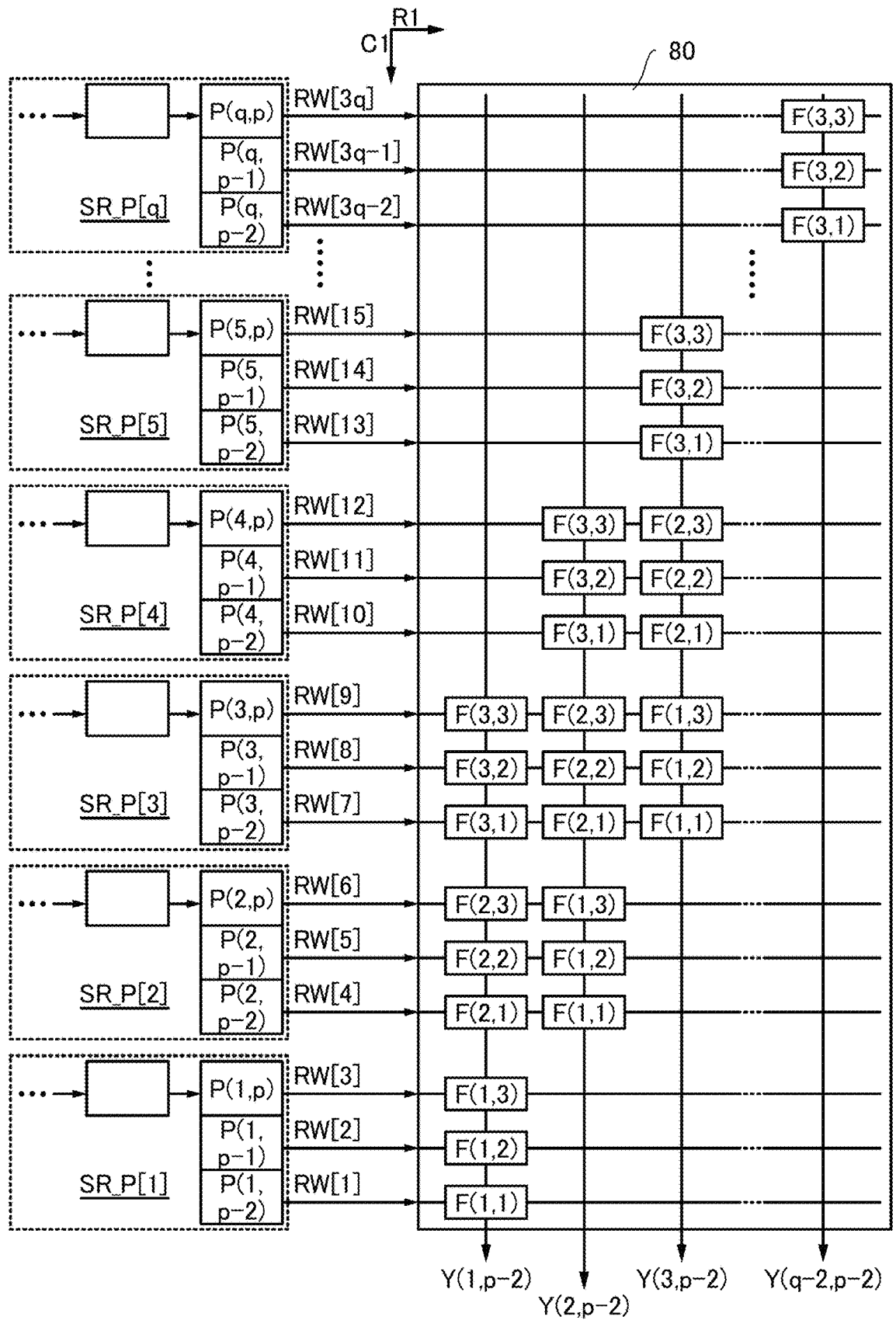
FIG. 5 is a conceptual diagram illustrating part of a shift register group and operation of a product-sum operation circuit.

FIG. 5 illustrates a state in which the image data P(1,1) to P(q,p) captured in the shift registers SR_P[1] to SR_P[q] in FIG. 3 are each shifted by p−3 rows.

That is, the shift register SR_P[1] outputs the image data P(1,p−2) to P(1,p); the shift register SR_P[2] outputs the image data P(2,p−2) to P(2,p); the shift register SR_P[3] outputs the image data P(3,p−2) to P(3,p); the shift register SR_P[4] outputs the image data P(4,p−2) to P(4,p); the shift register SR_P[5] outputs the image data P(5,p−2) to P(5,p); and the shift register SR_P[q] outputs the image data P(q,p−2) to P(q,p).

In a manner similar to that in FIG. 3, the values of the signals RW[1] to RW[3], which are the image data P(1,p−2) to P(1,p) output from the shift register SR_P[1], are respectively multiplied by the values of the filters F(1,1) to F(1,3); the values of the signals RW[4] to RW[6], which are the image data P(2,p−2) to P(2,p) output from the shift register SR_P[2], are respectively multiplied by the values of the filters F(2,1) to F(2,3); the values of the signals RW[7] to RW[9], which are the image data P(3,p−2) to P(3,p) output from the shift register SR_P[3], are respectively multiplied by the values of the filters F(3,1) to F(3,3); and the multiplication results are added; thus, the product-sum operation circuit 80 outputs Y(1,p−2).

The same applies to the other data, and the description on FIG. 3 is referred to for Y(2,p−2) and Y(3,p−2).

The values of the signals RW[3q−8] to RW[3q−6], which are the image data P(q−2,p−2) to P(q−2,p) output from the shift register SR_P[q−2], are respectively multiplied by the values of the filters F(1,1) to F(1,3); the values of the signals RW[3q−5] to RW[3q−3], which are the image data P(q−1,p−2) to P(q−1,p) output from the shift register SR_P[q−1], are respectively multiplied by the values of the filters F(2,1) to F(2,3); the values of the signals RW[3q−2] to RW[3q], which are the image data P(q,p−2) to P(q,p) output from the shift register SR_P[q], are respectively multiplied by the values of the filters F(3,1) to F(3,3); and the multiplication results are added; thus, the product-sum operation circuit 80 outputs Y(q−2,p−2).

As described above, the product-sum operation circuit 80 conducts the convolutional operation of the image data output from the shift register group 60 and the filters F(1,1) to F(s,t), and the shift register group 60 repeats the operation of shifting the captured image data and outputting the image data to the product-sum operation circuit 80, so that the number of times the semiconductor device 100 accesses the frame memory 50 can be reduced.

<Shift Register: 1>

Figure 6A:
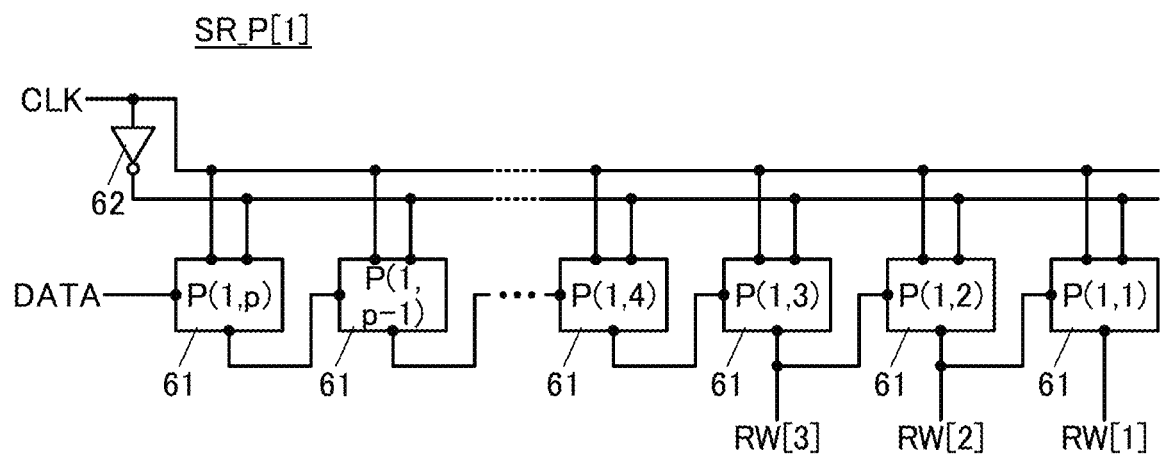
FIG. 6A is a block diagram illustrating a configuration example of a shift register.
Figure 6B:
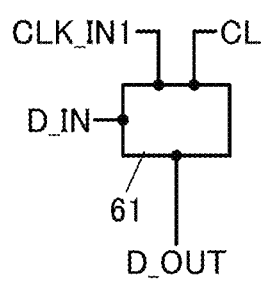
FIG. 6B is a diagram illustrating input and output of a register.
Figure 6C:
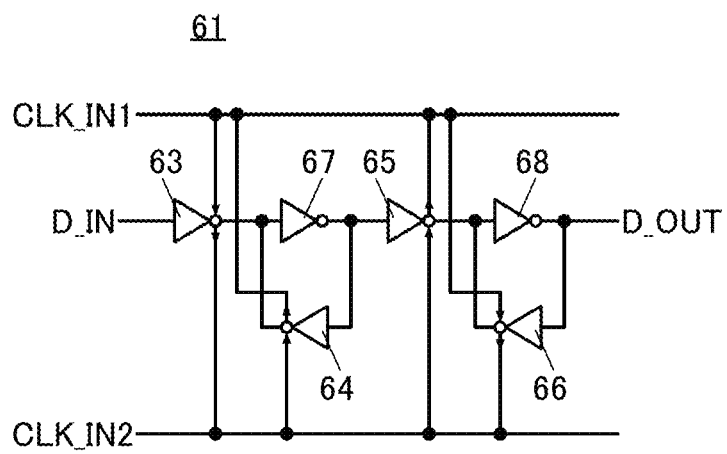
FIG. 6C is a circuit diagram illustrating a configuration example of the register.

FIGS. 6(A) to 6(C) illustrate a configuration example of a shift register that is applicable to the shift registers SR_P[1] to SR_P[q] included in the shift register group 60.

In FIG. 6(A), the image data P(1,1) to P(1,p) captured in the shift register SR_P[1] and the signals RW[1] to RW[3] output from the shift register SR_P[1] are shown as an example; the same configuration example can be applied to the shift registers SR_P[2] to SR_P[q].

The shift register SR_P[1] includes p registers 61 and an inverter 62, and a clock signal CLK and a signal DATA are input to and the signals RW[1] to RW[3] are output from the shift register SR_P[1]. The image data P(1,1) to P(1,p) are sequentially input as the signal DATA.

FIG. 6(B) is a diagram illustrating symbols of the register 61 and illustrates a state of the input and output of the register 61. Clock signals CLK_IN1 and CLK_IN2 and a signal D_IN are input to and a signal D_OUT is output from the register 61.

FIG. 6(C) is a circuit diagram illustrating a configuration example of the register 61 with the symbols. The register 61 includes clocked inverters 63 to 66 and inverters 67 and 68. Note that in FIGS. 6(A) to 6(C), the connection relationship between main components and signals is illustrated and power source lines and the like are omitted. The actual number of the circuits illustrated in FIG. 6(C) included in the register 61 corresponds to the number of bits for one-pixel image data.

The register 61 illustrated in FIGS. 6(A) to 6(C) captures the signal D_IN and outputs the signal D_OUT at the time when the clock signal CLK changes from High to Low. Accordingly, given the frequency of the clock signal CLK is ΔT, the signal DATA is shifted in the shift register SR_P[1] every ΔT second. FIG. 7 illustrates this state.

Figure 7A:
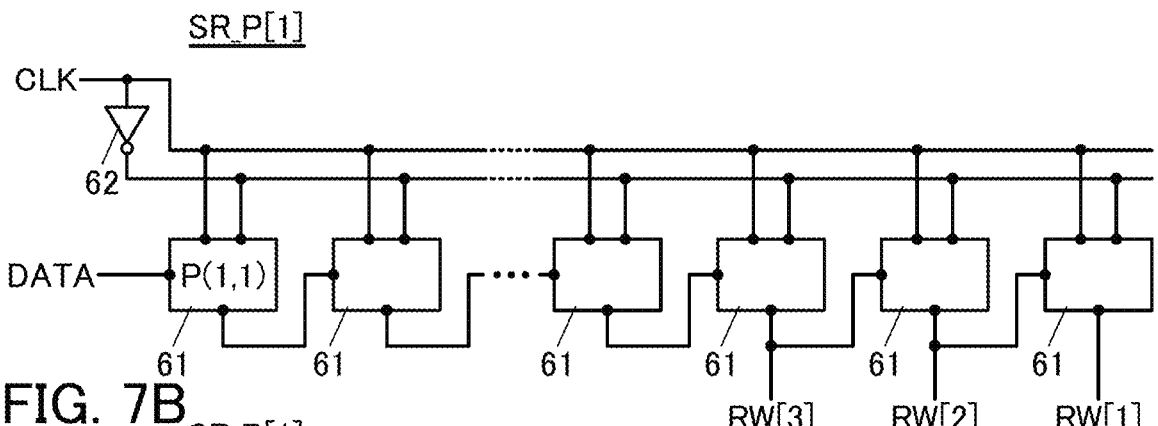
FIGS. 7A to 7D are diagrams illustrating operation of a shift register.
Figure 7B:
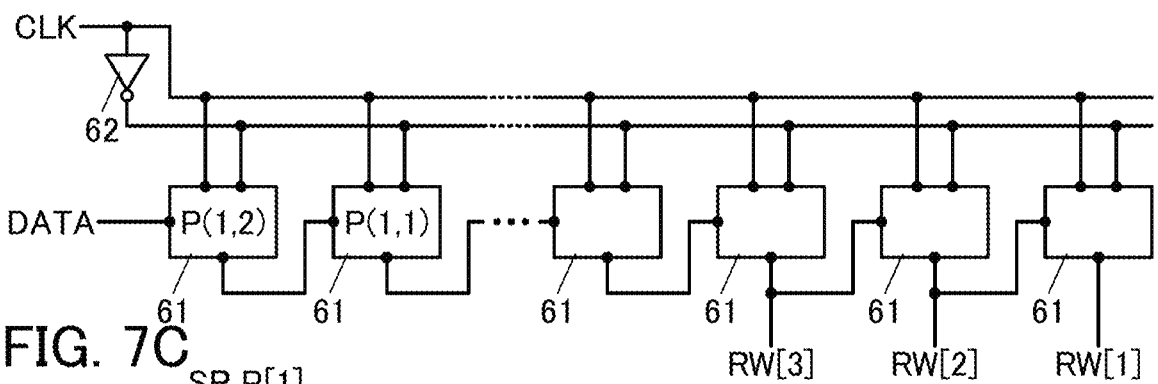
Figure 7C:
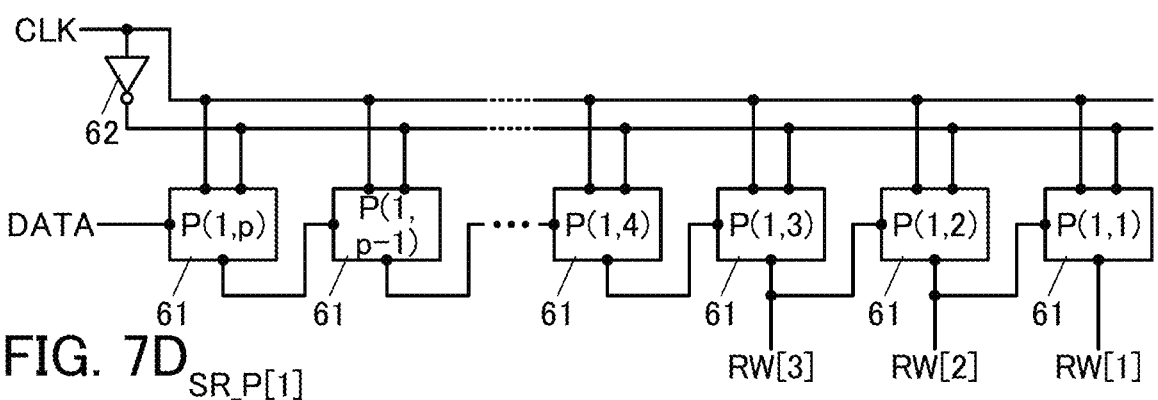

At the timing shown in FIG. 7(A), the image data P(1,1) is captured. FIG. 7(B) shows the state after ΔT seconds of FIG. 7(A): the image data P(1,1) is shifted to the next-state register 61 and the image data P(1,2) is captured. FIG. 7(C) shows the state after (p−1)×ΔT seconds of FIG. 7(A). The image data P(1,1) is shifted to the register 61 in the last stage and the image data P(1,p) is captured. The image data P(1,1) to P(1,3) are output from the shift register SR_P[1] as the signals RW[1] to RW[3]. FIG. 7(C) shows the state described in FIG. 3.

Figure 7D:
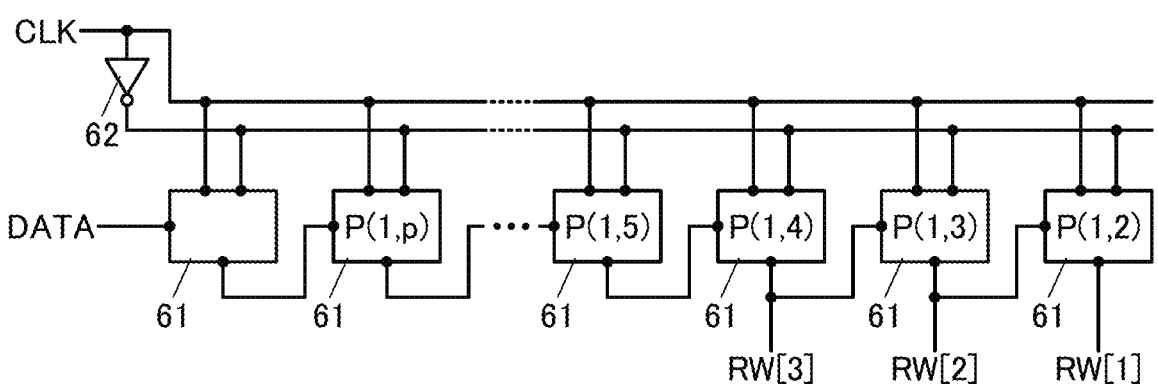

FIG. 7(D) shows the state after p×ΔT seconds of FIG. 7(A). The image data P(1,1) is deleted and the image data P(1,2) to P(1,4) are output from the shift register SR_P[1] as the signals RW[1] to RW[3]. FIG. 7(D) shows the state described in FIG. 4. In this manner, the image data P(1,1) to P(1,p) are shifted in the shift register SR_P[1] and sequentially output as the signals RW[1] to RW[3].

<Shift Register: 2>

Figure 8A:
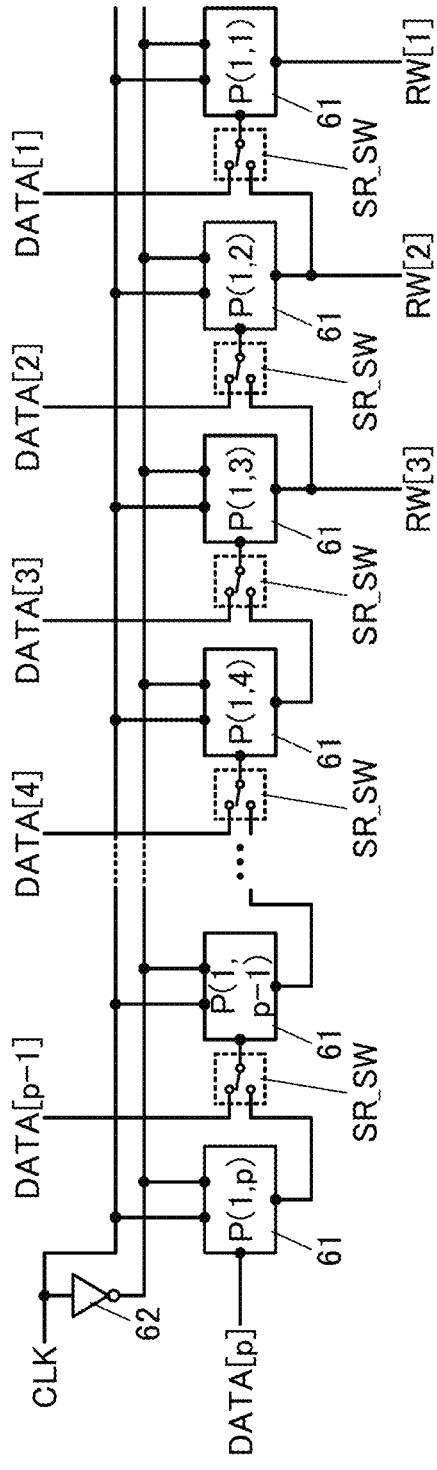
FIG. 8A is a block diagram illustrating a configuration example of a shift register.

The shift register SR_P[1] illustrated in FIG. 6(A) can have a configuration of FIG. 8. That is, a shift register SR_PW[1] illustrated in FIG. 8(A) includes a switch SR_SW between the register 61 and the register 61.

The shift register SR_PW[1] includes p registers 61, (p−1) switches SR_SW, and the inverter 62, and the clock signal CLK and signals DATA[1] to DATA[p] are input to and the signals RW[1] to RW[3] are output from the shift register SR_PW[1]. The image data P(1,1) to P(1,p) are input as the signals DATA[1] to DATA[p], respectively.

Figure 8B:
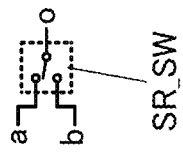
FIG. 8B is a circuit diagram illustrating a configuration example of a switch.

The switch SR_SW includes, as illustrated in FIG. 8(B), two input units a and b and one output unit o. All the switches SR_SW are interlock switches. When one of the switches SR_SW selects the input unit a, all the switches SR_SW included in the shift register SR_PW[1] select their respective input units a. In that case, the image data P(1,1) to P(1,p) can be simultaneously captured in the shift register SR_PW[1] as the signals DATA[1] to DATA[p].

The shift register SR_PW[1] is capable of capturing the image data P(1,1) to P(1,p) at the time when the clock signal CLK changes from High to Low, and getting into the state illustrated in FIG. 7(C) without need of (p−1)×ΔT seconds.

After the shift register SR_PW[1] captures the image data P(1,1) to P(1,p), all the switches SR_SW select the input unit b, so that the image data P(1,1) to P(1,p) can be shifted as in FIGS. 7(C) and 7(D).

<Shift Register: 3>

The shift register SR_PW[1] illustrated in FIG. 8(A) can be a shift register that processes analog data. FIG. 9(A) illustrates a shift register SR_PA[1] as the shift register that processes analog data.

The shift register SR_PA[1] illustrated in FIG. 9(A) includes p registers 69 and a transistor 41, and clock signals CLK1 to CLK4, a signal SE, and the signals DATA[1] to DATA[p] are input to and the signals RW[1] to RW[3] are output from the shift register SR_PA[1]. As in the shift register SR_PW[1], the image data P(1,1) to P(1,p) are input as the signals DATA[1] to DATA[p], respectively, and can be captured at a time.

FIG. 9(B) is a diagram illustrating symbols of the register 69 and illustrates a state of the input and output of the register 69. Clock signals CLK_IN1 to CLK_IN4, a signal D_IN1, a signal D_IN2, and a signal SE_IN are input to and the signal D_OUT is output from the register 69.

FIG. 9(C) is a circuit diagram illustrating a configuration example of the register 69 with the symbols. The register 69 includes transistors 42 to 48 and capacitors C11 and C12. VDD is a high-potential power source and VSS is a low-potential power source.

Note that FIGS. 9(A) and 9(C) illustrate an example in which the transistors 41 to 48 are n-channel transistors, i.e., the shift register SR_PA[1] is formed with the transistors having the same polarity. When the shift register SR_PA[1] is formed with the transistors having the same polarity, the manufacturing steps of the shift register SR_PA[1] can be reduced; however, one embodiment of the present invention is not limited thereto and some of the transistors may be p-channel transistors.

One of a source and a drain of the transistor 43 is electrically connected to one electrode of the capacitor C11 and a gate of the transistor 44. One of a source and a drain of the transistor 44 is electrically connected to one of a source and a drain of the transistor 45, and the other of the source and the drain of the transistor 45 is electrically connected to one of a source and a drain of the transistor 46.

One of a source and a drain of the transistor 46 is electrically connected to one electrode of the capacitor C12 and a gate of the transistor 47. One of a source and a drain of the transistor 47 is electrically connected to one of a source and a drain of the transistor 48, and the signal D_OUT is output from the other of the source and the drain of the transistor 48.

The other of the source and the drain of each of the transistors 43 and 46 is electrically connected to the low-potential power source VSS, and the other of the source and the drain of each of the transistors 44 and 47 is electrically connected to the high-potential power source VDD. The other electrode of the capacitor C11 and the other electrode of the capacitor C12 are electrically connected to a wiring supplied with a predetermined potential such as GND.

The signal SE_IN is input to a gate of the transistor 42; the clock signal CLK_IN1 is input to a gate of the transistor 43; the clock signal CLK_IN2 is input to a gate of the transistor 45; the clock signal CLK_IN3 is input to a gate of the transistor 46; and the clock signal CLK_IN4 is input to a gate of the transistor 48.

Here, a wiring to which the one of the source and the drain of the transistor 43, the one electrode of the capacitor C11, and the gate of the transistor 44 are connected is referred to as a node N11, and a wiring to which the one of the source and the drain of the transistor 46, the one electrode of the capacitor C12, and the gate of the transistor 47 are connected is referred to as a node N12.

The signal D_IN1 is input to one of a source and a drain of the transistor 42, and the other of the source and the drain of the transistor 42 is electrically connected to the node N11. The signal D_IN2 is input to the node N11.

The transistor 43 has a function of resetting the node N11; the capacitor C11 serves as storage capacitance of a signal stored in the node N11; and the transistor 44 has a function of outputting a signal corresponding to the potential of the node N11. The transistor 45 has a function of transferring a signal output from the transistor 44 to the node N12.

The transistor 46 has a function of resetting the node N12; the capacitor C12 serves as storage capacitance of a signal stored in the node N12; and the transistor 47 has a function of outputting a signal corresponding to the potential of the node N12. The transistor 48 has a function of outputting a signal output from the transistor 47 as the signal D_OUT.

As a preferred configuration, the transistors 41 to 48 are OS transistors. The OS transistors have an extremely low off-state current, enabling the shift register SR_PA[1] with the OS transistors to have excellent data retention characteristics. Hence, the signals DATA[1] to DATA[p] input to the shift register SR_PA[1] can be shifted with accuracy.

The channel formation region of an OS transistor preferably includes a metal oxide. The metal oxide used for the OS transistor is preferably an oxide that contains at least one of indium (In) and zinc (Zn).

Typical examples of such oxides include an In-M-Zn oxide, an In-M oxide, a Zn-M oxide, and an In—Zn oxide (the element M is aluminum (Al), gallium (Ga), yttrium (Y), tin (Sn), boron (B), silicon (Si), titanium (Ti), iron (Fe), nickel (Ni), germanium (Ge), zirconium (Zr), molybdenum (Mo), lanthanum (La), cerium (Ce), neodymium (Nd), vanadium (V), beryllium (Be), hafnium (Hf), tantalum (Ta), or tungsten (W), for example).

The off-state current per channel width of 1 μm of an OS transistor can be as low as approximately 1 yA/μm (y: yocto, $10^{-24}$) to 1 zA/μm (z: zepto, $10^{-21}$).

A CAC (Cloud-Aligned Composite)-OS is preferably used for the OS transistor. Details of the CAC-OS will be described in Embodiment 4.

The OS transistor has lower temperature dependence of electrical characteristics than a transistor using silicon in an active region or an active layer (hereinafter referred to as a Si transistor), and thus can be used in a wide range of temperatures. Accordingly, a semiconductor device that includes OS transistors, such as the shift register SR_PA[1], is suitable for use in automobiles, aircraft, and spacecraft. Moreover, the OS transistor has higher drain withstand voltage than a Si transistor; thus, a highly reliable semiconductor device can be achieved.

As the transistors 41 to 48, a transistor other than the OS transistor can be used if having a low off-state current. For example, a transistor using a wide-bandgap semiconductor may be used. In some cases, the wide-bandgap semiconductor refers to a semiconductor with a bandgap of 2.2 eV or greater. Examples of the wide-bandgap semiconductor include silicon carbide, gallium nitride, and diamond.

Note that the actual number of the circuits illustrated in FIG. 9(C) included in the register 69 corresponds to the number of bits for one-pixel image data.

Next, the operation of the register 69 and the shift register SR_PA[1] will be described.

After the transistor 43 resets the charge of the capacitor C11, i.e., initializes the potential of the node N11, the signal D_IN1 or the signal D_IN2 is input to the register 69. This operation can set the potential of the node N11 to any of the signals DATA[1] to DATA[p] or the output potential (analog potential) of the register 69 in a previous stage. The signal SE_IN can control the transistor 42 so that the signal D_IN1 is set to the potential of the node N11.

Note that in the shift register SR_PA[1], there is no signal input to the signal D_IN2 in the register 69 in the first stage and therefore, the signal D_IN2 is not connected (is floating). Also in the shift register SR_PA[1], the transistor 41 initializes the potential of the signal RW[1] output from the register 69 in the last stage.

In the register 69, a signal corresponding to the gate voltage of the transistor 44, i.e., the potential of the node N11, can be output to the node N12 when the transistor 45 is controlled.

In the register 69, the charge of the capacitor C12 is reset, i.e., the potential of the node N12 is initialized, by the transistor 46, and then, a signal corresponding to the potential of the node N11 is obtained, whereby the potential of the node N12 can be set to a potential (analog potential) corresponding to the signal. That is, the potential of the node N11 can be set to the potential of the node N12.

In the register 69, a signal corresponding to the gate voltage of the transistor 47, i.e., the potential of the node N12, can be output as the signal D_OUT when the transistor 48 is controlled.

Note that in the above, the signal output to the node N12 in the register 69 has a potential obtained by subtracting the threshold voltage of the transistor 44 from the potential of the node N11. Similarly, the signal D_OUT has a potential obtained by subtracting the threshold voltage of the transistor 47 from the potential of the node N12.

Figure 10A:
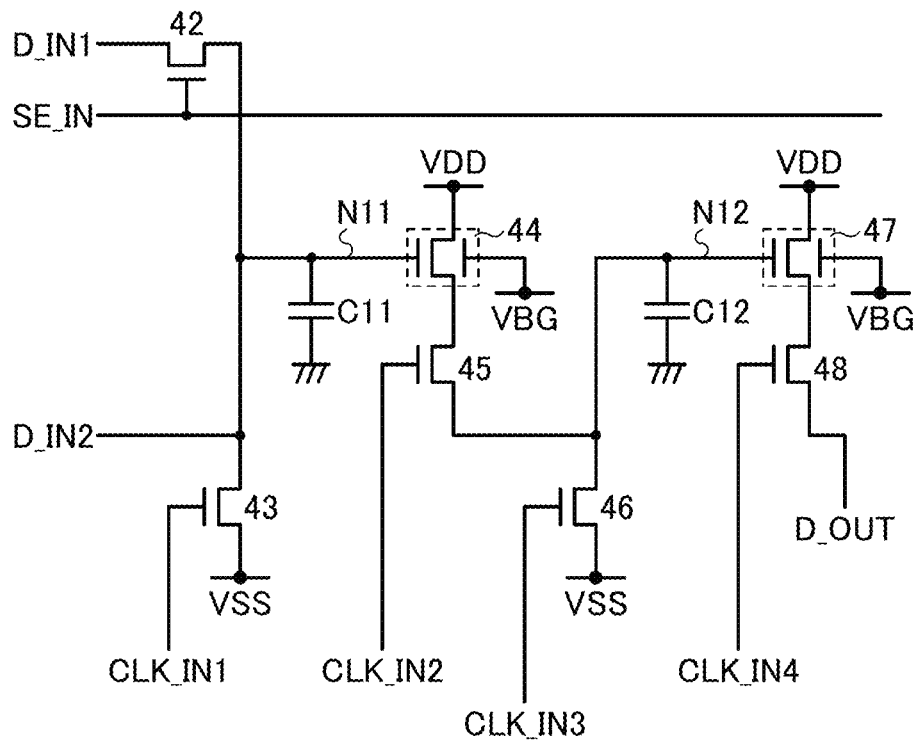
FIG. 10A is a circuit diagram illustrating a configuration example of a register.

In other words, as a signal is transferred through stages of the shift register SR_PA[1] composed of the registers 69, the output potentials of the registers 69 change gradually. For that reason, at least the transistors 44 and 47 are preferably provided with a back gate as illustrated in FIG. 10(A). The potentials of the back gates are controlled by a power source VBG so that the threshold voltages of the transistors 44 and 47 are 0 V or close to 0 V; thus, the change in output potentials of the register 69 can be reduced.

Note that the aforementioned control of the threshold voltage with the back gate is performed in the range where the output of the shift register is obtained with sufficient accuracy or the range where the output is capable of being corrected by an external circuit. The external circuit for correction is configured to, for example, add the total reduction amount of threshold voltage in the register 69 of each stage to the signal D_OUT.

Figure 10B:
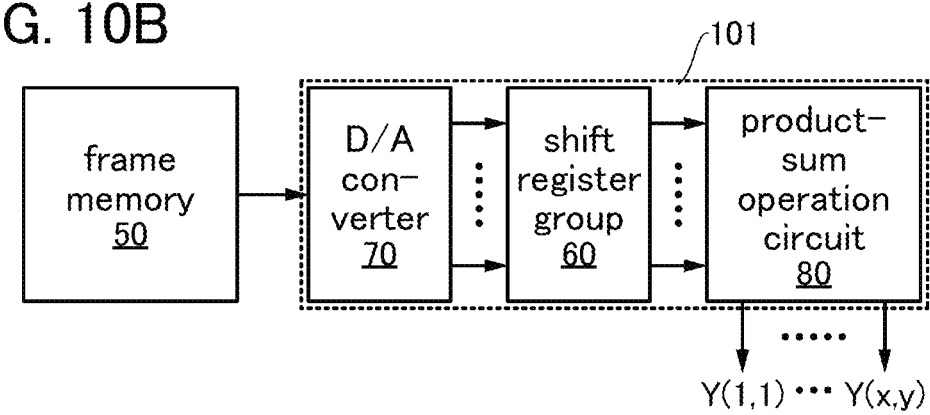
FIG. 10B is a block diagram illustrating a configuration example of a semiconductor device.

In the case where the shift register SR_PA[1] is applied to the shift register group 60, the order of the shift register group 60 and the D/A converter 70 is changed to be used in the semiconductor device 100. That is, the semiconductor device 100 illustrated in FIG. 2(A) is changed into a semiconductor device 101 illustrated in FIG. 10(B).

Next, the operation of the register 69 and the shift register SR_PA[1] will be described with reference to the timing chart in FIG. 11.

Figure 11:
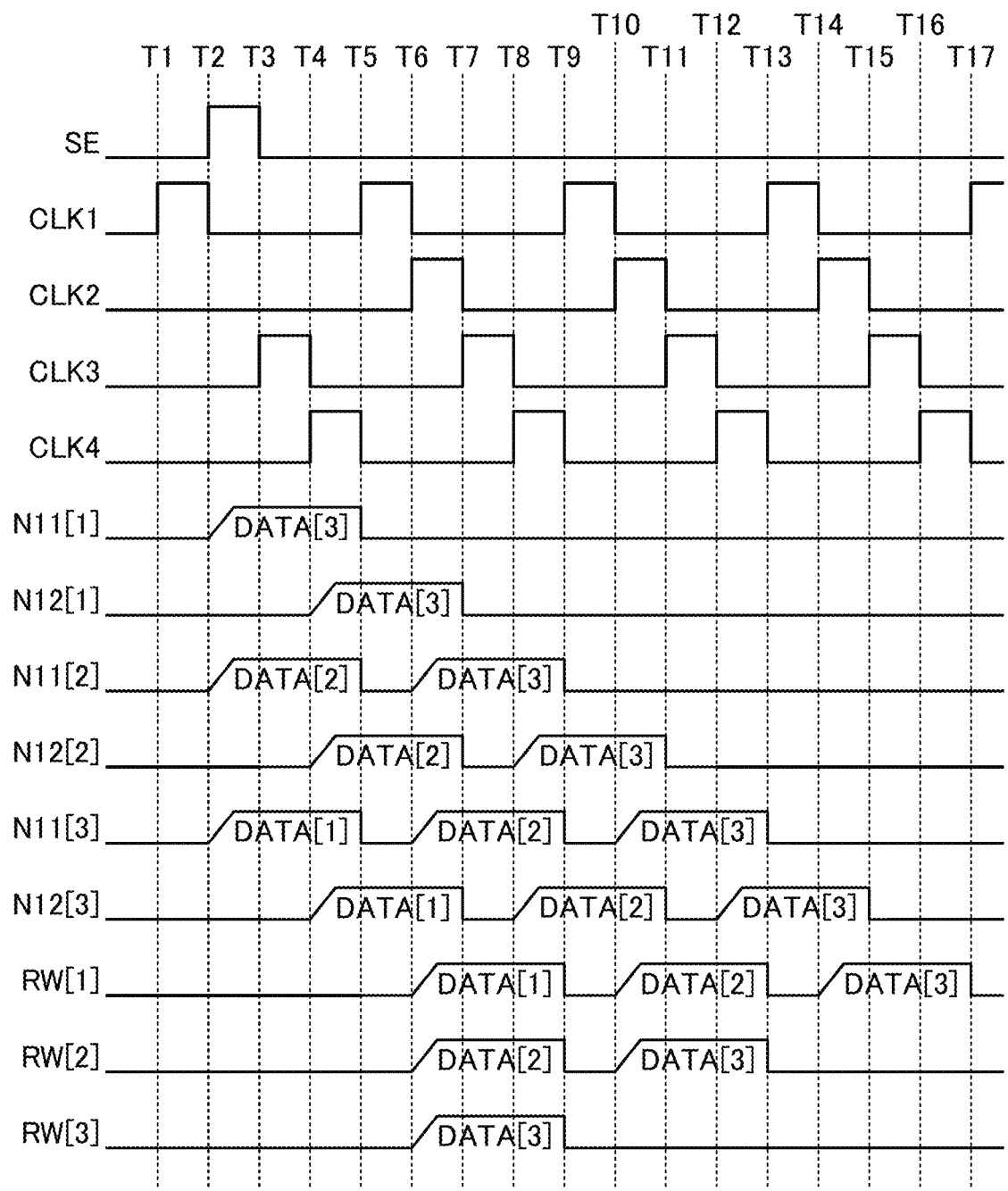
FIG. 11 is a timing chart.

In the timing chart in FIG. 11, three registers 69 are shown (p=3). The node N11 and the node N12 of the register 69 in the first stage are denoted as a node N11[1] and a node N12[1], respectively, and the node N11 and the node N12 of the register 69 in the last stage are denoted as a node N11[3] and a node N12[3], respectively. The same applies to a node N11[2] and a node N12[2].

For description, the timing chart in FIG. 11 shows that the node N11[1] to the node N11[3], the node N12[1] to the node N12[3], and the signals RW[1] to RW[3] are set to or output as the potential of any of the signals DATA[1] to DATA[3].

From Times T1 to T2, the clock signal CLK1 is set to High, so that the node N11[1], the node N11[2], the node N11[3], and the signal RW[1] are reset to Low. At this time, the signal RW[2] and the signal RW[3] are also reset to Low (see FIG. 9(A)).

From Times T2 to T3, the signal SE is set to High, so that the potential of the node N11[1] is set to the potential of the signal DATA[3], the potential of the node N11[2] is set to the potential of the signal DATA[2], and the potential of the node N11[3] is set to the potential of the signal DATA[1].

From Times T3 to T4, the clock signal CLK3 is set to High, so that the node N12[1], the node N12[2], and the node N12[3] are reset to Low.

From Times T4 to T5, the clock signal CLK4 is set to High, so that the potential of the node N12[1] is set to the potential of the node N11[1], the potential of the node N12[2] is set to the potential of the node N11[2], and the potential of the node N12[3] is set to the potential of the node N11[3].

From Times T5 to T6, the clock signal CLK1 is set to High, so that the node N11[1], the node N11[2], the node N11[3], the signal RW[1], the signal RW[2], and the signal RW[3] are reset to Low.

From Times T6 to T7, the clock signal CLK2 is set to High, so that the potential of the node N12[1] is set to the potential of the signal RW[3] and the node N11[2], the potential of the node N12[2] is set to the potential of the signal RW[2] and the node N11[3], and the potential of the node N12[3] is set to the potential of the signal RW[1].

From the time at which the potentials of the signal RW[1] to the signal RW[3] are determined after Time T6 to Time T9, the potential of the signal DATA[3] is output as the signal RW[3], the potential of the signal DATA[2] is output as the signal RW[2], and the potential of the signal DATA[1] is output as the signal RW[1].

From Times T7 to T8, the clock signal CLK3 is set to High, so that the node N12[1], the node N12[2], and the node N12[3] are reset to Low.

From Times T8 to T9, the clock signal CLK4 is set to High, so that the potential of the node N12[1] is set to the potential of the node N11[1], the potential of the node N12[2] is set to the potential of the node N11[2], and the potential of the node N12[3] is set to the potential of the node N11[3].

From Times T9 to T10, the clock signal CLK1 is set to High, so that the node N11[1], the node N11[2], the node N11[3], the signal RW[1], the signal RW[2], and the signal RW[3] are reset to Low.

From Times T10 to T11, the clock signal CLK2 is set to High, so that the potential of the node N12[1] is set to the potential of the signal RW[3] and the node N11[2], the potential of the node N12[2] is set to the potential of the signal RW[2] and the node N11[3], and the potential of the node N12[3] is set to the potential of the signal RW[1].

From the time at which the potentials of the signal RW[1] and the signal RW[2] are determined after Time T10 to Time T13, the potential of the signal DATA[3] is output as the signal RW[2], and the potential of the signal DATA[2] is output as the signal RW[1]. The signal RW[3] becomes Low.

From Times T11 to T12, the clock signal CLK3 is set to High, so that the node N12[1], the node N12[2], and the node N12[3] are reset to Low.

From Times T12 to T13, the clock signal CLK4 is set to High, so that the potential of the node N12[1] is set to the potential of the node N11[1], the potential of the node N12[2] is set to the potential of the node N11[2], and the potential of the node N12[3] is set to the potential of the node N11[3].

From Times T13 to T14, the clock signal CLK1 is set to High, so that the node N11[1], the node N11[2], the node N11[3], the signal RW[1], the signal RW[2], and the signal RW[3] are reset to Low.

From Times T14 to T15, the clock signal CLK2 is set to High, so that the potential of the node N12[1] is set to the potential of the signal RW[3] and the node N11[2], the potential of the node N12[2] is set to the potential of the signal RW[2] and the node N11[3], and the potential of the node N12[3] is set to the potential of the signal RW[1].

From the time at which the potential of the signal RW[1] is determined after Time T14 to Time T17, the potential of the signal DATA[3] is output as the signal RW[1]. The signal RW[2] and the signal RW[3] become Low.

As described above, the registers 69 included in the shift register SR_PA[1] each include the node N11 and the node N12 and a signal stored in the node N11 can be transferred to the node N12. In addition, the signal stored in the node N12 can be transferred to the node N11 of the register 69 in a subsequent stage. That is, the image data P(1,1) to P(1,p) input to the shift register SR_PA[1] are shifted by the registers 69 and output in sequence.

Note that FIG. 3 to FIG. 11 show an example in which the registers 61 or the registers 69 in the last three stages, which are included in the shift register SR_P[1], SR_PW[1], or SR_PA[1], output signals as the signals RW[1] to RW[3]; however, one embodiment of the present invention is not limited thereto. Next, a configuration example for pooling operation, which is often performed after convolutional operation in the image recognition field, will be described.

<Shift Register Group and Product-Sum Operation Circuit: 2>

Figure 12:
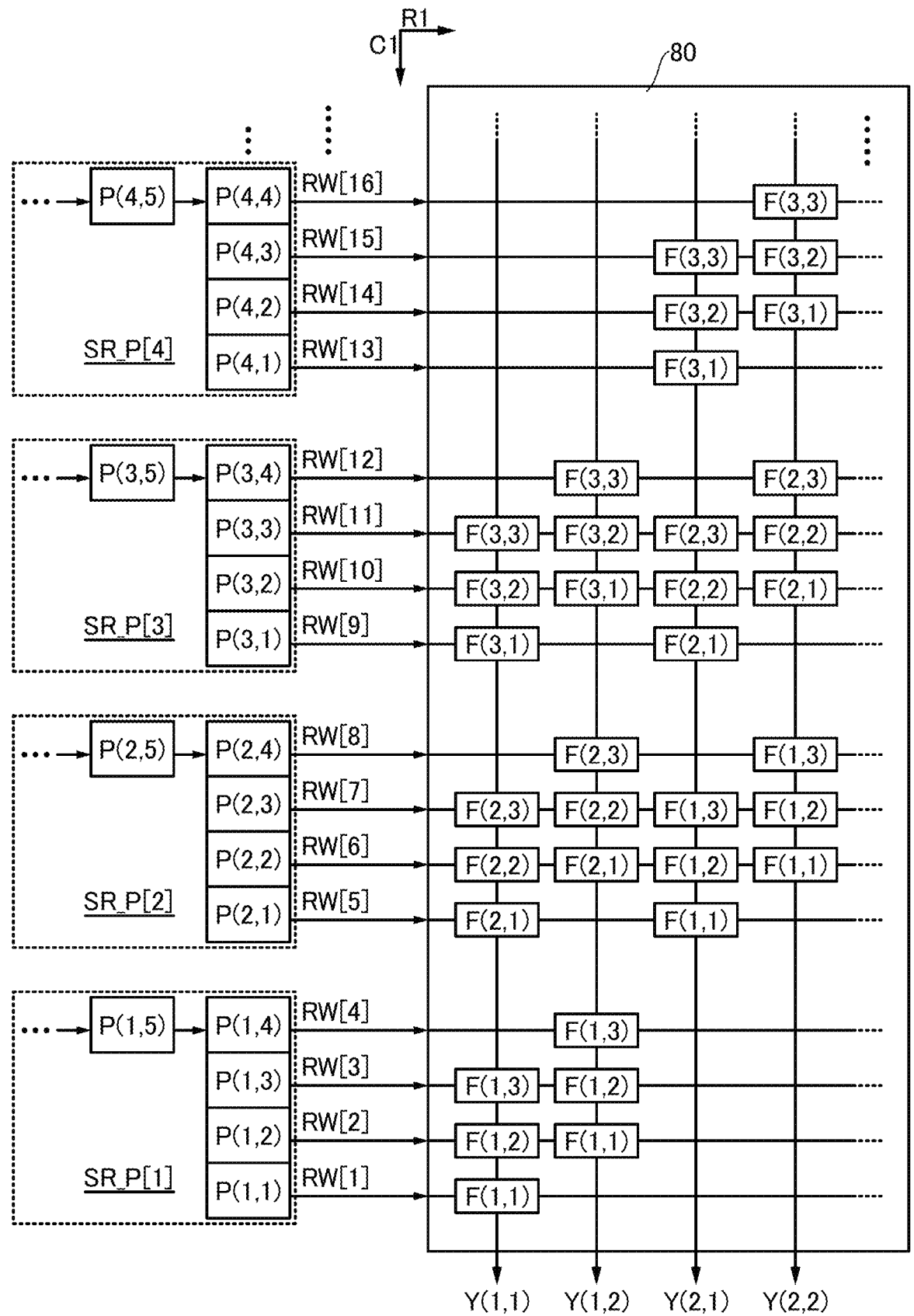
FIG. 12 is a conceptual diagram illustrating part of a shift register group and operation of a product-sum operation circuit.

FIG. 12 as well as FIG. 3 illustrates part of the shift register group 60 and the product-sum operation circuit 80, and the product-sum operation circuit 80 includes the filters F(1,1) to F(s,t) (s=t=3).

In FIG. 12, the shift register SR_P[1] outputs the image data P(1,1) to P(1,4) among the image data P(1,1) to P(1,p) captured in the shift register SR_P[1] (signals RW[1] to RW[4] in FIG. 12).

Although not illustrated in FIG. 12, the signals RW[1] to RW[4] are converted into analog signals by the D/A converter 70, and then input to the product-sum operation circuit 80. The signals RW[1] to RW[3] are respectively multiplied by the filters F(1,1) to F(1,3) in the product-sum operation circuit 80. The signals RW[2] to RW[4] are respectively multiplied by the filters F(1,1) to F(1,3) in the product-sum operation circuit 80.

Similarly, the shift register SR_P[2] outputs the image data P(2,1) to P(2,4) (the signals RW[5] to RW[8] in FIG. 12), the shift register SR_P[3] outputs the image data P(3,1) to P(3,4) (the signals RW[9] to RW[12] in FIG. 12), and the shift register SR_P[4] outputs the image data P(4,1) to P(4,4) (the signals RW[13] to RW[16] in FIG. 12).

The signals RW[5] to RW[7] are respectively multiplied by the filters F(2,1) to F(2,3) in the product-sum operation circuit 80, and RW[6] to RW[8] are respectively multiplied by the filters F(2,1) to F(2,3) in the product-sum operation circuit 80. The signals RW[9] to RW[11] are respectively multiplied by the filters F(3,1) to F(3,3) in the product-sum operation circuit 80, and the signals RW[10] to RW[12] are respectively multiplied by the filters F(3,1) to F(3,3) in the product-sum operation circuit 80.

The multiplication results of the signals RW[1] to RW[3] and the filters F(1,1) to F(1,3), the multiplication results of the signals RW[5] to RW[7] and the filters F(2,1) to F(2,3), and the multiplication results of the signals RW[9] to RW[11] and the filters F(3,1) to F(3,3) are added; thus, the product-sum operation circuit 80 outputs Y(1,1).

The multiplication results of the signals RW[2] to RW[4] and the filters F(1,1) to F(1,3), the multiplication results of the signals RW[6] to RW[8] and the filters F(2,1) to F(2,3), and the multiplication results of the signals RW[10] to RW[12] and the filters F(3,1) to F(3,3) are added; thus, the product-sum operation circuit 80 outputs Y(1,2).

Similarly, the signals RW[5] to RW[7], which are the image data P(2,1) to P(2,3) output from the shift register SR_P[2], are respectively multiplied by the filters F(1,1) to F(1,3); the signals RW[9] to RW[11], which are the image data P(3,1) to P(3,3) output from the shift register SR_P[3], are respectively multiplied by the filters F(2,1) to F(2,3); the signals RW[13] to RW[15], which are the image data P(4,1) to P(4,3) output from the shift register SR_P[4], are respectively multiplied by the filters F(3,1) to F(3,3); and the multiplication results are added; thus, the product-sum operation circuit 80 outputs Y(2,1).

Similarly, the signals RW[6] to RW[8], which are the image data P(2,2) to P(2,4) output from the shift register SR_P[2], are respectively multiplied by the filters F(1,1) to F(1,3); the signals RW[10] to RW[12], which are the image data P(3,2) to P(3,4) output from the shift register SR_P[3], are respectively multiplied by the filters F(2,1) to F(2,3); the signals RW[14] to RW[16], which are the image data P(4,2) to P(4,4) output from the shift register SR_P[4], are respectively multiplied by the filters F(3,1) to F(3,3); and the multiplication results are added; thus, the product-sum operation circuit 80 outputs Y(2,2).

Figure 13:
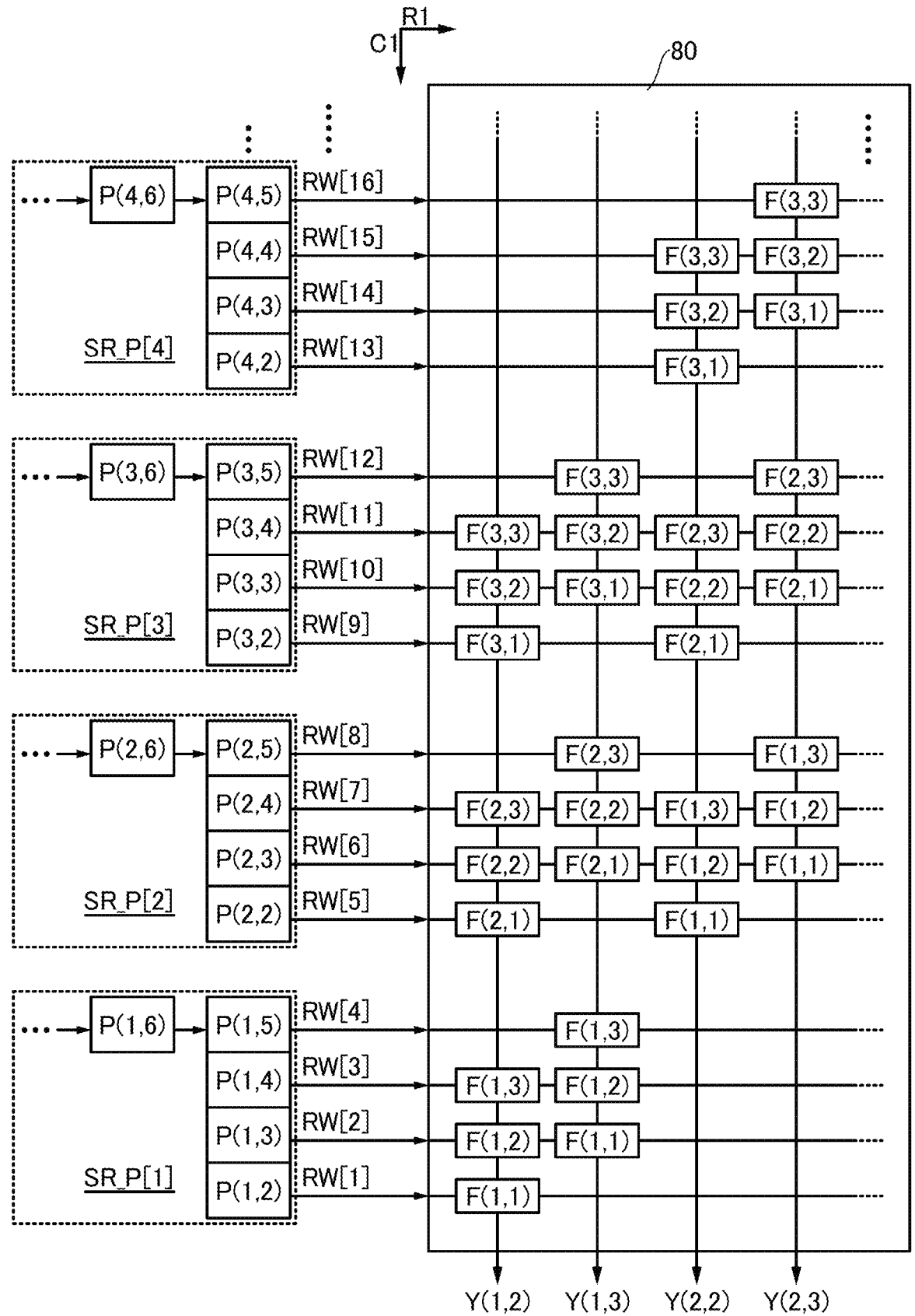
FIG. 13 is a conceptual diagram illustrating part of a shift register group and operation of a product-sum operation circuit.

Next, FIG. 13 illustrates a state in which the image data P(1,1) to P(q,p) captured in the shift registers SR_P[1] to SR_P[q] in FIG. 12 are each shifted by one line.

That is, the shift register SR_P[1] outputs the image data P(1,2) to P(1,5); the shift register SR_P[2] outputs the image data P(2,2) to P(2,5); the shift register SR_P[3] outputs the image data P(3,2) to P(3,5); and the shift register SR_P[4] outputs the image data P(4,2) to P(4,5).

In a manner similar to that in FIG. 12, the signals RW[1] to RW[3], which are the image data P(1,2) to P(1,4) output from the shift register SR_P[1], are respectively multiplied by the filters F(1,1) to F(1,3); the signals RW[5] to RW[7], which are the image data P(2,2) to P(2,4) output from the shift register SR_P[2], are respectively multiplied by the filters F(2,1) to F(2,3); the signals RW[9] to RW[11], which are the image data P(3,2) to P(3,4) output from the shift register SR_P[3], are respectively multiplied by the filters F(3,1) to F(3,3); and the multiplication results are added; thus, the product-sum operation circuit 80 outputs Y(1,2).

Similarly, the signals RW[2] to RW[4], which are the image data P(1,3) to P(1,5) output from the shift register SR_P[1], are respectively multiplied by the filters F(1,1) to F(1,3); the signals RW[6] to RW[8], which are the image data P(2,3) to P(2,5) output from the shift register SR_P[2], are respectively multiplied by the filters F(2,1) to F(2,3); the signals RW[10] to RW[12], which are the image data P(3,3) to P(3,5) output from the shift register SR_P[3], are respectively multiplied by the filters F(3,1) to F(3,3); and the multiplication results are added; thus, the product-sum operation circuit 80 outputs Y(1,3).

The same applies to the other data, and the description on FIG. 12 is referred to for Y(2,2) and Y(2,3).

Here, the data Y(1,1), Y(1,2), Y(2,1), and Y(2,2) output from the product-sum operation circuit 80 in the description on FIG. 12 and the data Y(1,2), Y(1,3), Y(2,2), and Y(2,3) output from the product-sum operation circuit 80 in the description on FIG. 13 can be subjected to pooling operation without being stored once.

In the pooling operation, image data is divided into small areas, and for example, the maximum value is extracted from each area. In the example in FIG. 12, the maximum value is extracted from Y(1,1), Y(1,2), Y(2,1), and Y(2,2); and in the example in FIG. 13, the maximum value is extracted from Y(1,2), Y(1,3), Y(2,2), and Y(2,3). Note that one embodiment of the present invention is not limited to the examples in FIG. 12 and FIG. 13, and the configurations of the shift register group 60 and the product-sum operation circuit 80 can be selected in accordance with the objective pooling operation.

Figure 14A:
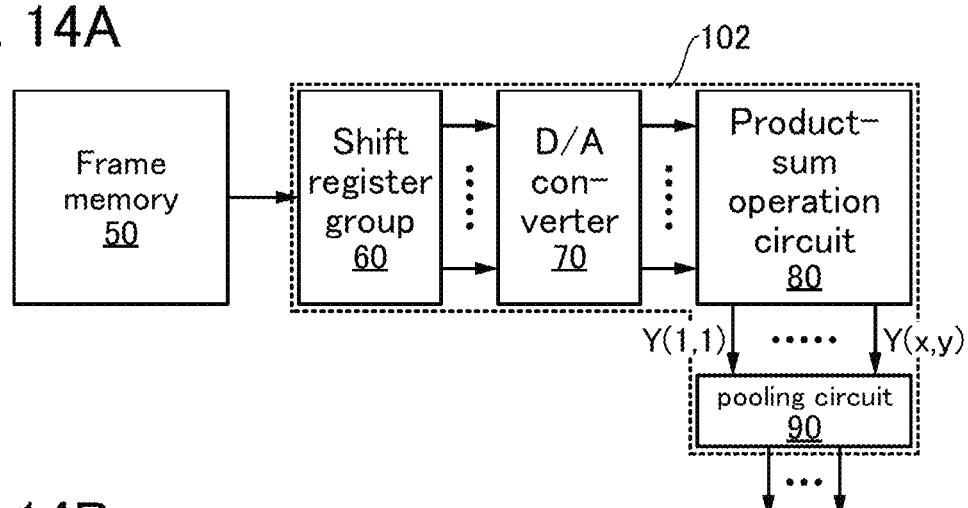
FIG. 14A is a block diagram illustrating a configuration example of a semiconductor device.

As described above, the shift register group 60 repeatedly outputs and shifts captured image data, the product-sum operation circuit 80 conducts the convolutional operation of the image data output from the shift register group 60 and the filters F(1,1) to F(s,t), and the output Y(y,x) of the product-sum operation circuit 80 can be subjected to pooling operation without being stored once. When a pooling circuit 90 is added to the semiconductor device 100 illustrated in FIG. 2(A), a semiconductor device 102 illustrated in FIG. 14(A) can be obtained.

The convolutional operation can be performed efficiently when any one of the semiconductor devices 100 to 102 of one embodiment of the present invention is used.

Note that this embodiment can be implemented in combination with the other embodiments described in this specification as appropriate.

Embodiment 2

As described above, a neural network has a circuit configuration that resembles a biological neural network composed of neurons and synapses, i.e., a circuit configuration in which units resembling neurons are connected to each other. Two or more pieces of data are input to each of the neurons and multiplied by a weight coefficient, which represents the strength of connection, and the multiplication results are added (product-sum operation).

Parameters of a filter in the image recognition field are equivalent to weight coefficients in the neural network; a great advantage given when the neural network is utilized in the image recognition field is that the weight coefficients are obtained by learning.

That is, in the case where the neural network is utilized in the image recognition field, a large amount of image data and information on what the image data represents (also referred to as teacher data) are given to the neural network, whereby the neural network can perform leaning (also referred to as supervised learning). Weight coefficients (parameters of a filter) and the like are changed through learning.

A well-trained neural network has optimum weight coefficients and the like to infer what object the given image data represents. Described in this embodiment are an example of the neural network that is capable of learning and inference in the aforementioned manner and an example of a product-sum operation circuit applicable to the neural network. Note that the product-sum operation circuit described in this embodiment can be used as the product-sum operation circuit 80 exemplified in Embodiment 1.

<Neural Network>

As an example of the neural network, a hierarchical neural network and supervised learning will be described below.

Figure 14B:
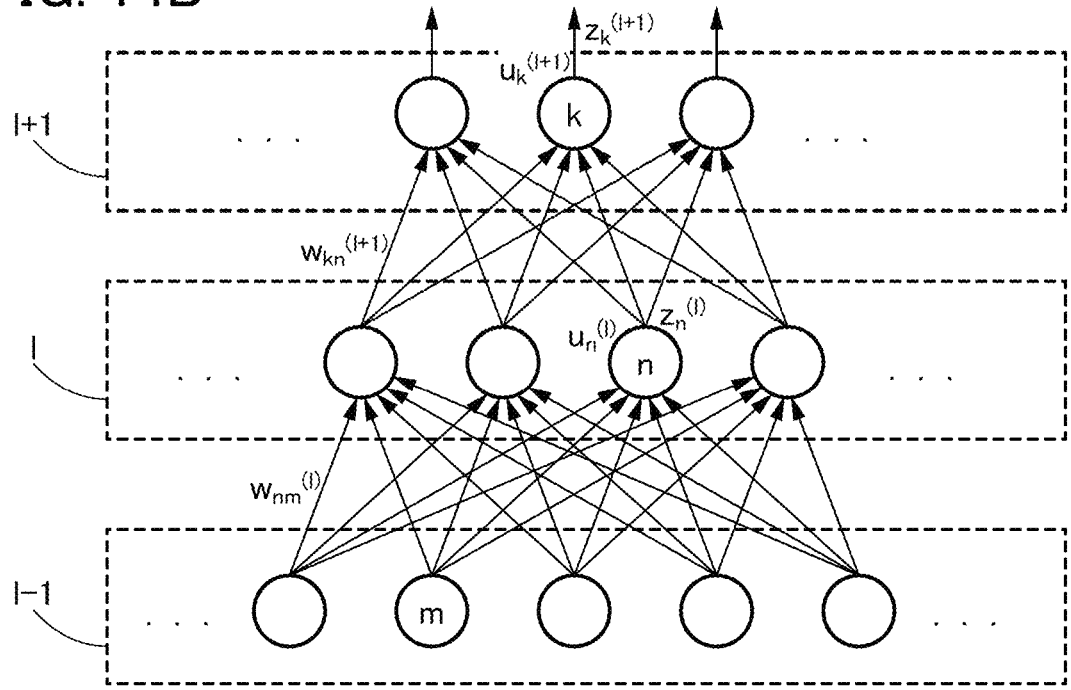
FIG. 14B is a diagram illustrating a configuration example of a hierarchical neural network.

FIG. 14(B) illustrates a configuration example of a hierarchical neural network. In FIG. 14(B), a neuron of each layer is denoted by a circle. FIG. 14(B) illustrates a configuration example of the hierarchical neural network that includes neurons (formal neurons) divided into three layers: a (l−1)th layer serving as an input layer, a l-th layer serving as a middle layer (hidden layer), and a (l+1)th layer serving as an output layer (l is an integer of 2 or more). The number of neurons in the (l−1)th layer is M (M is an integer of 2 or more), the number of neurons in the l-th layer is N (N is an integer of 2 or more), and the number of neurons in the (l+1)th layer is K (K is an integer of 2 or more).

FIG. 14(B) illustrates five neurons among a plurality of neurons in the (l−1)th layer, four neurons among a plurality of neurons in the l-th layer, and three neurons among a plurality of neurons in the (l+1)th layer.

Although FIG. 14(B) illustrates a configuration example of a hierarchical neural network including one middle layer, the middle layer may include a plurality of layers. Thus, in the case of a hierarchical neural network including L layers (L is an integer of 3 or more), a first layer corresponds to an input layer, second to (L−1)th layers correspond to a middle layer, and a L-th layer corresponds to an output layer.

In FIG. 14(B), an output $z_m^{(l-1)}$ of an m-th neuron in the (l−1)th layer (m is an integer greater than or equal to 1 and less than or equal to M) is input to an n-th neuron in the l-th layer (n is an integer greater than or equal to 1 and less than or equal to N). An output $z_n^{(l)}$ of the n-th neuron is input to a k-th neuron in the (l+1)th layer (k is an integer greater than or equal to 1 and less than or equal to K). The output of the k-th neuron is denoted by $z_k^{(l+1)}$. The weight coefficient for input to the n-th neuron in the l-th layer is denoted by $w_{nm}^{(l)}$, and the weight coefficient for input to the k-th neuron in the (l+1)th layer is denoted by $w_{kn}^{(l+1)}$.

Under the above condition, the sum (net value) of the input to the n-th neuron in the l-th layer is represented by the following Formula b1.

$$u_n^{(l)} = \Sigma_n w_{nm}^{(l)} \cdot z_m^{(l-1)} \quad (b1)$$

The arithmetic processing of Formula b1 can be performed by using a product-sum operation circuit, which will be described later.

The output $z_n^{(l)}$ of the n-th neuron in the l-th layer is represented by the following Formula b2.

$$z_n(l) = f(u_n^{(l)}) \quad (b2)$$

Figure 14C:
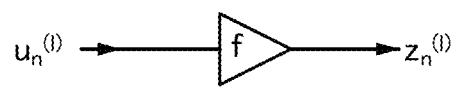
FIGS. 14C and 14D are diagrams illustrating circuit configurations used for arithmetic processing.

Note that $f$ is an output function of the neuron. As the output function $f$ of a neuron, a step function, a linear ramp function, a sigmoid function, or the like can be used. For example, the arithmetic processing of Formula b2 can be performed by using a circuit 270 illustrated in FIG. 14(C). In the circuit 270, the output function $f$ corresponds to the output characteristics of an OP amplifier. Furthermore, the arithmetic processing of Formula b2 can also be performed by using an output signal from the OP amplifier and performing arithmetic processing in an arithmetic circuit associated with a desired output function.

Similarly, the sum (net value) of the input to the k-th neuron in the (l+1)th layer is represented by the following Formula b3.

$$u_k^{(l+1)} = \Sigma n w_{kn}^{(l+1)} \cdot z_n^{(l)} \quad (b3)$$

The arithmetic processing of Formula b3 can be performed by using a product-sum operation circuit, which will be describe later.

The output $z_k^{(l+1)}$ of the k-th neuron in the (l+1)th layer is represented by the following Formula b4.

$$z_k^{(l+1)} = f(u_k^{(l+1)}) \quad (b4)$$

Figure 14D:
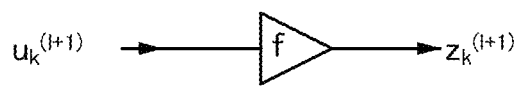

For example, the arithmetic processing of Formula b4 can be performed by using a circuit 271 illustrated in FIG. 14(D). In the circuit 271, the output function $f$ corresponds to the output characteristics of the OP amplifier, as in the circuit 270. Furthermore, the arithmetic processing of Formula b4 can also be performed by using an output signal from the OP amplifier and performing arithmetic processing in an arithmetic circuit corresponding to a desired output function.

With the above-described configuration, the output $z_k^{(l+1)}$ of the k-th neuron can be obtained.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other in the function of the above hierarchical neural network.

Figure 15A:
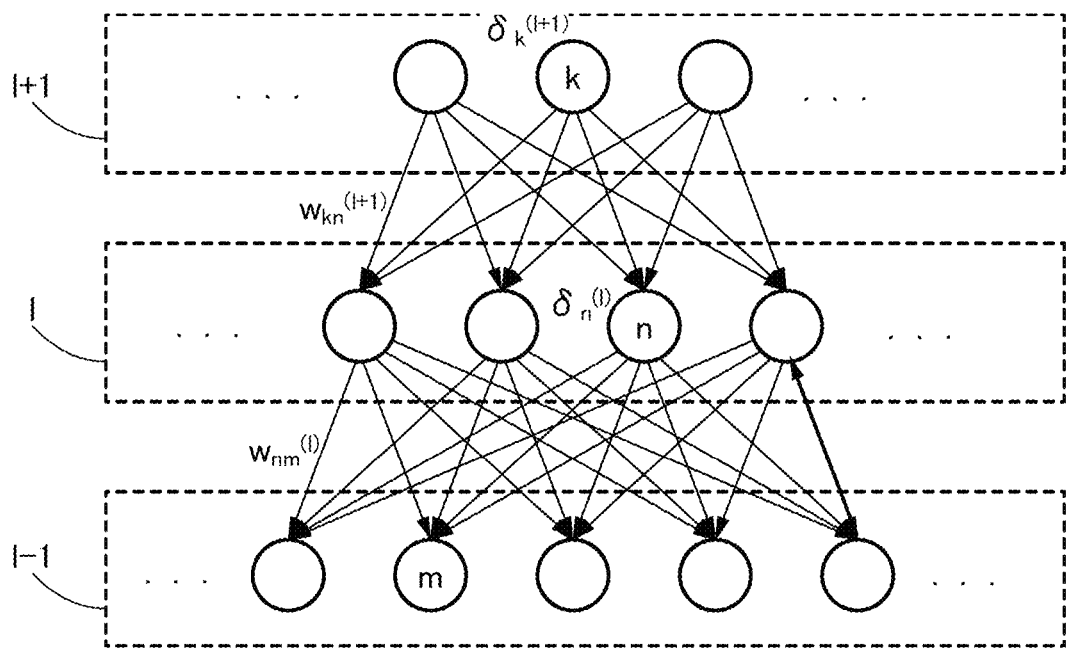
FIG. 15A is a schematic diagram of backpropagation, and (B, C, D)

A learning method using backpropagation will be described as a specific example of supervised learning. FIG. 15(A) is a schematic diagram of backpropagation. Backpropagation is a method for changing a weight coefficient so as to reduce an error between an output of a hierarchical neural network and teacher data.

Specifically, in back propagation, with respect to error energy E determined by an output $z_k^{(L)}$ of the output layer and teacher data $t_k$, the weight coefficient $w_{nm}^{(l)}$ of the l-th layer is changed by the update amount $\partial E/\partial w_{nm}^{(l)}$.

For example, when an error $\delta_n^{(l)}$ of the l-th layer is defined as $\delta_n^{(l)} = \partial E/\partial u_n^{(l)}$, the error $\delta_n^{(l)}$ and the update amount $\partial E/\partial w_{nm}^{(l)}$ are represented by the following Formula b5 and Formula b6, respectively. Note that $f'$ is a derivative of the output function of a neuron.

$$\delta_n^{(l)} = \Sigma_k \delta_k^{(l+1)} \cdot w_{kn}^{(l+1)} \cdot f'(u_n^{(l)}) \quad (b5)$$

$$\partial E/\partial w_{nm}^{(l)} = \delta_n^{(l)} \cdot z_m^{(l-1)} \quad (b6)$$

Figure 15B:
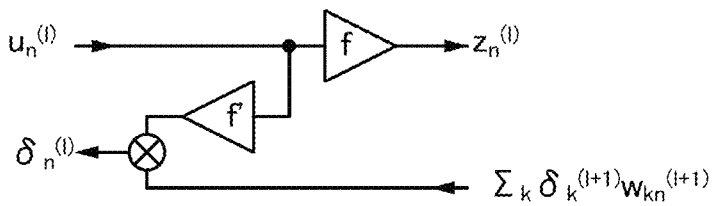
FIGS. 15B to 15D are diagrams illustrating circuit configurations used for arithmetic processing.
Figure 15C:
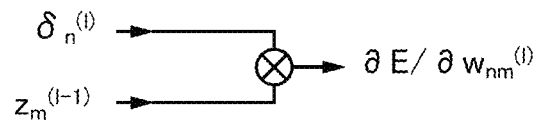

For example, the arithmetic processing of Formula b5 can be performed by using a circuit 272 illustrated in FIG. 15(B). The arithmetic processing of Formula b6 can be performed by using a circuit 273 illustrated in FIG. 15(C). The arithmetic processing regarding the derivative can be performed with an output signal from the OP amplifier in an arithmetic circuit corresponding to a desired derivative, for example.

Part of the arithmetic processing of Formula (b5) can be performed by using a product-sum operation circuit, which will be described later.

An error $\delta_k^{(l+1)}$ and the update amount $\partial E/\partial w_{kn}^{(l+1)}$ of the (l+1)th layer, which is the output layer, are represented by the following Formula b7 and Formula b8, respectively.

$$\delta_k^{(l+1)} = (z_k^{(l+1)} - t_k) \cdot f'(u_k^{(l+1)}) \quad (b7)$$

$$\partial E/\partial w_{kn}^{(l+1)} = \delta_k^{(l+1)} \cdot z_n^{(l)} \quad (b8)$$

Figure 15D:
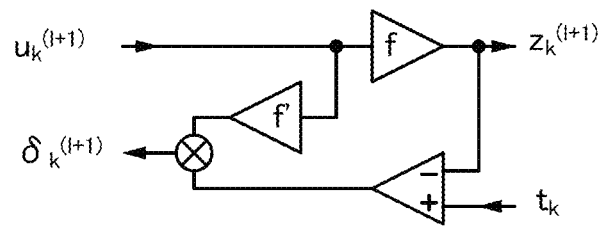

For example, the arithmetic processing of Formula b7 can be performed by using a circuit 274 illustrated in FIG. 15(D). The arithmetic processing of Formula b8 can be performed by using the circuit 273 illustrated in FIG. 15(C).

<Product-Sum Operation Circuit>

Figure 16:
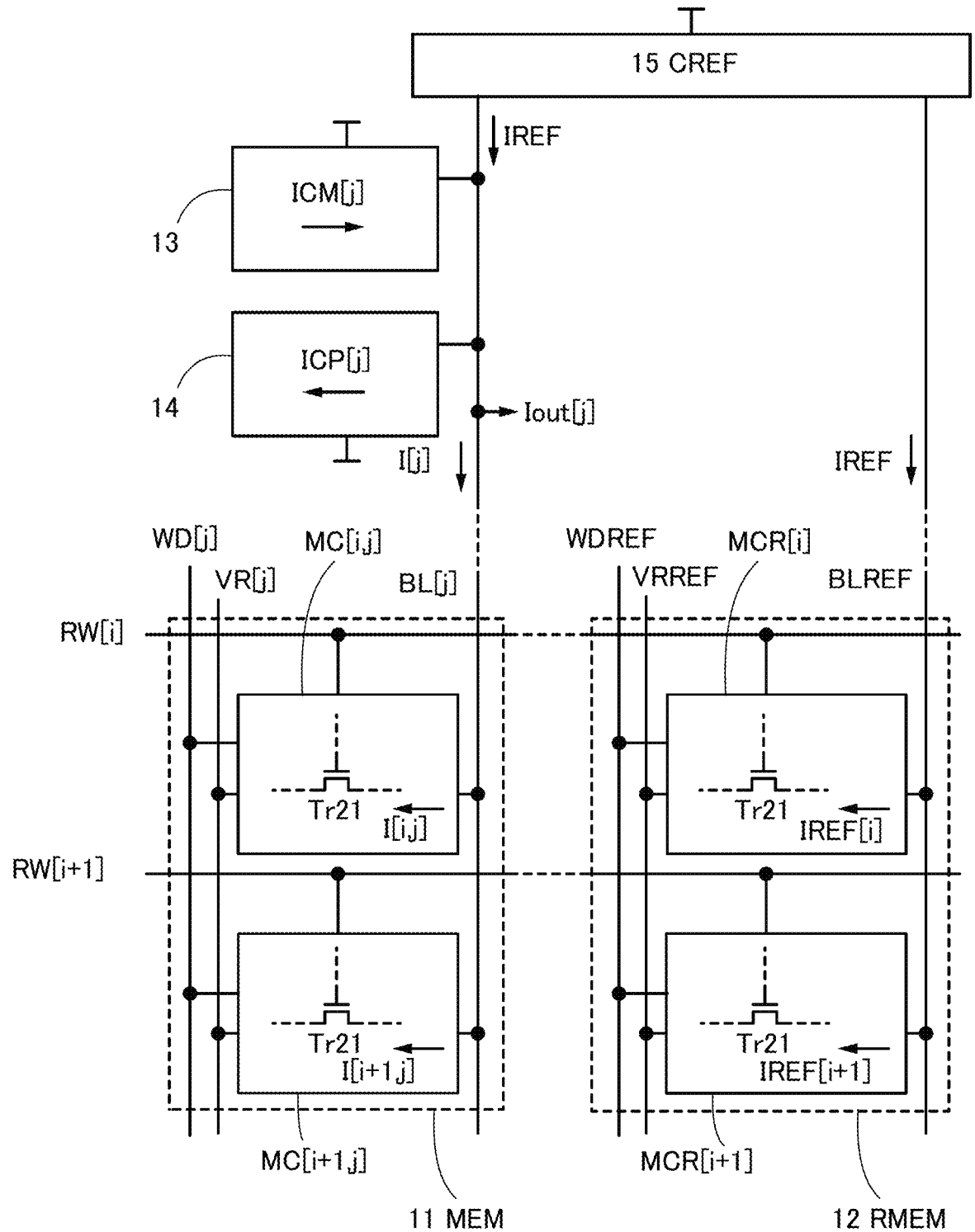
FIG. 16 is a diagram illustrating a configuration example of a product-sum operation circuit.

FIG. 16 illustrates an example of a product-sum operation circuit performing arithmetic processing represented by Formula b1 and Formula b3 and a product-sum operation circuit that is applicable to the product-sum operation circuit 80 exemplified in Embodiment 1 in the hierarchical neural network, which is illustrated as an example of a neural network capable of learning and inference.

The example of a product-sum operation circuit illustrated in FIG. 16 has a function of performing analog arithmetic processing using analog data. Having a function of performing analog arithmetic processing enables arithmetic processing without converting analog data into digital data, or with a frequency of converting analog data into digital data being reduced as much as possible. Therefore, the enormous amount of arithmetic processing can be reduced and the scale of an arithmetic circuit can be small. Furthermore, the time required for arithmetic processing can be shortened.

FIG. 16 illustrates a block diagram of a semiconductor device 107 as the example of the product-sum operation circuit. The semiconductor device 107 illustrated in FIG. 16 includes a memory circuit 11 (MEM), a reference memory circuit 12 (RMEM), a circuit 13, and a circuit 14. The semiconductor device 107 may further include a current source circuit 15 (CREF).

The memory circuit 11 (MEM) includes a memory cell MC such as a memory cell MC[i,j] and a memory cell MC[i+1,j]. The memory cell MC includes an element that has a function of converting an input potential into current. As the element having such a function, an active element such as a transistor can be used, for example. FIG. 16 illustrates an example where each memory cell MC includes a transistor Tr21.

A first analog potential is input to the memory cell MC through a wiring WD such as a wiring WD[j]. The first analog potential corresponds to first analog data. The memory cell MC has a function of generating a first analog current corresponding to the first analog potential. Specifically, a drain current of the transistor Tr21, which is obtained when the first analog potential is supplied to a gate of the transistor Tr21, can be used as the first analog current. Hereinafter, a current flowing in the memory cell MC[i,j] is denoted by I[i,j], and a current flowing in the memory cell MC[i+1,j] is denoted by I[i+1,j].

In the case where the transistor Tr21 operates in a saturation region, its drain current is not dependent on a voltage between a source and a drain and is controlled by the difference between its gate voltage and threshold voltage. Thus, the transistor Tr21 desirably operates in a saturation region. The gate voltage and the voltage between the source and the drain of the transistor Tr21 are each appropriately set to a voltage at which the transistor Tr21 operates in a saturation region.

Specifically, in the semiconductor device 107 illustrated in FIG. 16, a first analog potential Vx[i,j] is input to the memory cell MC[i,j] through the wiring WD[j]. The memory cell MC[i,j] has a function of generating a first analog current corresponding to the first analog potential Vx[i,j]. This means that the current I[i,j] flowing in the memory cell MC[i,j] corresponds to the first analog current, in this case.

Specifically, in the semiconductor device 107 illustrated in FIG. 16, a first analog potential Vx[i+1,j] is input to the memory cell MC[i+1,j] through the wiring WD[j]. The memory cell MC[i+1,j] has a function of generating a first analog current corresponding to the first analog potential Vx[i+1,j]. This means that the current I[i+1,j] flowing in the memory cell MC[i+1,j] corresponds to the first analog current, in this case.

The memory cell MC has a function of holding the first analog potential. In other words, the memory cell MC has a function of holding the first analog current corresponding to the first analog potential by holding the first analog potential.

Moreover, a second analog potential is input to the memory cell MC through a wiring RW such as a wiring RW[i] and a wiring RW[i+1]. The second analog potential corresponds to second analog data. The memory cell MC has a function of adding the second analog potential to the first analog potential that has been held and a function of holding a third analog potential obtained by the addition. The memory cell MC also has a function of generating a second analog current corresponding to the third analog potential. In other words, the memory cell MC has a function of holding the second analog current corresponding to the third analog potential by holding the third analog potential.

Specifically, in the semiconductor device 107 illustrated in FIG. 16, a second analog potential Vw[i,j] is input to the memory cell MC[i,j] through the wiring RW[i]. The memory cell MC[i,j] has a function of holding a third analog potential corresponding to the first analog potential Vx[i,j] and the second analog potential Vw[i,j]. The memory cell MC[i,j] also has a function of generating a second analog current corresponding to the third analog potential. This means that the current I[i,j] flowing in the memory cell MC[i,j] corresponds to the second analog current, in this case.

Furthermore, in the semiconductor device 107 illustrated in FIG. 16, a second analog potential Vw[i+1,j] is input to the memory cell MC[i+1,j] through the wiring RW[i+1]. The memory cell MC[i+1,j] has a function of holding a third analog potential corresponding to the first analog potential Vx[i+1,j] and the second analog potential Vw[i+1,j]. The memory cell MC[i+1,j] also has a function of generating a second analog current corresponding to the third analog potential. This means that the current I[i+1,j] flowing in the memory cell MC[i+1,j] corresponds to the second analog current, in this case.

The current I[i,j] flows between a wiring BL[j] and a wiring VR[j] through the memory cell MC[i,j]. The current I[i+1,j] flows between the wiring BL[j] and the wiring VR[j] through the memory cell MC[i+1,j]. Accordingly, a current I[j], which corresponds to the sum of the current I[i,j] and the current I[i+1,j], flows between the wiring BL[j] and the wiring VR[j] through the memory cell MC[i,j] and the memory cell MC[i+1,j].

The reference memory circuit 12 (RMEM) includes a memory cell MCR such as a memory cell MCR[i] and a memory cell MCR[i+1]. A first reference potential VPR is input to the memory cell MCR through a wiring WDREF. The memory cell MCR has a function of generating a first reference current corresponding to the first reference potential VPR. Hereinafter, a current flowing in the memory cell MCR[i] is denoted by IREF[i], and a current flowing in the memory cell MCR[i+1] is denoted by IREF[i+1].

Specifically, in the semiconductor device 107 illustrated in FIG. 16, the first reference potential VPR is input to the memory cell MCR[i] through the wiring WDREF. The memory cell MCR[i] has a function of generating the first reference current corresponding to the first reference potential VPR. This means that the current IREF[i] flowing in the memory cell MCR[i] corresponds to the first reference current, in this case.

Furthermore, in the semiconductor device 107 illustrated in FIG. 16, the first reference potential VPR is input to the memory cell MCR[i+1] through the wiring WDREF. The memory cell MCR[i+1] has a function of generating the first reference current corresponding to the first reference potential VPR. This means that the current IREF[i+1] flowing in the memory cell MCR[i+1] corresponds to the first reference current, in this case.

The memory cell MCR has a function of holding the first reference potential VPR. In other words, the memory cell MCR has a function of holding the first reference current corresponding to the first reference potential VPR by holding the first reference potential VPR.

Moreover, the second analog potential is input to the memory cell MCR through the wiring RW such as the wiring RW[i] and the wiring RW[i+1]. The memory cell MCR has a function of adding the second analog potential to the first reference potential VPR that has been held and holding a second reference potential obtained by the addition. The memory cell MCR also has a function of generating a second reference current corresponding to the second reference potential. In other words, the memory cell MCR has a function of holding the second reference current corresponding to the second reference potential by holding the second reference potential.

Specifically, in the semiconductor device 107 illustrated in FIG. 16, the second analog potential Vw[i,j] is input to the memory cell MCR[i] through the wiring RW[i]. The memory cell MCR[i] has a function of holding a second reference potential corresponding to the first reference potential VPR and the second analog potential Vw[i,j]. The memory cell MCR[i] also has a function of generating the second reference current corresponding to the second reference potential. This means that the current IREF[i] flowing in the memory cell MCR[i] corresponds to the second reference current, in this case.

Furthermore, in the semiconductor device 107 illustrated in FIG. 16, the second analog potential Vw[i+1,j] is input to the memory cell MCR[i+1] through the wiring RW[i+1]. The memory cell MCR[i+1] has a function of holding the first reference potential VPR and a second reference potential corresponding to the second analog potential Vw[i+1,j]. The memory cell MCR[i+1] also has a function of generating the second reference current corresponding to the second reference potential. This means that the current IREF[i+1] flowing in the memory cell MCR[i+1] corresponds to the second reference current, in this case.

The current IREF[i] flows between a wiring BLREF and a wiring VRREF through the memory cell MCR[i]. The current IREF[i+1] flows between the wiring BLREF and the wiring VRREF through the memory cell MCR[i+1]. Accordingly, a current IREF, which corresponds to the sum of the current IREF[i] and the current IREF[i+1], flows between the wiring BLREF and the wiring VRREF through the memory cell MCR[i] and the memory cell MCR[i+1].

The current source circuit 15 has a function of supplying current with the same value as the current IREF that flows through the wiring BLREF or supplying current corresponding to the current IREF to the wiring BL. In the case where the current I[j] that flows between the wiring BL[j] and the wiring VR[j] through the memory cell MC[i,j] and the memory cell MC[i+1,j] is different from the current IREF that flows between the wiring BLREF and the wiring VRREF through the memory cell MCR[i] and the memory cell MCR[i+1] and thus offset current is set as described later, current corresponding to the difference flows in the circuit 13 or the circuit 14. The circuit 13 functions as a current source circuit, and the circuit 14 functions as a current sink circuit.

Specifically, in the case where the current I[j] is higher than the current IREF, the circuit 13 has a function of generating a current ΔI[j] that corresponds to the difference between the current I[j] and the current IREF. The circuit 13 also has a function of supplying the generated current ΔI[j] to the wiring BL[i]. This means that the circuit 13 has a function of holding the current ΔI[j].

In the case where the current I[j] is lower than the current IREF, the circuit 14 has a function of generating the current ΔI[j] that corresponds the difference between the current I[j] and the current IREF. The circuit 14 also has a function of drawing the generated current ΔI[j] from the wiring BL[j]. This means that the circuit 14 has a function of holding the current ΔI[j].

Next, an operation example of the semiconductor device 107 illustrated in FIG. 16 will be described.

First, a potential corresponding to the first analog potential is stored in the memory cell MC[i,j]. Specifically, a potential VPR−Vx[i,j], which is obtained by subtracting the first analog potential Vx[i,j] from the first reference potential VPR, is input to the memory cell MC[i,j] through the wiring WD[j]. The memory cell MC[i,j] holds the potential VPR−Vx[i,j]. In addition, the memory cell MC[i,j] generates the current I[i,j] that corresponds to the potential VPR−Vx[i,j]. The first reference potential VPR is, for example, a high-level potential that is higher than a ground potential. Specifically, the first reference potential VPR is desirably higher than a ground potential and as high as or lower than a high-level potential VDD that is supplied to the current source circuit 15.

Furthermore, the first reference potential VPR is stored in the memory cell MCR[i]. Specifically, the potential VPR is input to the memory cell MCR[i] through the wiring WDREF. The memory cell MCR[i] holds the potential VPR. In addition, the memory cell MCR[i] generates the current IREF[i] that corresponds to the potential VPR.

Moreover, a potential corresponding to the first analog potential is stored in the memory cell MC[i+1,j]. Specifically, a potential VPR−Vx[i+1,j], which is obtained by subtracting the first analog potential Vx[i+1,j] from the first reference potential VPR, is input to the memory cell MC[i+1,j] through the wiring WD[j]. The memory cell MC[i+1,j] holds the potential VPR−Vx[i+1,j]. In addition, the memory cell MC[i+1,j] generates the current I[i+1,j] that corresponds to the potential VPR−Vx[i+1,j].

Furthermore, the first reference potential VPR is stored in the memory cell MCR[i+1]. Specifically, the potential VPR is input to the memory cell MCR[i+1] through the wiring WDREF. The memory cell MCR[i+1] holds the potential VPR. In addition, the memory cell MCR[i+1] generates the current IREF[i+1] that corresponds to the potential VPR.

During the above operation, the wiring RW[i] and the wiring RW[i+1] are each set to a base potential. As a base potential, for example, a ground potential or a low-level potential VSS that is lower than a ground potential can be used. Alternatively, a potential between the potential VSS and the potential VDD is preferably used as a base potential, in which case the potential of the wiring RW can be higher than a ground potential regardless of whether the second analog potential Vw is positive or negative, allowing easy generation of signals and multiplication of either positive or negative analog data.

As a result of the above operation, a current corresponding to the sum of currents generated in the memory cells MC electrically connected to the wiring BL[j] flows through the wiring BL[j]. Specifically, in FIG. 16, the current I[j], which is the sum of the current I[i,j] generated in the memory cell MC[i,j] and the current I[i+1,j] generated in the memory cell MC[i+1,j], flows. In addition, as a result of the above operation, a current corresponding to the sum of currents generated in the memory cells MCR electrically connected to the wiring BLREF flows through the wiring BLREF.

Specifically, in FIG. 16, the current IREF, which is the sum of the current IREF[i] generated in the memory cell MCR[i] and the current IREF[i+1] generated in the memory cell MCR[i+1], flows.

Next, an offset current Ioffset[j], which is obtained from the difference between the current I[j] obtained by inputting the first analog potential and the current IREF obtained by inputting the first reference potential, is held in the circuit 13 or the circuit 14 while the wiring RW[i] and the wiring RW[i+1] are kept at base potentials.

Specifically, in the case where the current I[j] is higher than the current IREF, the circuit 13 supplies the current Ioffset[j] to the wiring BL[j]. This means that a current ICM[j] that flows in the circuit 13 corresponds to the current Ioffset[j]. The value of the current ICM[j] is held in the circuit 13. In the case where the current I[j] is lower than the current IREF, the circuit 14 draws the current Ioffset[i] from the wiring BL[j]. This means that a current ICP[j] that flows in the circuit 14 corresponds to the current Ioffset[j]. The value of the current ICP[j] is held in the circuit 14.

Then, the second analog potential is stored in the memory cell MC[i,j] so as to be added to the first analog potential that has been held in the memory cell MC[i,j]. Specifically, when the potential of the wiring RW[i] is set to a potential that is higher than a base potential by Vw[i], a second analog potential Vw[i] is input to the memory cell MC[i,j] through the wiring RW[i]. The memory cell MC[i,j] holds a potential VPR−Vx[i,j]+Vw[i]. Furthermore, the memory cell MC[i,j] generates the current I[i,j] corresponding to the potential VPR−Vx[i,j]+Vw[i].

In addition, the second analog potential is stored in the memory cell MC[i+1,j] so as to be added to the first analog potential that has been held in the memory cell MC[i+1,j]. Specifically, when the potential of the wiring RW[i+1] is set to a potential that is higher than a base potential by Vw[i+1], a second analog potential Vw[i+1] is input to the memory cell MC[i+1,j] through the wiring RW[i+1]. The memory cell MC[i+1,j] holds a potential VPR−Vx[i+1,j]+Vw[i+1]. Furthermore, the memory cell MC[i+1,j] generates the current I[i+1,j] corresponding to the potential VPR−Vx[i+1,j]+Vw[i+1].

In the case where the transistor Tr21 that operates in a saturation region is used as an element for converting a potential into current, the drain current of the transistor Tr21 included in the memory cell MC[i,j] corresponds to the current I[i,j] when the potential of the wiring RW[i] is assumed to be Vw[i] and the potential of the wiring RW[i+1] is assumed to be Vw[i+1]; thus, the second analog current is expressed by the following Formula b9. Note that k is a coefficient and Vth is the threshold voltage of the transistor Tr21.

$$I[i,j]=k(Vw[i]-Vth+VPR-Vx[i,j])^2 \qquad (b9)$$

Furthermore, since the drain current of the transistor Tr21 included in the memory cell MCR[i] corresponds to the current IREF[i], the second reference current is expressed by the following Formula b10.

$$IREF[i]=k(Vw[i]-Vth+VPR)^2 \qquad (b10)$$

The current I[j], which corresponds to the sum of the current I[i,j] flowing in the memory cell MC[i,j] and the current I[i+1,j] flowing in the memory cell MC[i+1,j], can be expressed as $\Sigma_i I[i,j]$. The current IREF, which corresponds to the sum of the current IREF[i] flowing in the memory cell MCR[i] and the current IREF[i+1] flowing in the memory cell MCR[i+1], can be expressed as $\Sigma_i IREF[i]$; accordingly, the current ΔI[j] that corresponds to the difference between the current I[j] and the current IREF is expressed by the following Formula b11.

$$\Delta I[j]=IREF-I[j]=\Sigma_i IREF[i]-\Sigma_i I[i,j] \qquad (b11)$$

From Formulae b9, b10, and b11, the current ΔI[j] can be expressed by the following Formula b12.

$$\Delta I[j]= \qquad (b12)$$
$$\Sigma_i \{k(Vw[i]-Vth+VPR)^2-k(Vw[i]-Vth+VPR-Vx[i,j])^2\}=$$
$$2k\Sigma_i(Vw[i]\cdot Vx[i,j])-2k\Sigma_i(Vth-VPR)\cdot Vx[i,j]-k\Sigma_i Vx[i,j]^2$$

The term $2k\Sigma_i(Vw[i]\cdot Vx[i,j])$ in Formula b12 corresponds to the sum of the product of the first analog potential Vx[i,j] and the second analog potential Vw[i] and the product of the first analog potential Vx[i+1,j] and the second analog potential Vw[i+1].

Given that the current Ioffset[j] is defined as the current ΔI[j] at the time when all the potentials of the wirings RW are set to the base potential, that is, when the second analog potential Vw[i] and the second analog potential Vw[i+1] are both 0, the following Formula b13 is obtained from Formula b12.

$$Ioffset[j]=-2k\Sigma_i(Vth-VPR)\cdot Vx[i,j]-k\Sigma_i Vx[i,j]^2 \qquad (b13)$$

According to Formulae b11 to b13, $2k\Sigma i(Vw[i]\cdot Vx[i,j])$ that corresponds to the product-sum of the first analog data and the second analog data is expressed by the following Formula b14.

$$2k\Sigma_i(Vw[i]\cdot Vx[i,j])=IREF-I[j]-Ioffset[j] \qquad (b14)$$

When the potential of the wiring RW[i] is Vw[i] and the potential of the wiring RW[i+1] is Vw[i+1], a current Iout[j] that flows from the wiring BL[j] is expressed by IREF−I[j]−Ioffset[j], where I[j] is the sum of currents flowing in the memory cells MC, IREF is the sum of currents flowing in the memory cells MCR, and Ioffset[j] is a current flowing in the circuit 13 or the circuit 14. According to Formula b14, the current Iout[j] equals $2k\Sigma i(Vw[i]\cdot Vx[i,j])$, which corresponds to the sum of the product of the first analog potential Vx[i,j] and the second analog potential Vw[i] and the product of the first analog potential Vx[i+1,j] and the second analog potential Vw[i+1].

The transistor Tr21 preferably operates in a saturation region; however, even if the operation region of the transistor Tr21 deviates from an ideal saturation region, the transistor Tr21 is regarded as operating in a saturation region as long as there is no problem in obtaining a current that corresponds to the sum of the product of the first analog potential Vx[i,j] and the second analog potential Vw[i] and the product of the first analog potential Vx[i+1,j] and the second analog potential Vw[i+1] with an accuracy within a desired range.

For example, weight coefficients $w_{n1}^{(l)}$ to $w_{nM}^{(l)}$ of the neurons in the l-th layer are stored into memory cells MC[1,j] to [M,j] in the j-th column as first analog data, and an output $z_1^{(l-1)}$ to an output $z_M^{(l-1)}$ of the neurons in the (l−1)th layer are input to the memory cell MC[1,j] to the memory cell MC[M,j] as second analog data through wiring RW[1] to the wiring RW[M]. By the above-described operation, the sum (net value) $u_n^{(l)}$ of the input to the n-th neuron in the l-th layer can be obtained from the current ΔIout[j]. Thus, Formula b1 can be calculated by using the semiconductor device 107.

For example, weight coefficients $w_{n1}^{(l+1)}$ to $w_{nM}^{(l+1)}$ of the neurons in the (l+1)th layer are stored into the memory cells MC[1,j] to [M,j] in the j-th column as first analog data, and an output $z_1^l$ to an output $z_M^l$ of the neurons in the l-th layer are input to the memory cell MC[1,j] to the memory cell MC[M,j] as second analog data through the wiring RW[1] to the wiring RW[M]. By the above-described operation, the sum (net value) $u_k^{(l+l)}$ of the input to the k-th neuron in the (l+1)th layer can be obtained from the current ΔIout[j]. Thus, Formula b3 can be calculated by using the semiconductor device 107.

For example, weight coefficients $w_{n1}^{(l+1)}$ to $w_{nK}^{(l+1)}$ of the neurons in the (l+1)th layer are stored into the memory cells MC[1,j] to [K,j] in the j-th column as first analog data, and errors $\delta_1^{(l+1)}$ to $\delta_K^{(l+1)}$ of the neurons in the (l+1)th layer are input to the memory cells MC[1,j] to MC[K,j] as second analog data through the wiring RW[1] to the wiring RW[K]. By the above-described operation, the value of $\Sigma_k^{(l+1)} \cdot w_{kn}^{(l+1)}$ in Formula b5 can be obtained from the current ΔIout[j]. Thus, part of Formula b5 can be calculated by using the semiconductor device 107.

According to one embodiment of the present invention, arithmetic processing of analog data can be performed without converting the analog data into digital data, and thus the circuit scale of an arithmetic circuit can be small. Alternatively, according to one embodiment of the present invention, arithmetic processing of analog data can be performed without converting the analog data into digital data, and thus the time required for the arithmetic processing of analog data can be shortened. Alternatively, according to one embodiment of the present invention, power consumption of an arithmetic circuit can be reduced while the time required for arithmetic processing of analog data is shortened.

Next, a specific configuration example of the memory circuit 11 (MEM) and the reference memory circuit 12 (RMEM) will be described with reference to FIG. 17.

Figure 17:
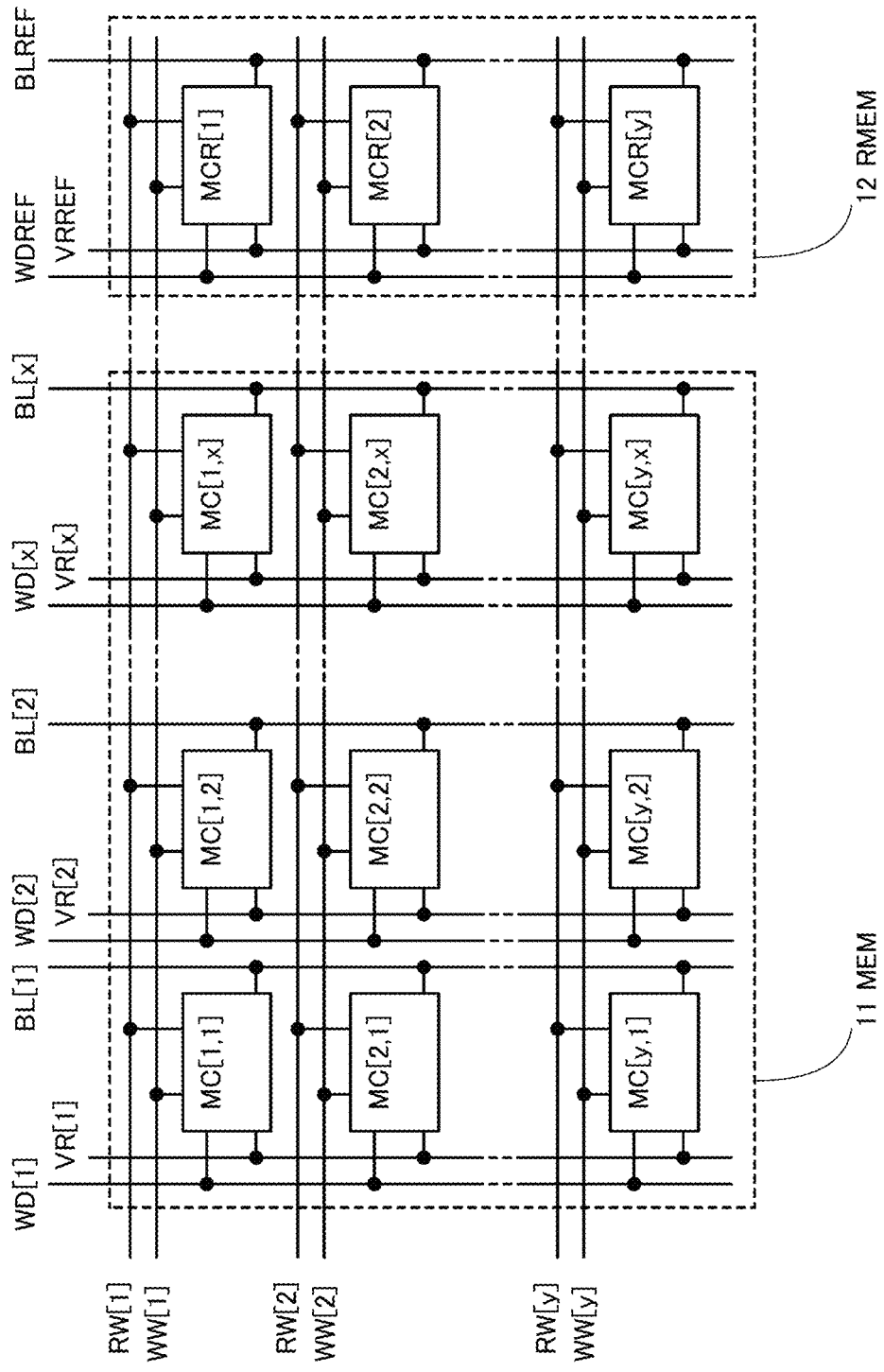
FIG. 17 is a diagram illustrating a configuration of a memory circuit and a reference memory circuit.

FIG. 17 illustrates an example where the memory circuit 11 (MEM) includes the memory cells MC in y rows and x columns (x and y are natural numbers) and the reference memory circuit 12 (RMEM) includes the memory cells MCR in y rows and one column.

The memory circuit 11 is electrically connected to the wiring RW, a wiring WW, the wiring WD, the wiring VR, and the wiring BL. In the example illustrated in FIG. 17, a wiring RW[1] to a wiring RW[y] are electrically connected to the memory cells MC in the respective rows, a wiring WW[1] to a wiring WW[y] are electrically connected to the memory cells MC in the respective rows, a wiring WD[1] to a wiring WD[x] are electrically connected to the memory cells MC in the respective columns, and a wiring BL[1] to a wiring BL[x] are electrically connected to the memory cells MC in the respective columns. Moreover, in the example illustrated in FIG. 17, a wiring VR[1] to a wiring VR[x] are electrically connected to the memory cells MC in the respective columns. Note that the wiring VR[1] to the wiring VR[x] may be electrically connected to each other.

The reference memory circuit 12 is electrically connected to the wiring RW, the wiring WW, the wiring WDREF, the wiring VRREF, and the wiring BLREF. In the example illustrated in FIG. 17, the wiring RW[1] to the wiring RW[y] are electrically connected to the memory cells MCR in the respective rows, the wiring WW[1] to the wiring WW[y] are electrically connected to the memory cells MCR in the respective rows, the wiring WDREF is electrically connected to the memory cells MCR in the one column, the wiring BLREF is electrically connected to the memory cells MCR in the one column, and the wiring VRREF is electrically connected to the memory cells MCR in the one column. Note that the wiring VRREF may be electrically connected to the wiring VR[1] to the wiring VR[x].

Figure 18:
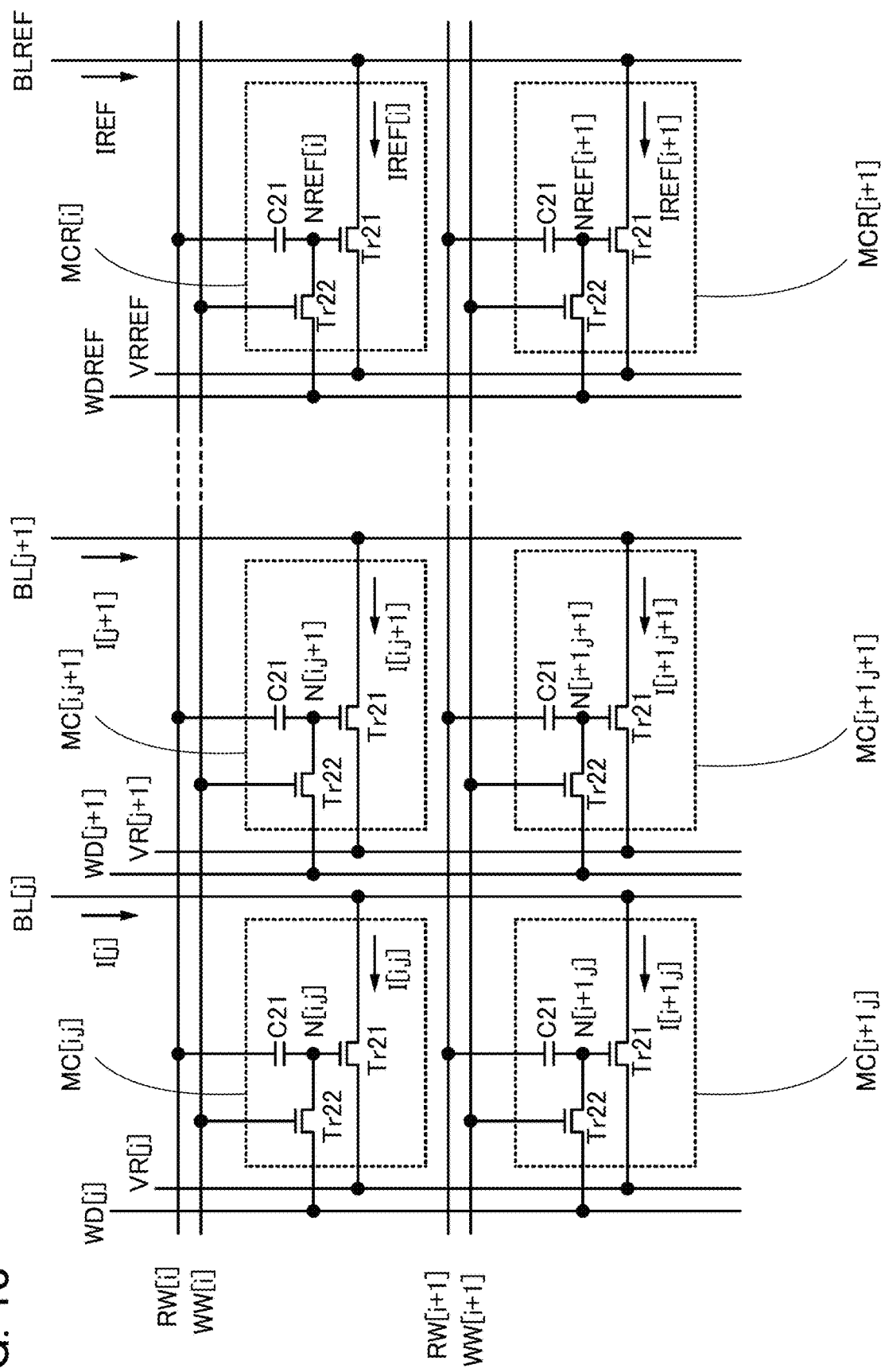
FIG. 18 is a diagram illustrating a circuit configuration and connection relation of memory cells.

FIG. 18 illustrates, as an example, a specific circuit configuration and connection relationship of the memory cells MC in any two rows and two columns among the memory cells MC illustrated in FIG. 17 and the memory cells MCR in any two rows and one column among the memory cells MCR illustrated in FIG. 17.

Specifically, FIG. 18 illustrates the memory cell MC[i,j] in the i-th row and the j-th column, the memory cell MC[i+1,j] in the (i+1)th row and the j-th column, a memory cell MC[i,j+1] in the i-th row and the (j+1)th column, and a memory cell MC[i+1,j+1] in the (i+1)th row and the (j+1)th column. Specifically, FIG. 18 also illustrates the memory cell MCR[i] in the i-th row and the memory cell MCR[i+1] in the (i+1)th row. Note that i is any number from 1 to y−1, and j is any number from 1 to x−1.

The memory cell MC[i,j], the memory cell MC[i,j+1], and the memory cell MCR[i] in the i-th row are electrically connected to the wiring RW[i] and a wiring WW[i]. The memory cell MC[i+1,j], the memory cell MC[i+1,j+1], and the memory cell MCR[i+1] in the (i+1)th row are electrically connected to the wiring RW[i+1] and a wiring WW[i+1].

The memory cell MC[i,j] and the memory cell MC[i+1,j] in the j-th column are electrically connected to the wiring WD[j], the wiring VR[j], and the wiring BL[j]. The memory cell MC[i,j+1] and the memory cell MC[i+1,j+1] in the (j+1)th column are electrically connected to a wiring WD[j+1], a wiring VR[j+1], and a wiring BL[j+1]. The memory cell MCR[i] and the memory cell MCR[i+1] in the (i+1)th row are electrically connected to the wiring WDREF, the wiring VRREF, and the wiring BLREF.

The memory cells MC and the memory cells MCR each include the transistor Tr21, a transistor Tr22, and a capacitor C21. The transistor Tr22 has a function of controlling the input of the first analog potential to the memory cell MC or the memory cell MCR. The transistor Tr21 has a function of generating an analog current in accordance with a potential input to its gate. The capacitor C21 has a function of adding the second analog potential to the first analog potential held in the memory cell MC or the memory cell MCR.

Specifically, in the memory cell MC illustrated in FIG. 18, a gate of the transistor Tr22 is electrically connected to the wiring WW, one of a source and a drain of the transistor Tr22 is electrically connected to the wiring WD, and the other of the source and the drain of the transistor Tr22 is electrically connected to the gate of the transistor Tr21. Furthermore, one of a source and a drain of the transistor Tr21 is electrically connected to the wiring VR, and the other of the source and the drain of the transistor Tr21 is electrically connected to the wiring BL. A first electrode of the capacitor C21 is electrically connected to the wiring RW, and a second electrode of the capacitor C21 is electrically connected to the gate of the transistor Tr21.

In addition, in the memory cell MCR illustrated in FIG. 18, a gate of the transistor Tr22 is electrically connected to the wiring WW, one of a source and a drain of the transistor Tr22 is electrically connected to the wiring WDREF, and the other of the source and the drain of the transistor Tr22 is electrically connected to the gate of the transistor Tr21. Furthermore, one of a source and a drain of the transistor Tr21 is electrically connected to the wiring VRREF, and the other of the source and the drain of the transistor Tr21 is electrically connected to the wiring BLREF. A first electrode of the capacitor C21 is electrically connected to the wiring RW, and a second electrode of the capacitor C21 is electrically connected to the gate of the transistor Tr21.

When the gate of the transistor Tr21 in the memory cell MC is referred to as a node N, in the memory cell MC, the first analog potential is input to the node N through the transistor Tr22, and then, when the transistor Tr22 is turned off, the node N is brought into a floating state and the first analog potential is held at the node N. In the memory cell MC, when the node N is brought into a floating state, the second analog potential that is input to the first electrode of the capacitor C21 is supplied to the node N. As a result of the above operation, the node N has a potential obtained by adding the second analog potential to the first analog potential.

Since the potential of the first electrode of the capacitor C21 is supplied to the node N through the capacitor C21, the amount of change in the potential of the node N is not exactly the same as the amount of change in the potential of the first electrode, actually. Specifically, the accurate amount of change in the potential of the node N can be calculated in the following manner: a coupling coefficient that is uniquely determined by the capacitance of the capacitor C21, the gate capacitance of the transistor Tr21, and a parasitic capacitance is multiplied by the amount of change in the potential of the first electrode. In the following description, the amount of change in the potential of the first electrode is assumed to be substantially the same as the amount of change in the potential of the node N, for easy understanding.

The drain current of the transistor Tr21 is determined in accordance with the potential of the node N. Thus, when the transistor Tr22 is turned off and thus the potential of the node N is held, the value of the drain current of the transistor Tr21 is also held. The drain current is affected by the first analog potential and the second analog potential.

When the gate of the transistor Tr21 in the memory cell MCR is referred to as a node NREF, in the memory cell MCR, the first reference potential is input to the node NREF through the transistor Tr22, and then, when the transistor Tr22 is turned off, the node NREF is brought into a floating state and the first reference potential is held at the node NREF. In the memory cell MCR, when the node NREF is brought into a floating state, the second analog potential that is input to the first electrode of the capacitor C21 is supplied to the node NREF. As a result of the above operation, the node NREF has a potential obtained by adding the second analog potential to the first reference potential.

The drain current of the transistor Tr21 is determined in accordance with the potential of the node NREF. Thus, when the transistor Tr22 is turned off and thus the potential of the node NREF is held, the value of the drain current of the transistor Tr21 is also held. The drain current is affected by the first reference potential and the second analog potential.

When the drain current flowing in the transistor Tr21 in the memory cell MC[i,j] is the current I[i,j] and the drain current flowing in the transistor Tr21 in the memory cell MC[i+1,j] is the current I[i+1,j], the sum of currents supplied to the memory cell MC[i,j] and the memory cell MC[i+1,j] through the wiring BL[j] is the current I[j]. When the drain current flowing in the transistor Tr21 in the memory cell MC[i,j+1] is a current I[i,j+1] and the drain current flowing in the transistor Tr21 in the memory cell MC[i+1,j+1] is a current I[i+1,j+1], the sum of currents supplied to the memory cell MC[i,j+1] and the memory cell MC[i+1,j+1] through the wiring BL[j+1] is a current I[j+1]. When the drain current flowing in the transistor Tr21 in the memory cell MCR[i] is the current IREF[i] and the drain current flowing in the transistor Tr21 in the memory cell MCR[i+1] is the current IREF[i+1], the sum of currents supplied to the memory cell MCR[i] and the memory cell MCR[i+1] through the wiring BLREF is the current IREF.

Then, a specific configuration example of the circuit 13, the circuit 14, and the current source circuit 15 (CREF) will be described with reference to FIG. 19.

Figure 19:
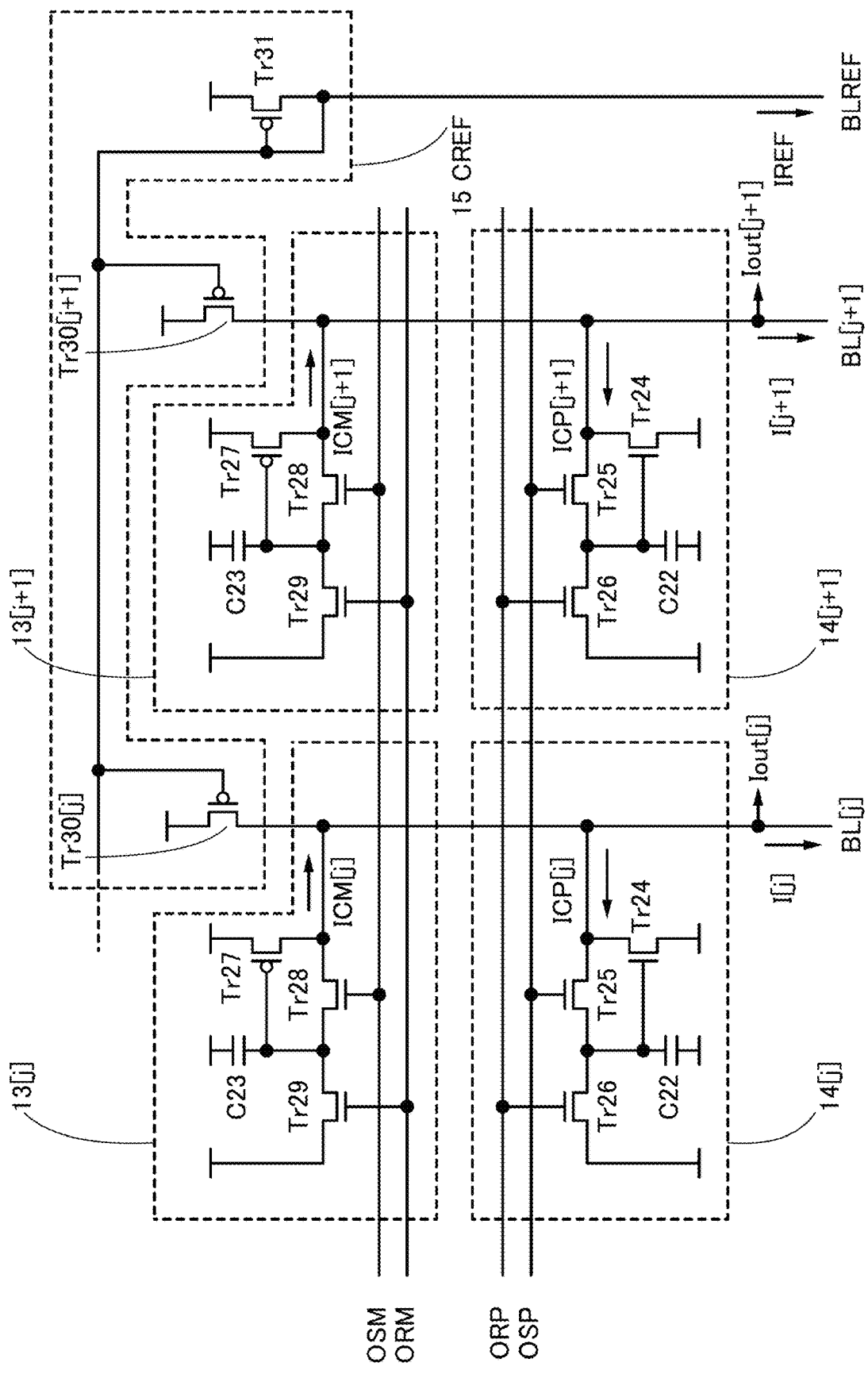
FIG. 19 A diagram illustrating a configuration of a circuit 13, a circuit 14, and a current source circuit.

FIG. 19 illustrates a configuration example of the circuit 13, the circuit 14, and the current source circuit 15 for the memory cell MC and the memory cell MCR illustrated in FIG. 18. Specifically, the circuit 13 illustrated in FIG. 19 includes a circuit 13[j] for the memory cells MC in the j-th column and a circuit 13[j+1] for the memory cells MC in the (j+1)th column. The circuit 14 illustrated in FIG. 19 includes a circuit 14[j] for the memory cells MC in the j-th column and a circuit 14[j+1] for the memory cells MC in the (j+1)th column.

The circuit 13[j] and the circuit 14[j] are electrically connected to the wiring BL[j]. The circuit 13[j+1] and the circuit 14[j+1] are electrically connected to the wiring BL[j+1].

The current source circuit 15 is electrically connected to the wiring BL[j], the wiring BL[j+1], and the wiring BLREF. The current source circuit 15 has a function of supplying the current IREF to the wiring BLREF, and a function of supplying a current that is the same as the current IREF or a current that corresponds to the current IREF to each of the wiring BL[j] and the wiring BL[j+1].

Specifically, the circuit 13[j] and the circuit 13[j+1] each include transistors Tr27 to Tr29 and a capacitor C23. The transistor Tr27 in the circuit 13[j] has a function of generating the current ICM[j] that corresponds to the difference between the current I[j] and the current IREF, when the current I[j] is higher than the current IREF and offset current is set. Furthermore, the transistor Tr27 in the circuit 13[j+1] has a function of generating a current ICM[j+1] that corresponds to the difference between the current I[j+1] and the current IREF, when the current I[j+1] is higher than the current IREF. The current ICM[j] and the current ICM[j+1] are supplied from the circuit 13[j] and the circuit 13[j+1] to the wiring BL[j] and the wiring BL[j+1], respectively.

In each of the circuit 13[j] and the circuit 13[j+1], one of a source and a drain of the transistor Tr27 is electrically connected to the corresponding wiring BL, and the other of the source and the drain is electrically connected to a wiring through which a predetermined potential is supplied. One of a source and a drain of the transistor Tr28 is electrically connected to the wiring BL, and the other of the source and the drain is electrically connected to a gate of the transistor Tr27. One of a source and a drain of the transistor Tr29 is electrically connected to the gate of the transistor Tr27, and the other of the source and the drain is electrically connected to a wiring through which a predetermined potential is supplied. A first electrode of the capacitor C23 is electrically connected to the gate of the transistor Tr27, and a second electrode of the capacitor C23 is electrically connected to a wiring through which a predetermined potential is supplied.

A gate of the transistor Tr28 is electrically connected to a wiring OSM, and a gate of the transistor Tr29 is electrically connected to a wiring ORM.

Note that FIG. 19 illustrates an example where the transistor Tr27 is a p-channel transistor and the transistors Tr28 and Tr29 are n-channel transistors.

The circuit 14[j] and the circuit 14[j+1] each include transistors Tr24 to Tr26 and a capacitor C22. The transistor Tr24 in the circuit 14[j] has a function of generating the current ICP[j] that corresponds to the difference between the current I[j] and the current IREF, when the current I[j] is lower than the current IREF and offset current is set. Furthermore, the transistor Tr24 in the circuit 14[j+1] has a function of generating a current ICP[j+1] that corresponds to the difference between the current I[j+1] and the current IREF, when the current I[j+1] is lower than the current IREF. The current ICP[j] and the current ICP[j+1] are drawn from the wiring BL[j] and the wiring BL[j+1] into the circuit 14[j] and the circuit 14[j+1], respectively.

Note that the current ICM[j] and the current ICP[j] each correspond to the current Ioffset[j], and the current ICM[j+1] and the current ICP[j+1] each correspond to a current Ioffset[j+1].

In each of the circuit 14[j] and the circuit 14[j+1], one of a source and a drain of the transistor Tr24 is electrically connected to the corresponding wiring BL, and the other of the source and the drain is electrically connected to a wiring through which a predetermined potential is supplied. One of a source and a drain of the transistor Tr25 is electrically connected to the wiring BL, and the other of the source and the drain is electrically connected to a gate of the transistor Tr24. One of a source and a drain of the transistor Tr26 is electrically connected to the gate of the transistor Tr24, and the other of the source and the drain is electrically connected to a wiring through which a predetermined potential is supplied. A first electrode of the capacitor C22 is electrically connected to the gate of the transistor Tr24, and a second electrode of the capacitor C22 is electrically connected to a wiring through which a predetermined potential is supplied.

A gate of the transistor Tr25 is electrically connected to a wiring OSP, and a gate of the transistor Tr26 is electrically connected to a wiring ORP.

Note that FIG. 19 illustrates an example where the transistors Tr24 to Tr26 are n-channel transistors.

The current source circuit 15 includes a transistor Tr30 for the wiring BL and a transistor Tr31 for the wiring BLREF. Specifically, in the example illustrated in FIG. 19, the current source circuit 15 includes, as the transistor Tr30, a transistor Tr30[j] for the wiring BL[j] and a transistor Tr30[j+1] for the wiring BL[j+1].

A gate of the transistor Tr30 is electrically connected to a gate of the transistor Tr31. One of a source and a drain of the transistor Tr30 is electrically connected to the corresponding wiring BL, and the other of the source and the drain is electrically connected to a wiring through which a predetermined potential is supplied. One of a source and a drain of the transistor Tr31 is electrically connected to the wiring BLREF, and the other of the source and the drain is electrically connected to a wiring through which a predetermined potential is supplied.

The transistor Tr30 and the transistor Tr31 have the same polarity. FIG. 19 illustrates an example where both the transistor Tr30 and the transistor Tr31 are p-channel transistors.

The drain current of the transistor Tr31 corresponds to the current IREF. The transistor Tr30 and the transistor Tr31 collectively function as a current mirror circuit; thus, the drain current of the transistor Tr30 is substantially the same as the drain current of the transistor Tr31 or corresponds to the drain current of the transistor Tr31.

A switch may be provided between the circuit 13[j] and the circuit 14[j] illustrated in FIG. 19. Alternatively, a switch may be provided between the circuit 13[j+1] and the circuit 14[j+1]. Alternatively, a switch may be provided between the reference memory circuit 12 and the transistor Tr31 included in the current source circuit 15.

Next, a specific operation example of the semiconductor device 107 of one embodiment of the present invention will be described with reference to FIG. 18 and FIG. 19.

Figure 20:
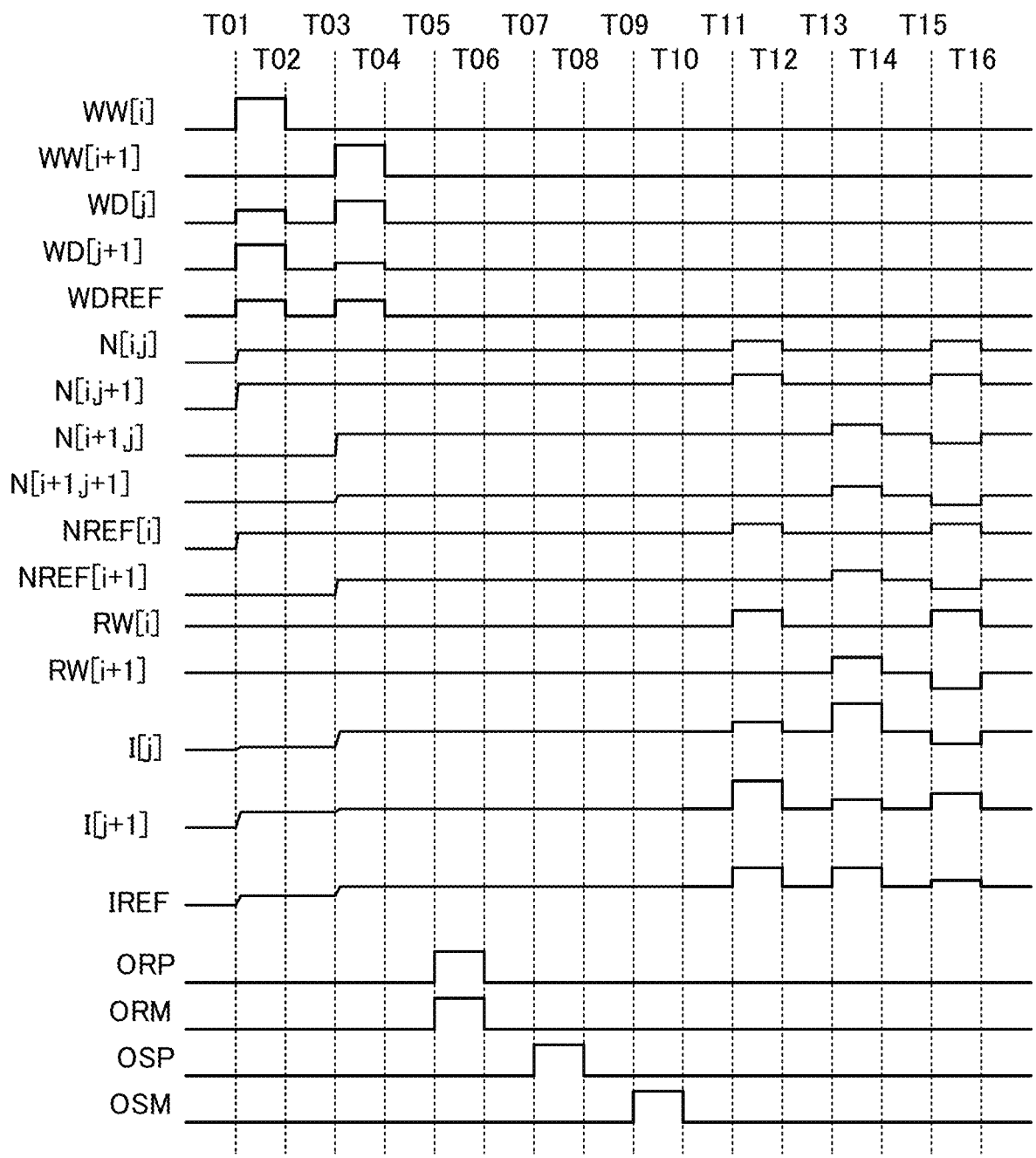
FIG. 20 A timing chart.

FIG. 20 corresponds to an example of a timing chart showing the operations of the memory cell MC and the memory cell MCR illustrated in FIG. 18 and the circuit 13, the circuit 14, and the current source circuit 15 illustrated in FIG. 19. From Time T01 to Time T04 in FIG. 20, the first analog data is stored in the memory cell MC and the memory cell MCR. From Time T05 to Time T10, the offset current Ioffset is set to the circuit 13 and the circuit 14. From Time T11 to Time T16, data corresponding to the product-sum of the first analog data and the second analog data is acquired.

Note that a low-level potential is supplied to the wiring VR[j] and the wiring VR[j+1]. The high-level potential VDD is supplied to all wirings having a predetermined potential that are electrically connected to the circuit 13. The low-level potential VSS is supplied to all wirings having a predetermined potential that are electrically connected to the circuit 14. Furthermore, the high-level potential VDD is supplied to all wirings having a predetermined potential that are electrically connected to the current source circuit 15.

The transistors Tr21, Tr24, Tr27, Tr30[j], Tr30[j+1], and Tr31 each operate in a saturation region.

First, a high-level potential is supplied to the wiring WW[i] and a low-level potential is supplied to the wiring WW[i+1] from Time T01 to Time T02. Accordingly, the transistors Tr22 in the memory cell MC[i,j], the memory cell MC[i,j+1], and the memory cell MCR[i] illustrated in FIG. 18 are turned on. The transistors Tr22 in the memory cell MC[i+1,j], the memory cell MC[i+1,j+1], and the memory cell MCR[i+1] remain off.

In addition, from Time T01 to Time T02, a potential obtained by subtracting the first analog potential from the first reference potential VPR is supplied to each of the wiring WD[j] and the wiring WD[j+1] illustrated in FIG. 18. Specifically, the potential VPR−Vx[i,j] is supplied to the wiring WD[j], and the potential VPR−Vx[i,j+1] is supplied to the wiring WD[j+1]. The first reference potential VPR is supplied to the wiring WDREF, and a potential between the potential VSS and the potential VDD, e.g., a potential (VDD+VSS)/2, is supplied as a base potential to the wiring RW[i] and the wiring RW[i+1].

Accordingly, the potential VPR−Vx[i,j] is supplied to a node N[i,j] through the transistor Tr22 in the memory cell MC[i,j] illustrated in FIG. 18, the potential VPR−Vx[i,j+1] is supplied to a node N[i,j+1] through the transistor Tr22 in the memory cell MC[i,j+1], and the potential VPR is supplied to a node NREF[i] through the transistor Tr22 in the memory cell MCR[i].

After Time T02, the potential supplied to the wiring WW[i] illustrated in FIG. 18 changes from a high-level potential to a low-level potential, so that the transistors Tr22 in the memory cell MC[i,j], the memory cell MC[i,j+1], and the memory cell MCR[i] are turned off. Accordingly, the potential VPR−Vx[i,j] is held at the node N[i,j], the potential VPR−Vx[i,j+1] is held at the node N[i,j+1], and the potential VPR is held at the node NREF[i].

Then, from Time T03 to Time T04, the potential of the wiring WW[i] illustrated in FIG. 18 remains at a low level and a high-level potential is supplied to the wiring WW[i+1]. Accordingly, the transistors Tr22 in the memory cell MC[i+1,j], the memory cell MC[i+1,j+1], and the memory cell MCR[i+1] illustrated in FIG. 18 are turned on. The transistors Tr22 in the memory cell MC[i,j], the memory cell MC[i,j+1], and the memory cell MCR[i] remain off.

Furthermore, from Time T03 to Time T04, a potential obtained by subtracting the first analog potential from the first reference potential VPR is supplied to each of the wiring WD[j] and the wiring WD[j+1] illustrated in FIG. 18. Specifically, the potential VPR−Vx[i+1,j] is supplied to the wiring WD[j], and a potential VPR−Vx[i+1,j+1] is supplied to the wiring WD[j+1]. The first reference potential VPR is supplied to the wiring WDREF, and a potential between the potential VSS and the potential VDD, e.g., a potential (VDD+VSS)/2, is supplied as a base potential to the wiring RW[i] and the wiring RW[i+1].

Accordingly, the potential VPR−Vx[i+1,j] is supplied to a node N[i+1,j] through the transistor Tr22 in the memory cell MC[i+1,j] illustrated in FIG. 18, the potential VPR−Vx[i+1,j+1] is supplied to a node N[i+1,j+1] through the transistor Tr22 in the memory cell MC[i+1,j+1], and the potential VPR is supplied to a node NREF[i+1] through the transistor Tr22 in the memory cell MCR[i+1].

After Time T04, the potential supplied to the wiring WW[i+1] illustrated in FIG. 18 changes from a high-level potential to a low-level potential, so that the transistors Tr22 in the memory cell MC[i+1,j], the memory cell MC[i+1,j+1], and the memory cell MCR[i+1] are turned off. Accordingly, the potential VPR−Vx[i+1,j] is held at the node N[i+1,j], the potential VPR−Vx[i+1,j+1] is held at the node N[i+1,j+1], and the potential VPR is held at the node NREF[i+1].

Next, a high-level potential is supplied to the wiring ORP and the wiring ORM illustrated in FIG. 19 from Time T05 to Time T06. When a high-level potential is supplied to the wiring ORM, the transistors Tr29 in the circuit 13[*j*] and the circuit 13[*j*+1] illustrated in FIG. 19 are turned on, so that the gates of the transistors Tr27 are reset by being supplied with the potential VDD. Furthermore, when a high-level potential is supplied to the wiring ORP, the transistors Tr26 in the circuit 14[*j*] and the circuit 14[*j*+1] illustrated in FIG. 19 are turned on, so that the gates of the transistors Tr24 are reset by being supplied with the potential VSS.

After Time T06, the potential supplied to the wiring ORP and the wiring ORM illustrated in FIG. 19 changes from a high-level potential to a low-level potential, so that the transistors Tr29 in the circuit 13[*j*] and the circuit 13[*j*+1] and the transistors Tr26 in the circuit 14[*j*] and the circuit 14[*j*+1] are turned off. Accordingly, the potential VDD is held at the gate of the transistor Tr27 in each of the circuit 13[*j*] and the circuit 13[*j*+1], and the potential VSS is held at the gate of the transistor Tr24 in each of the circuit 14[*j*] and the circuit 14[*j*+1].

From Time T07 to Time T08, a high-level potential is supplied to the wiring OSP illustrated in FIG. 19. Furthermore, a potential between the potential VSS and the potential VDD, e.g., the potential (VDD+VSS)/2, is supplied as the base potential to each of the wiring RW[i] and the wiring RW[i+1] illustrated in FIG. 18. Since a high-level potential is supplied to the wiring OSP, the transistors Tr25 in the circuit 14[*j*] and the circuit 14[*j*+1] are turned on.

The case where the current I[j] flowing through the wiring BL[j] is lower than the current IREF flowing through the wiring BLREF, i.e., the case where the current ΔI[i] has a positive value, means that the sum of a current that can be drawn by the transistor Tr21 in the memory cell MC[i,j] illustrated in FIG. 18 and a current that can be drawn by the transistor Tr21 in the memory cell MC[i+1,j] is smaller than the drain current of the transistor Tr30[*j*]. Thus, if the current ΔI[j] has a positive value, part of the drain current of the transistor Tr30[*j*] flows to the gate of the transistor Tr24 when the transistor Tr25 is turned on in the circuit 14[*j*], and the potential of the gate starts to rise. When the drain current of the transistor Tr24 becomes substantially equal to the current ΔI[j], the potential of the gate of the transistor Tr24 converges on a certain value. The potential of the gate of the transistor Tr24 at this time corresponds to a potential at which the drain current of the transistor Tr24 becomes the current ΔI[j], i.e., the current Ioffset[j] (=ICP[j]). This means that the transistor Tr24 in the circuit 14[*j*] is in a state of serving as a current source that can supply the current ICP[j].

Similarly, if the current I[j+1] flowing through the wiring BL[j+1] is lower than the current IREF flowing through the wiring BLREF, that is, if a current ΔI[j+1] has a positive value, part of the drain current of the transistor Tr30[*j*+1] flows to the gate of the transistor Tr24 when the transistor Tr25 is turned on in the circuit 14[*j*+1], and the potential of the gate starts to rise. When the drain current of the transistor Tr24 becomes substantially equal to the current ΔI[j+1], the potential of the gate of the transistor Tr24 converges on a certain value. The potential of the gate of the transistor Tr24 at this time corresponds to a potential at which the drain current of the transistor Tr24 becomes the current ΔI[j+1], i.e., the current Ioffset[j+1] (=ICP[j+1]). This means that the transistor Tr24 in the circuit 14[*j*+1] is in a state of serving as a current source that can supply the current ICP[j+1].

After Time T08, the potential supplied to the wiring OSP illustrated in FIG. 19 changes from a high-level potential to a low-level potential, so that the transistors Tr25 in the circuit 14[*j*] and the circuit 14[*j*+1] are turned off. Accordingly, the potentials of the gates of the transistors Tr24 are held. Thus, the circuit 14[*j*] remains in a state of serving as the current source that can supply the current ICP[j], and the circuit 14[*j*+1] remains in a state of serving as the current source that can supply the current ICP[j+1].

From Time T09 to Time T10, a high-level potential is supplied to the wiring OSM illustrated in FIG. 19. Furthermore, a potential between the potential VSS and the potential VDD, e.g., the potential (VDD+VSS)/2, is supplied as the base potential to each of the wiring RW[i] and the wiring RW[i+1] illustrated in FIG. 18. Since a high-level potential is supplied to the wiring OSM, the transistors Tr28 in the circuit 13[*j*] and the circuit 13[*j*+1] are turned on.

The case where the current I[j] flowing through the wiring BL[j] is higher than the current IREF flowing through the wiring BLREF, i.e., the case where the current ΔI[j] has a negative value, means that the sum of a current that can be drawn by the transistor Tr21 in the memory cell MC[i,j] illustrated in FIG. 18 and a current that can be drawn by the transistor Tr21 in the memory cell MC[i+1,j] is larger than the drain current of the transistor Tr30[*j*]. Thus, if the current ΔI[j] has a negative value, current flows from the gate of the transistor Tr27 to the wiring BL[j] when the transistor Tr28 is turned on in the circuit 13[*j*], and the potential of the gate starts to decrease. When the drain current of the transistor Tr27 becomes substantially equal to the absolute value of the current ΔI[j], the potential of the gate of the transistor Tr27 converges on a certain value. The potential of the gate of the transistor Tr27 at this time corresponds to a potential at which the drain current of the transistor Tr27 becomes the absolute value of the current ΔI[j], i.e., the current Ioffset[j] (=ICM[j]). This means that the transistor Tr27 in the circuit 13[*j*] is in a state of serving as a current source that can supply the current ICM[i].

Similarly, if the current I[j+1] flowing through the wiring BL[j+1] is higher than the current IREF flowing through the wiring BLREF, that is, if the current ΔI[j+1] has a negative value, current flows from the gate of the transistor Tr27 in the circuit 13[*j*+1] to the wiring BL[j+1] when the transistor Tr28 is turned on, and the potential of the gate starts to decrease. When the drain current of the transistor Tr27 becomes substantially equal to the absolute value of the current ΔI[j+1], the potential of the gate of the transistor Tr27 converges on a certain value. The potential of the gate of the transistor Tr27 at this time corresponds to a potential at which the drain current of the transistor Tr27 equal to the absolute value of ΔI[j+1], i.e., the current Ioffset[j+1] (=ICM [j+1]). This means that the transistor Tr27 in the circuit 13[*j*+1] is in a state of serving as a current source that can supply the current ICM[j+1].

After Time T10, the potential supplied to the wiring OSM illustrated in FIG. 19 changes from a high-level potential to a low-level potential, so that the transistors Tr28 in the circuit 13[*j*] and the circuit 13[*j*+1] are turned off. Accordingly, the potentials of the gates of the transistors Tr27 are held. Thus, the circuit 13[*j*] remains in a state of serving as the current source that can supply the current ICM[j], and the circuit 13[*j*+1] remains in a state of serving as the current source that can supply the current ICM[j+1].

In each of the circuit 14[*j*] and the circuit 14[*j*+1], the transistor Tr24 has a function of drawing current. Thus, from Time T07 to Time T08, if the current I[j] flowing through the wiring BL[j] is higher than the current IREF flowing through the wiring BLREF and the current ΔI[j] has a negative value, or if the current I[j+1] flowing through the wiring BL[j+1] is higher than the current IREF flowing through the wiring BLREF and the current ΔI[j+1] has a negative value, it might be difficult to supply a proper (neither too much nor too little) amount of current from the circuit 14[*j*] or the circuit 14[*j*+1] to the wiring BL[j] or the wiring BL[j+1]. In that case, it might be difficult for the transistor Tr21 in the memory cell MC, the transistor Tr24 in the circuit 14[*j*] or the circuit 14[*j*+1], and the transistor Tr30[*j*] or Tr30[*j*+1] to concurrently operate in a saturation region because a balance between the current flowing through the wiring BLREF and the current flowing through the wiring BL[j] or the wiring BL[j+1] is struck.

To ensure the operation of the transistors Tr21, Tr24, and Tr30[*j*] or Tr30[*j*+1] in a saturation region from Time T07 to Time T08 even when the current ΔI[j] has a negative value, the potential of the gate of the transistor Tr27 may be set to a potential that is high enough to obtain a predetermined drain current, instead of resetting the potential of the gate of the transistor Tr27 to the potential VDD, from Time T05 to Time T06. In the above configuration, the amount of current that cannot be drawn by the transistor Tr21 can be drawn by the transistor Tr24 to some extent because current from the transistor Tr27, as well as the drain current of the transistor Tr30[*j*] or Tr30[*j*+1], is supplied; thus, the operations of the transistors Tr21, Tr24, and Tr30[*j*] or Tr30[*j*+1] in a saturation region can be ensured.

Note that if the current I[j] flowing through the wiring BL[j] is lower than the current IREF flowing through the wiring BLREF, that is, if the current ΔI[j] has a positive value from Time T09 to Time T10, since the circuit 14[*j*] has been set as the current source that can supply the current ICP[j] from Time T07 to Time T08, the potential of the gate of the transistor Tr27 in the circuit 13[*j*] remains substantially the same as the potential VDD. Similarly, if the current I[j+1] flowing through the wiring BL[j+1] is lower than the current IREF flowing through the wiring BLREF, that is, if the current ΔI[j+1] has a positive value, since the circuit 14[*j*+1] has been set as the current source that can supply the current ICP[j+1] from Time T07 to Time T08, the potential of the gate of the transistor Tr27 in the circuit 13[*j*+1] remains substantially the same as the potential VDD.

Then, from Time T11 to Time T12, the second analog potential Vw[i] is supplied to the wiring RW[i] illustrated in FIG. 18. Furthermore, a potential between the potential VSS and the potential VDD, e.g., the potential (VDD+VSS)/2, is still applied as a base potential to the wiring RW[i+1]. Specifically, the potential of the wiring RW[i] is a potential higher than the potential between the potential VSS and the potential VDD (e.g., the potential (VDD+VSS)/2), which is the base potential, by the potential difference Vw[i]; for the simplicity of the following description, however, the potential of the wiring RW[i] is assumed to be the potential Vw[i].

When the potential of the wiring RW[i] becomes the potential Vw[i], with the assumption that the amount of change in the potential of the first electrode of the capacitor 21 is substantially the same as the amount of change in the potential of the node N, the potential of the node N in the memory cell MC[i,j] in FIG. 18 becomes VPR−Vx[i,j]+Vw [i] and the potential of the node N in the memory cell MC[i,j+1] becomes VPR−Vx[i,j+1]+Vw[i]. According to Formula b14, the product-sum of the first analog data and the second analog data for the memory cell MC[i,j] affects a current obtained by subtracting the current Ioffset[j] from the current ΔI[j], that is, the current Iout[j] flowing from the wiring BL[j]. Furthermore, the product-sum of the first analog data and the second analog data for the memory cell MC[i,j+1] affects a current obtained by subtracting the current Ioffset[j+1] from the current ΔI[j+1], that is, a current Iout[j+1] flowing from the wiring BL[j+1].

After Time T12, a potential between the potential VSS and the potential VDD (e.g., the potential (VDD+VSS)/2), which is the base potential, is supplied again to the wiring RW[i].

Then, from Time T13 to Time T14, the second analog potential Vw[i+1] is supplied to the wiring RW[i+1] illustrated in FIG. 18. Furthermore, a potential between the potential VSS and the potential VDD, e.g., the potential (VDD+VSS)/2, is still applied as a base potential to the wiring RW[i]. Specifically, the potential of the wiring RW[i+ 1] is a potential higher than the potential between the potential VSS and the potential VDD (e.g., the potential (VDD+VSS)/2), which is the base potential, by the potential difference Vw[i+1]; for the simplicity of the following description, however, the potential of the wiring RW[i+1] is assumed to be the potential Vw[i+1].

When the potential of the wiring RW[i+1] becomes the potential Vw[i+1], with the assumption that the amount of change in the potential of the first electrode of the capacitor C21 is substantially the same as the amount of change in the potential of the node N, the potential of the node N in the memory cell MC[i+1,j] in FIG. 18 becomes VPR−Vx[i+1, j]+Vw[i+1] and the potential of the node N in the memory cell MC[i+1,j+1] becomes VPR−Vx[i+1,j+1]+Vw[i+1]. According to Formula b14, the product-sum of the first analog data and the second analog data for the memory cell MC[i+1,j] affects a current obtained by subtracting the current Ioffset[j] from the current ΔI[j], that is, the current Iout[j]. Furthermore, the product-sum of the first analog data and the second analog data for the memory cell MC[i+1,j+1] affects a current obtained by subtracting the current Ioffset [j+1] from the current ΔI[j+1], that is, the current Iout[j+1].

After Time T14, a potential between the potential VSS and the potential VDD (e.g., the potential (VDD+VSS)/2), which is the base potential, is supplied again to the wiring RW[i+1].

Then, from Time T15 to Time T16, the second analog potential Vw[i] is supplied to the wiring RW[i] illustrated in FIG. 18 and the second analog potential Vw[i+1] is supplied to the wiring RW[i+1]. In practice, the potential of the wiring RW[i] is a potential higher than the potential between the potential VSS and the potential VDD (e.g., the potential (VDD+VSS)/2), which is the base potential, by the potential difference Vw[i] and the potential of the wiring RW[i+1] is a potential higher than the potential between the potential VSS and the potential VDD (e.g., the potential (VDD+VSS)/2), which is the base potential, by the potential difference Vw[i+1]. However, for the simplicity of the following description, the potential of the wiring RW[i] is assumed to be the potential Vw[i] and the potential of the wiring RW[i+1] is assumed to be the potential Vw[i+1].

When the potential of the wiring RW[i] becomes the potential Vw[i], with the assumption that the amount of change in the potential of the first electrode of the capacitor C21 is substantially the same as the amount of change in the potential of the node N, the potential of the node N in the memory cell MC[i,j] in FIG. 18 becomes VPR−Vx[i,j]+Vw[i] and the potential of the node N in the memory cell MC[i,j+1] becomes VPR−Vx[i,j+1]+Vw[i]. When the potential of the wiring RW[i+1] becomes the potential Vw[i+1], with the assumption that the amount of change in the potential of the first electrode of the capacitor C21 is substantially the same as the amount of change in the potential of the node N, the potential of the node N in the memory cell MC[i+1,j] illustrated in FIG. 18 becomes VPR−Vx[i+1,j]+Vw[i+1] and the potential of the node N in the memory cell MC[i+1,j+1] becomes VPR−Vx[i+1,j+1]+Vw[i+1].

According to Formula b14, the product-sum of the first analog data and the second analog data for the memory cell MC[i,j] and the memory cell MC[i+1,j] affects a current obtained by subtracting the current Ioffset[i] from the current ΔI[j], that is, the current Iout[j]. Furthermore, the product-sum of the first analog data and the second analog data for the memory cell MC[i,j+1] and the memory cell MC[i+1,j+1] affects a current obtained by subtracting the current Ioffset[j+1] from the current ΔI[j+1], that is, the current Iout[j+1].

After Time T16, a potential between the potential VSS and the potential VDD (e.g., the potential (VDD+VSS)/2), which is the base potential, is supplied again to the wiring RW[i] and the wiring RW[i+1].

With the above configuration, the product-sum operation can be performed with a small circuit scale. With the above configuration, the product-sum operation can be performed at high speed. With the above configuration, the product-sum operation can be performed with low power.

Note that a transistor with an extremely low off-state current is desirably used as the transistor Tr22, Tr25, Tr26, Tr28, or Tr29. When a transistor with an extremely low off-state current is used as the transistor Tr22, the potential of the node N can be held for a long time. When a transistor with an extremely low off-state current is used as the transistors Tr25 and Tr26, the potential of the gate of the transistor Tr24 can be held for a long time. When a transistor with an extremely low off-state current is used as the transistors Tr28 and Tr29, the potential of the gate of the transistor Tr27 can be held for a long time.

To reduce the off-state current of a transistor, for example, a semiconductor with a wide band gap is used for a channel formation region. As described above, a semiconductor with a wide bandgap sometimes refers to a semiconductor with a bandgap of 2.2 eV or more; such semiconductors include an oxide semiconductor. As the transistors Tr22, Tr25, Tr26, Tr28, and Tr29, OS transistors may be used.

Note that at least part of this embodiment can be implemented in combination with the other embodiments described in this specification as appropriate.

Embodiment 3

In this embodiment, examples of electronic devices that include any one of the semiconductor devices 100 to 102 of one embodiment of the present invention will be described. Note that the semiconductor device 100 is described as a typical example of the semiconductor devices 100 to 102 in this embodiment, but may be replaced with the semiconductor device 101 or the semiconductor device 102.

Figure 21A:
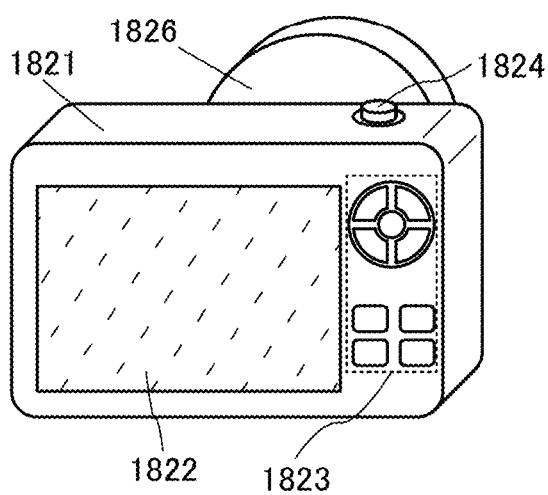
FIG. 21 (A, B) Diagrams illustrating structures of electronic devices.

FIG. 21(A) illustrates an example of a camera. A camera 1820 includes a housing 1821, a display portion 1822, operation buttons 1823, a shutter button 1824, and the like. The camera 1820 is provided with an attachable lens 1826.

Although the lens 1826 of the camera 1820 here is detachable from the housing 1821 for replacement, the lens 1826 may be integrated with the housing 1821.

Still images or moving images can be taken with the camera 1820 by pushing the shutter button 1824. In addition, the display portion 1822 has a function as a touch sensor, and images can be taken by a touch on the display portion 1822.

Note that a stroboscope, a viewfinder, or the like can be additionally provided in the camera 1820. Alternatively, these can be incorporated in the housing 1821.

Figure 21B:
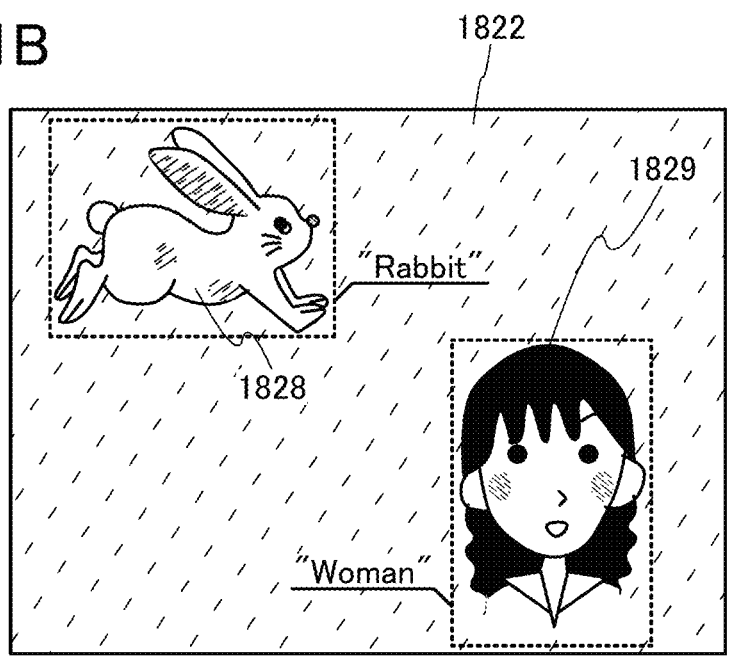

FIG. 21(B) is an enlarged view of the display portion 1822. The display portion 1822 can display still images or moving images that have been taken with the camera 1820 or images and the like that are being taken with the camera 1820 through the lens 1826.

A rabbit 1828 and a woman 1829 are displayed on the display portion 1822 illustrated in FIG. 21(B). The semiconductor device 100 mounted in the camera 1820 conducts image recognition to display frames (denoted by dotted lines in the drawing) surrounding the rabbit 1828 and the woman 1829, which distinguish the recognized objects, and can display what the objects are ("Rabbit" and "Woman" are displayed in the drawing).

Figure 22A:
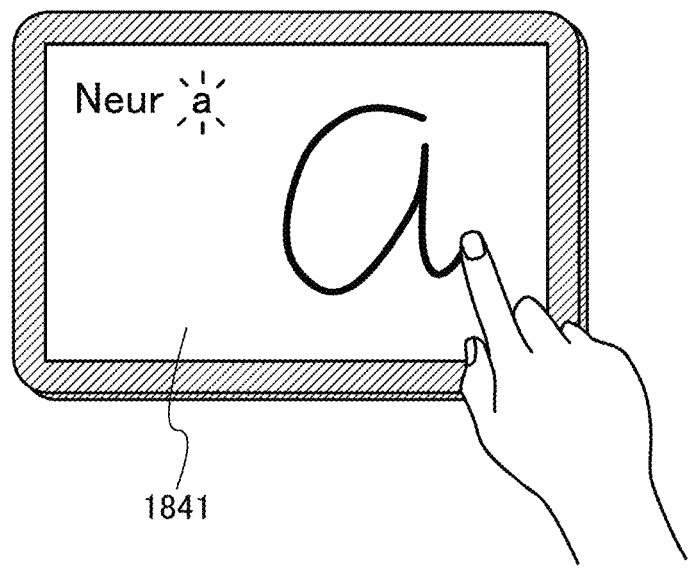
FIG. 22 (A, B) Diagrams illustrating structures of electronic devices.

FIG. 22(A) shows an example of an information terminal. An information terminal 1840 includes a display portion 1841 and the like. A touch sensor is provided in the display portion 1841, and the display portion 1841 also has a function as an input portion.

The semiconductor device 100 mounted in the information terminal 1840 can recognize a letter input to the display portion 1841 and display the recognition result. FIG. 22(A) shows an example in which a user inputs an alphabet "a" with a finger, and the semiconductor device 100 recognizes the input letter and displays the recognition result on the upper left corner of the display portion 1841. Note that the input of letters in the display portion 1841 can be performed not only with the finger but also with a stylus pen or the like.

Figure 22B:
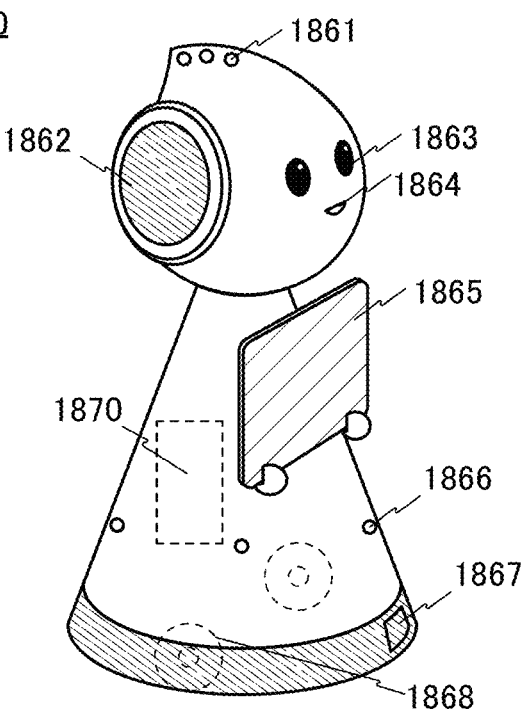

FIG. 22(B) shows an example of a robot. A robot 1860 includes an arithmetic device 1870, an illuminance sensor 1861, a microphone 1862, an upper camera 1863, a speaker 1864, a display 1865, a lower camera 1866, an obstacle sensor 1867, a moving mechanism 1868, and the like. The semiconductor device 100 is mounted in the arithmetic device 1870.

The microphone 1862 has a function of detecting a speaking voice of a user, an environmental sound, and the like. The speaker 1864 has a function of outputting sound.

The robot 1860 can communicate with a user using the microphone 1862 and the speaker 1864.

The display 1865 has a function of displaying various kinds of information. The robot 1860 can display information desired by a user on the display 1865. The display 1865 may be provided with a touch sensor. Moreover, the display 1865 may be a detachable information terminal or the like, in which case charging and data communication can be performed when the display 1865 is set at the home position of the robot 1860.

The upper camera 1863 and the lower camera 1866 each have a function of capturing an image of the surroundings of the robot 1860. The obstacle sensor 1867 can detect the presence of an obstacle in the direction where the robot 1860 moves with the moving mechanism 1868.

The semiconductor device 100 mounted in the arithmetic device 1870 analyzes images captured by the upper camera 1863 and the lower camera 1866 so as to detect the presence of an obstacle such as a wall, furniture, a step, or a dropping object.

The semiconductor device 100 mounted in the arithmetic device 1870 recognizes the user of the robot 1860 from images captured by the upper camera 1863 and the lower camera 1866, whereby the robot 1860 can move toward the user. Alternatively, the robot 1860 can follow the user who is moving.

When the semiconductor device 100 exemplified in the above embodiments is mounted in the electronic devices illustrated in FIG. 21 and FIG. 22, image recognition can be efficiently performed.

Note that this embodiment can be implemented in combination with the other embodiments described in this specification as appropriate.

Embodiment 4

In this embodiment, a metal oxide that can be used for the aforementioned OS transistor will be described. In particular, details about a metal oxide and a CAC (Cloud-Aligned Composite) are described below.

A CAC-OS or a CAC-metal oxide has a conducting function in a part of the material and has an insulating function in a part of the material; as a whole, the CAC-OS or the CAC-metal oxide has a function of a semiconductor. Note that in the case where the CAC-OS or the CAC-metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

Furthermore, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, the conductive regions are observed to be coupled in a cloud-like manner with their boundaries blurred, in some cases.

Furthermore, in the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that a metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by InGaO$_3$(ZnO)$_{m1}$ (m1 is a natural number) or In$_{(1+x0)}$Ga$_{(1-x0)}$O$_3$(ZnO)$_{m0}$ (−1≤x0≤1; m0 is a given number).

The above crystalline compound has a single crystal structure, a polycrystalline structure, or a CAAC (c-axis aligned crystal) structure. Note that the CAAC structure is a crystal structure in which a plurality of IGZO nanocrystals have c-axis alignment and are connected in the a-b plane without alignment.

On the other hand, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing In as a main component and a film containing Ga as a main component is not included.

Note that a clear boundary cannot sometimes be observed between the region where GaO$_{X3}$ is a main component and the region where In$_{X2}$Zn$_{Y2}$O$_{Z2}$ or InO$_{X1}$ is a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal element(s) as a main component and are observed as nanoparticles and some regions that contain In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including GaO$_{X3}$ as a main component and regions including In$_{X2}$Zn$_{Y2}$O$_{Z2}$ or InO$_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions where GaO$_{X3}$ or the like is a main component and regions where In$_{X2}$Zn$_{Y2}$O$_{Z2}$ or InO$_{X1}$ is a main component are phase-separated from each other and form a mosaic pattern.

Here, a region where In$_{X2}$Zn$_{Y2}$O$_{Z2}$ or InO$_{X1}$ is a main component is a region whose conductivity is higher than that of a region where GaO$_{X3}$ or the like is a main component. In other words, when carriers flow through the regions where In$_{X2}$Zn$_{Y2}$O$_{Z2}$ or InO$_{X1}$ is a main component, the conductivity of an oxide semiconductor is exhibited. Accordingly, when the regions containing In$_{X2}$Zn$_{Y2}$O$_{Z2}$ or InO$_{X1}$ as a main component are distributed like a cloud in an oxide semiconductor, high field-effect mobility (μ) can be achieved.

In contrast, a region where GaO$_{X3}$ or the like is a main component is a region whose insulating property is higher than that of a region where In$_{X2}$Zn$_{Y2}$O$_{Z2}$ or InO$_{X1}$ is a main component. In other words, when regions where GaO$_{X3}$ or the like is a main component are distributed in an oxide semiconductor, leakage current can be suppressed and favorable switching operation can be achieved.

Accordingly, when the CAC-OS is used for a semiconductor element, the insulating property derived from GaO$_{X3}$ or the like and the conductivity derived from In$_{X2}$Zn$_{Y2}$O$_{Z2}$ or InO$_{X1}$ complement each other, whereby a high on-state current (I$_{on}$) and high field-effect mobility (μ) can be achieved.

Moreover, a semiconductor element using the CAC-OS has high reliability. Thus, the CAC-OS is most suitable for a variety of semiconductor devices.

Note that this embodiment can be implemented in combination with the other embodiments described in this specification as appropriate.

REFERENCE NUMERALS

C1: arrow, C11: capacitor, C12: capacitor, C21: capacitor, C22: capacitor, C23: capacitor, CLK_IN1: clock signal, CLK_IN2: clock signal, CLK_IN3: clock signal, CLK_IN4: clock signal, CLK1: clock signal, CLK2: clock signal, CLK3: clock signal, CLK4: clock signal, D_IN1: signal, D_IN2: signal, N11: node, N12: node, R1: arrow, T01: Time, T1: Time, T02: Time, T2: Time, T03: Time, T3: Time, T04: Time, T4: Time, T05: Time, T5: Time, T06: Time, T6: Time, T07: Time, T7: Time, T08: Time, T8: Time, T09: Time, T9: Time, T10: Time, T11: Time, T12: Time, T13: Time, T14: Time, T15: Time, T16: Time, T17: Time, Tr21: transistor, Tr22: transistor, Tr24: transistor, Tr25: transistor, Tr26: transistor, Tr27: transistor, Tr28: transistor, Tr29: transistor, Tr30: transistor, Tr31: transistor, 11: memory circuit, 12: reference memory circuit, 13: circuit, 14: circuit, 15: current source circuit, 41: transistor, 42: transistor, 43: transistor, 44: transistor, 45: transistor, 46: transistor, 47: transistor, 48: transistor, 50: frame memory, 51: region, 60: shift register group, 61: register, 62: inverter, 63: clocked inverter, 66: clocked inverter, 67: inverter, 68: inverter, 69: register, 70: D/A converter, 80: product-sum operation circuit, 90: pooling circuit, 100: semiconductor device, 101: semiconductor device, 102: semiconductor device, 107: semiconductor device, 270: circuit, 271: circuit, 272: circuit, 273: circuit, 274: circuit, 1820: camera, 1821: housing, 1822: display portion, 1823: operation button, 1824: shutter button, 1826: lens, 1829: woman, 1840: information terminal, 1841: display portion, 1860: robot, 1861: illuminance sensor, 1862: microphone, 1863: upper camera, 1864: speaker, 1865: display, 1866: lower camera, 1867: obstacle sensor, 1868: moving mechanism, 1870: arithmetic device.

The invention claimed is:

1. A semiconductor device comprising:

a shift register group comprising a plurality of shift registers;

a D/A converter; and a product-sum operation circuit, wherein the shift register group captures image data, wherein each of the plurality of shift registers performs operations of shifting the image data and outputting part of the image data to the D/A converter, and wherein the D/A converter converts the part of the image data into analog data and outputs the analog data to the product-sum operation circuit.

2. The semiconductor device according to claim 1, wherein the product-sum operation circuit comprises an analog memory, wherein a parameter is stored in the analog memory, and wherein the product-sum operation circuit outputs a product-sum operation result of part of the image data and the parameter.

3. The semiconductor device according to claim 2, wherein the analog memory comprises a transistor, and wherein the transistor comprises a metal oxide in a channel formation region.

4. A semiconductor device comprising:

a D/A converter;

a shift register group comprising a plurality of shift registers; and a product-sum operation circuit, wherein image data is input to the D/A converter, wherein the D/A converter outputs first data, which is obtained by converting the image data into analog data, to the shift register group, wherein each of the plurality of shift registers performs operations of shifting the first data and outputting part of the first data as second data to the product-sum operation circuit, wherein the product-sum operation circuit comprises an analog memory, wherein a parameter is stored in the analog memory, and wherein the product-sum operation circuit outputs a product-sum operation result of the second data and the parameter.

5. The semiconductor device according to claim 4, wherein the analog memory comprises a first transistor, and wherein the first transistor comprises a metal oxide in a channel formation region.

6. The semiconductor device according to claim 4, wherein the shift register group comprises a second transistor, and wherein the second transistor comprises a metal oxide in a channel formation region.

7. A semiconductor device comprising:

a shift register group comprising a plurality of shift registers;

a D/A converter;

a product-sum operation circuit; and a pooling circuit, wherein the shift register group captures image data, wherein each of the plurality of shift registers performs operations of shifting the image data and outputting part of the image data to the D/A converter, wherein the D/A converter performs operations of outputting first data, which is obtained by converting part of the image data into analog data, to the product-sum operation circuit, wherein a parameter is stored in the product-sum operation circuit, and wherein the product-sum operation circuit outputs second data, which is obtained by a product-sum operation of the first data and the parameter, to the pooling circuit.

8. The semiconductor device according to claim 7, wherein the product-sum operation circuit comprises an analog memory, and wherein a parameter is stored in the analog memory.

9. The semiconductor device according to claim 8, wherein the analog memory comprises a transistor, and wherein the transistor comprises a metal oxide in a channel formation region.

* * * * *